(12) United States Patent
Stark et al.

(10) Patent No.: US 9,899,996 B1
(45) Date of Patent: *Feb. 20, 2018

(54) RECURSIVE LOOKUP WITH A HARDWARE TRIE STRUCTURE THAT HAS NO SEQUENTIAL LOGIC ELEMENTS

(71) Applicant: Netronome Systems, Inc., Santa Clara, CA (US)

(72) Inventors: Gavin J. Stark, Cambridge (GB); Bruce A. Wilford, Los Altos, CA (US)

(73) Assignee: Netronome Systems, Inc., Santa Clara, CA (US)

( * ) Notice: Subject to any disclaimer, the term of this patent is extended or adjusted under 35 U.S.C. 154(b) by 301 days.

This patent is subject to a terminal disclaimer.

(21) Appl. No.: 14/556,135

(22) Filed: Nov. 29, 2014

Related U.S. Application Data

(63) Continuation of application No. 13/552,555, filed on Jul. 18, 2012, now Pat. No. 8,902,902.

(51) Int. Cl.
G06F 7/02 (2006.01)
H03K 17/00 (2006.01)
G06F 9/46 (2006.01)
G06F 13/40 (2006.01)

(52) U.S. Cl.
CPC ............ *H03K 17/00* (2013.01); *G06F 9/467* (2013.01); *G06F 13/40* (2013.01)

(58) Field of Classification Search
CPC ..... H04L 45/745; H04L 45/748; H03K 17/00; G06F 13/40; G06F 9/467
See application file for complete search history.

(56) References Cited

U.S. PATENT DOCUMENTS

| 6,675,171 | B2 * | 1/2004 | Tikkanen | G06F 17/30961 |
| 6,691,131 | B2 * | 2/2004 | Tikkanen | G06F 17/30961 |
| 6,691,171 | B1 * | 2/2004 | Liao | H04L 45/00 709/245 |
| 6,804,230 | B1 * | 10/2004 | Jennings | H04L 45/00 370/388 |

(Continued)

OTHER PUBLICATIONS

Nilsson, S.; Karlsson, G., "IP-address lookup using LC-tries," Selected Areas in Communications, IEEE Journal on , vol. 17, No. 6, pp. 1083,1092, Jun. 1999.*

(Continued)

*Primary Examiner* — Nimesh G Patel
(74) *Attorney, Agent, or Firm* — Imperium Patent Works LLP; T. Lester Wallace

(57) ABSTRACT

A hardware trie structure includes a tree of internal node circuits and leaf node circuits. Each internal node is configured by a corresponding multi-bit node control value (NCV). Each leaf node can output a corresponding result value (RV). An input value (IV) supplied onto input leads of the trie causes signals to propagate through the trie such that one of the leaf nodes outputs one of the RVs onto output leads of the trie. In a transactional memory, a memory stores a set of NCVs and RVs. In response to a lookup command, the NCVs and RVs are read out of memory and are used to configure the trie. The IV of the lookup is supplied to the input leads, and the trie looks up an RV. A non-final RV initiates another lookup in a recursive fashion, whereas a final RV is returned as the result of the lookup command.

21 Claims, 41 Drawing Sheets

(56) References Cited

U.S. PATENT DOCUMENTS

| | | | | |
|---|---|---|---|---|
| 6,859,455 | B1* | 2/2005 | Yazdani | G06F 17/30985 370/392 |
| 7,042,884 | B2* | 5/2006 | Huang | H04L 45/54 370/395.54 |
| 7,212,531 | B1* | 5/2007 | Kopelman | H04L 45/00 370/392 |
| 7,446,681 | B2* | 11/2008 | Gunther | G06F 17/2247 341/106 |
| 7,539,153 | B1* | 5/2009 | Liang | H04L 45/00 370/255 |
| 7,613,189 | B1* | 11/2009 | Kopelman | H04L 45/00 370/392 |
| 7,782,853 | B2* | 8/2010 | Huang | H04L 45/54 370/389 |
| 8,018,944 | B1* | 9/2011 | Kopelman | H04L 45/00 370/392 |
| 8,150,891 | B2* | 4/2012 | Luk | H04L 45/00 707/802 |
| 8,538,999 | B2* | 9/2013 | Luk | H04L 45/00 707/802 |
| 8,631,043 | B2* | 1/2014 | Hao | G06F 17/30958 707/796 |
| 2004/0111395 | A1* | 6/2004 | Rajgopal | G06F 17/30985 |
| 2006/0253606 | A1* | 11/2006 | Okuno | H04L 45/02 709/238 |
| 2011/0128960 | A1* | 6/2011 | Bando | H04L 45/745 370/392 |
| 2011/0137930 | A1* | 6/2011 | Hao | G06F 17/30958 707/769 |
| 2011/0219208 | A1* | 9/2011 | Asaad | G06F 15/76 712/12 |
| 2012/0239702 | A1* | 9/2012 | Luk | H04L 45/00 707/797 |
| 2014/0025918 | A1* | 1/2014 | Stark | G06F 12/06 711/206 |
| 2014/0025919 | A1* | 1/2014 | Stark | G06F 9/34 711/206 |
| 2014/0025920 | A1* | 1/2014 | Stark | G06F 12/06 711/206 |
| 2014/0068109 | A1* | 3/2014 | Stark | G06F 9/467 710/5 |
| 2014/0068174 | A1* | 3/2014 | Stark | H04L 45/745 711/108 |

OTHER PUBLICATIONS

Ting Zhao; Chin-Tau Lea; Ho-Chi Huang, "Pipelined architecture for fast IP lookup," High Performance Switching and Routing, 2005. HPSR. 2005 Workshop on , vol., No., pp. 118,122, May 12-14, 2005.*

Alaei, H.; Behdadfar, M.; Saidi, H., "Next hop storage and retrieval for coded and scalar IP prefix trees," Computer Networks and Distributed Systems (CNDS), 2011 International Symposium on , vol., No., pp. 90,95, Feb. 24-24, 2011.*

Hyesook Lim; Changhoon Yim; Swartzlander, E.E., "Priority Tries for IP Address Lookup," Computers, IEEE Transactions on , vol. 59, No. 6, pp. 784,794, Jun. 2010.*

Sun-Yuan Hsieh; Yi-Ling Huang; Ying-Chi Yang, "Multiprefix Trie: A New Data Structure for Designing Dynamic Router-Tables," Computers, IEEE Transactions on , vol. 60, No. 5, pp. 693,706, May 2011.*

* cited by examiner

COMMAND-PUSH-PULL (CPP) DATA BUS
STRUCTURE

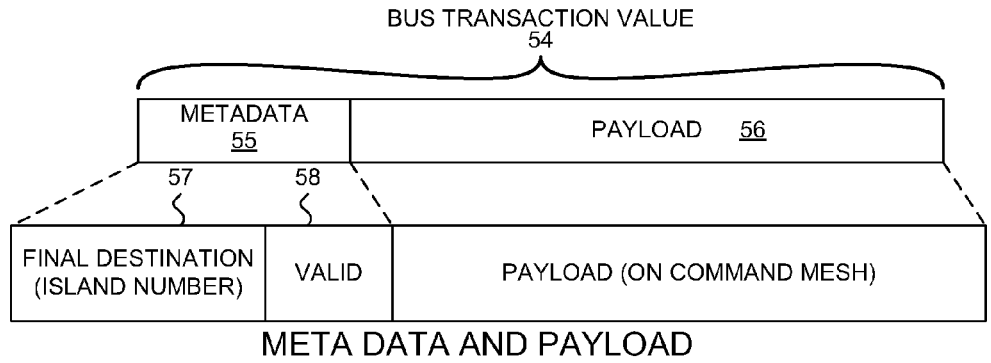

META DATA AND PAYLOAD

FIG. 3

| FIELD | WIDTH | DESCRIPTION |
|---|---|---|
| TARGET | 4 | CPP TARGET FOR THE COMMAND. |
| ACTION | 5 | ACTION RECOGNIZED BY THE CPP TARGET INDICATING WHAT SHOULD BE PERFORMED. |
| TOKEN | 2 | SUBTYPE OF ACTION RECOGNIZED BY THE CPP TARGET, INDICATING THE FLAVOR OF THE COMMAND. |
| LENGTH | 5 | LENGTH OF THE COMMAND, DEPENDENT ON THE ACTION/ TOKEN, INTERPRETED BY THE CPP TARGET. |
| ADDRESS | 40 | ADDRESS THAT THE COMMAND SHOULD OPERATE ON. |
| BYTE_MASK | 8 | FURTHER OPTIONS OF A COMMAND (A BYTE MASK). |
| DATA_MASTER_ISLAND | 6 | ISLAND OF DATA MASTER. |
| DATA_MASTER | 4 | MASTER WITHIN THE ISLAND. |
| DATA_REF | 14 | PUSH-PULL ID REFERENCE INDICATING TO THE DATA MASTER WHERE TO PUSH/PULL FROM. |
| SIGNAL_MASTER | 10 | EXTENSION FOR DATA_REF AS A DATA MASTER ONLY; FOR OTHER MASTERS INDICATING WHICH MASTER WITHIN THE DATA MASTER'S ISLAND SHOULD BE SIGNALED FOR THE COMMAND. |
| SIGNAL_REF | 7 | REFERENCE WITHIN THE SIGNAL MASTER AS TO WHEN SIGNAL SHOULD BE INDICATED WITH THE COMMANDS PULL OR PUSH. |

COMMAND PAYLOAD

FIG. 4

| FIELD | WIDTH | DESCRIPTION |
|---|---|---|
| TARGET_ISLAND | 6 | ISLAND TO RETURN PULL DATA TO. |
| TARGET_PORT | 2 | IDENTIFIES THE SUB-CIRCUIT IN THE FINAL DESTINATION ISLAND THAT IS THE TARGET (OF A MULTI-TARGET ISLAND). |
| TARGET_REF | 14 | TARGET SPECIFIC REFERENCE; RETURNED WITH PULL DATA. |
| DATA_MASTER | 4 | MASTER WITHIN THE ISLAND. |
| DATA_REF | 14 | PUSH-PULL ID REFERENCE INDICATING TO THE DATA MASTER WHERE TO PUSH/PULL FROM; NORMALLY COPIED FROM THE INVOKING COMMAND. |
| SIGNAL_MASTER | 8 | EXTENSION FOR DATA_REF AS A DATA MASTER ONLY; FOR OTHER MASTERS INDICATING WHICH MASTER WITHIN THE DATA MASTER'S ISLAND SHOULD BE SIGNALED WHEN THE LAST DATA IS PULLED. |
| SIGNAL_REF | 7 | REFERENCE USABLE BY THE MASTER TO DETERMINE WHICH SIGNAL SHOULD BE INDICATED WITH THE LAST PULL DATA. |
| LENGTH | 5 | NUMBER OF 64-BIT DATA WORDS TO PULL FROM THE DATA MASTER, STARTING AT THE SPECIFIED DATA_REF. |

PULL-ID PAYLOAD

FIG. 5

| FIELD | WIDTH | DESCRIPTION |
|---|---|---|
| DATA_IS_PULL | 1 | ASSERTED FOR PULL DATA. |
| DATA_MASTER_OR_TARGET_PORT | 4 | DATA MASTER FOR PUSH DATA OR TARGET PORT FOR PULL DATA. |
| DATA_OR_TARGET_REF | 14 | DATA REF FOR PUSH DATA OR TARGET REF FOR PULL DATA. |
| SIGNAL_MASTER | 8 | ONLY USED FOR PUSH DATA; MASTER IN ISLAND TO SIGNAL IF DATA_MASTER IS NOT CTM; EXTENSION OF DATA_REF FOR DATA_MASTER OF CTM. |
| SIGNAL_REF_OR_CYCLE | 7 | SIGNAL_REF FOR PUSH DATA OR CYCLE FOR PULL DATA. |
| LAST | 1 | ASSERTED WITH THE LAST WORD OF DATA FOR PULL OR PUSH DATA. |
| DATA | 64 | 64-BITS OF PULL/PUSH DATA. |
| DATA_ERROR | 2 | ONE BIT PER 32-BITS OF DATA TO INDICATE AN UNCORRECTABLE ERROR. |
| DATA_VALID | 2 | ONE BIT PER 32-BITS OF DATA TO INDICATE, ON PUSH, THAT THE DATA IS TO BE WRITTEN TO THE DATA_MASTER. |
| NO_SPLIT | 1 | FOR PUSH DATA ONLY, ASSERTED FOR SIGNALING TO INDICATE THAT BOTH SIGNAL_REF AND SIGNAL_REF1 ARE TO BE INDICATED TO THE SIGNALED MASTER. |

DATA PAYLOAD

FIG. 6

| FIELD | WIDTH | DESCRIPTION |
| --- | --- | --- |
| DATA_IS_PULL | 1 | ASSERTED FOR PULL DATA. |
| TARGET_PORT | 2 | IDENTIFIES THE SUB-CIRCUIT IN THE FINAL DESTINATION ISLAND THAT IS THE TARGET (OF A MULTI-TARGET ISLAND). |
| TARGET_REF | 14 | TARGET SPECIFIC REFERENCE, RETURNED WITH PULL DATA. |
| CYCLE-OF_PULL | 7 | CYCLE OF PULL DATA. |
| LAST | 1 | ASSERTED WITH THE LAST WORD OF PULL DATA. |
| DATA | 64 | 64-BITS OF PULLED DATA FROM THE DATA MASTER. |
| DATA_ERROR | 2 | ONE BIT PER 32-BITS OF PULLED DATA TO INDICATE AN UNCORRECTABLE ERROR FROM THE DATA_MASTER DATA SOURCE. |

DATA PAYLOAD (FOR A PULL)

FIG. 7

| FIELD | WIDTH | DESCRIPTION |
| --- | --- | --- |
| DATA_IS_PULL | 1 | DEASSERTED FOR PUSH DATA. |
| DATA_MASTER | 4 | PUSH ID WITHIN THE ISLAND OF DATA MASTER THE DATA IS DESTINED FOR. |
| DATA_REF | 14 | REFERENCE WITHIN DATA MASTER AS TO WHERE TO PUSH FROM. |
| SIGNAL_MASTER | 8 | FOR CTM AS A DATA MASTER ONLY THIS IS AN EXTENSION FOR DATA_REF; FOR OTHER MASTERS INDICATING WHICH MASTER WITHIN THE DATA MASTER'S ISLAND SHOULD BE SIGNALED WHEN THE LAST DATA IS PUSHED. |
| SIGNAL_REF | 7 | REFERENCE WITHIN THE SIGNAL MASTER AS TO WHICH SIGNAL SHOULD BE INDICATED WITH THE LAST PUSH DATA. |
| LAST | 1 | ASSERTED WITH THE LAST WORD OF PUSH DATA. |
| DATA | 64 | 64-BITS OF PUSH DATA FROM THE DATA MASTER. |
| DATA_ERROR | 2 | ONE BIT PER 32-BITS OF PUSHED DATA TO INDICATE AN UNCORRECTABLE ERROR FROM THE DATA_MASTER DATA SOURCE. |
| DATA_VALID | 2 | ONE BIT PER 32-BITS OF DATA TO INDICATE THAT THE DATA IS TO BE WRITTEN TO THE DATA_MASTER. |
| NO_SPLIT | 1 | ASSERTED FOR SIGNALING TO INDICATE THAT BOTH SIGNAL_REF AND SIGNAL_REF1 ARE TO BE INDICATED TO THE SIGNALED MASTER. |

DATA PAYLOAD (FOR A PUSH)

FIG. 8

MU ISLAND

DCACHE EXPANDED DIAGRAM

DATA STRUCTURE DIAGRAM

ETHERNET PACKET

STATE MACHINE STATE DIAGRAM

REGISTER POOL

FIG. 18 — DETAILED PIPELINE DIAGRAM

HASH BUCKET

LOOK-UP STAGE

| FIELD | WIDTH | DESCRIPTION |
|---|---|---|
| ADDED | 1 | "1" IF HASH KEY WAS ADDED |
| LOCKED | 1 | "1" IF DATASTRUCTURE IS CURRENTLY LOCKED |
| FOUND | 1 | "1" IF HASH KEY WAS FOUND |
| HASH BUCKET LOCATION IDENTIFICATION (ID) | 2 | IDENTIFICATION OF WHICH HASH BUCKET LOCATION IN THE HASH BUCKET CONTAINED THE MATCHING HASH KEY |

RESULTS PACKET

FIG. 21

TRANSACTIONAL MEMORY FLOWCHART

TRANSACTIONAL MEMORY OPERATIONAL FLOW

PIPELINE OPERATIONAL FLOW

TRANSACTIONAL MEMORY PERFORMING COUNT UPDATE
(PRIOR ART)

MU ISLAND SHOWING STATS ENGINE IN DETAIL

STATE DIAGRAM OF STATS ENGINE STATE MACHINE

FLOWCHART OF STATS ENGINE OPERATION

FLOWCHART OF A TRIE MULTI-BIT LOOKUP OPERATION

ROUTER

MU ISLAND SHOWING THE LOOKUP ENGINE
PERFORMING A TRIE MULTI-BIT LOOKUP OPERATION

STATE DIAGRAM FOR A STATE MACHINE OF THE
LOOKUP ENGINE

BLOCK DIAGRAM OF TRIE MULTI-BIT LOOKUP HARDWARE
OF LOOKUP STAGE OF PIPELINE

3X128 BITS READ OUT OF MEMORY UNIT

BARREL SHIFTER

HARWARE TRIE STRUCTURE

CONCEPTUAL DIAGRAM OF TRIE MULTI-BIT
LOOKUP OPERATION

RESULT VALUE
(IF THE ALGORITHMIC LOOKUP BIT IS ZERO)

|  | MEMORY LOCATION 3 32 BITS | MEMORY LOCATION 2 32 BITS | MEMORY LOCATION 1 32 BITS | MEMORY LOCATION 0 32 BITS |
|---|---|---|---|---|
| MEMORY WORD 0 | R3 | R2 | R1 | R0 |
| MEMORY WORD 1 | R7 | R6 | R5 | R4 |
| MEMORY WORD 2 | R11 | R10 | R9 | R8 |
| MEMORY WORD 3 | R15 | R14 | R13 | R12 |
| MEMORY WORD 4 | R19 | R18 | R17 | R16 |
| MEMORY WORD 5 | R23 | R22 | R21 | R20 |
| MEMORY WORD 6 | R27 | R26 | R25 | R24 |
| MEMORY WORD 7 | R31 | R30 | R29 | R28 |
DIRECT 32-BIT MEMORY PACKING SCHEME
FIG. 40
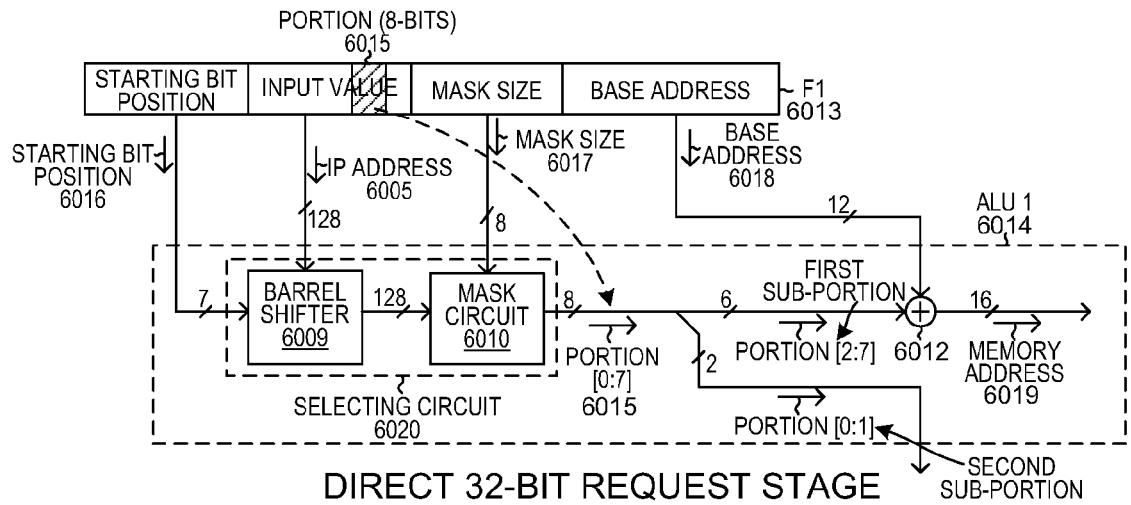
DIRECT 32-BIT REQUEST STAGE
FIG. 41
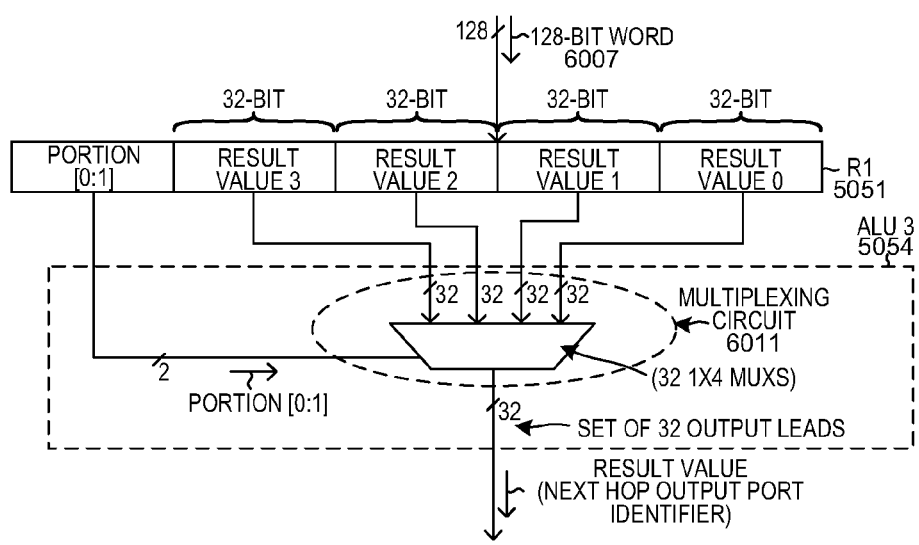
DIRECT 32-BIT LOOKUP STAGE
FIG. 42

DIRECT RESULT VALUE

DIRECT 32-BIT LOOKUP FLOWCHART

RECURSIVE USE OF MULTIPLE HARDWARE LOOKUP STRUCTURES

DIRECT 24-BIT REQUEST STAGE

DIRECT 24-BIT LOOK-UP STAGE

DIRECT 24-BIT LOOK-UP FLOWCHART

RECURSIVE LOOKUP WITH A HARDWARE TRIE STRUCTURE THAT HAS NO SEQUENTIAL LOGIC ELEMENTS

CROSS REFERENCE TO RELATED APPLICATION

This application is a continuation of, and claims priority under 35 U.S.C. § 120 from, nonprovisional U.S. patent application Ser. No. 13/552,555 entitled "RECURSIVE LOOKUP WITH A HARDWARE TRIE STRUCTURE THAT HAS NO SEQUENTIAL LOGIC ELEMENTS," filed on Jul. 18, 2012, and published as U.S. Pat. Pub. No. 2014/0025858. The disclosure of the foregoing document is incorporated herein by reference.

TECHNICAL FIELD

The described embodiments relate generally to network processor integrated circuits employing transactional memories and to related methods.

BACKGROUND INFORMATION

A network processor is a device that executes programs to handle packet traffic in a data network. A network processor is also often referred to as a network flow processor or simply a flow processor. Examples include network processor integrated circuits on router line cards and in other network equipment. In one example, a network processor integrated circuit is capable of receiving packets, classifying and performing atomic operations on the packets and associated packet data, and transmitting packets. Processors on the integrated circuit are called upon to perform processing functions that include using hash functions and hash tables stored in on-chip memories to find data structures that store information pertaining to different types of packets. A processor on the integrated circuit may also be called upon to determine and to log updated packet count and byte count information into appropriate tables in memory. As throughput requirements increase, ways of adding processing power are sought.

In one specific example, a network processor integrated circuit uses the flexible and expandable IXP2800 architecture. The IXP2800 architecture allows multiple high-speed processors (referred to as microengines) to access the same memory resources via a common command/push/pull bus. Due to use of the IXP2800 architecture and multiple microengines, increased processing power is brought to bear on the tasks of identifying data structures using hash functions and of logging packet and byte count information. If more throughput is required, then more microengines can be employed. If less throughput is required, then fewer microengines can be employed. The NFP-3XXX and NFP-6XXX families of network processor integrated circuits available from Netronome Systems, Inc. of Santa Clara, Calif. include a selection of IXP2800-based network processor integrated circuits having different numbers of microengines.

SUMMARY

An Island-Based Network Flow Processor (IB-NFP) includes a plurality of islands that are interconnected by a configurable mesh Command/Push/Pull (CPP) data bus. A first of the islands includes a processor. A second of the islands includes a novel transactional memory. The CPP data bus includes a configurable command mesh, a configurable pull-id mesh, a configurable data0 mesh, and a configurable data1 mesh.

In a first novel aspect, the processor of the first island sends an Atomic Look-up Add and Lock (ALAL) command to the novel transactional memory of the second island. The ALAL command includes a first value. In one example, the first value is a hash index. In response to receiving the ALAL command, the transactional memory pulls a second value across the CPP data bus. In one example, the second value is a hash key. The transactional memory uses the first value to read a set of locations from a memory. In one example, the set of locations is a hash bucket made up of a set of hash bucket locations. A memory of the transactional memory stores a hash table of hash buckets.

Next, the transactional memory determines if any of the locations read contains the second value. If no location contains the second value, then the transactional memory locks a vacant location of the set of locations, adds the second value to the vacant location, and returns a value to the processor across the CPP data bus. The value returned indicates the location where the second value was added. The reference to "adds" the second value to the vacant location means that the second value is written into the vacant location.

If a location contains the second value and the location is not locked, then the transactional memory locks the location and returns a value to the processor across the CPP data bus, where the value returned indicates the location where the second value was found. If a location contains the second value but the location is locked, then the transactional memory returns a value to the processor across the CPP data bus, where the value returned indicates the location where the second value was found and indicates that the location is locked. Each location has a lock field. The location is locked by setting a lock field of the location. The location is unlocked by clearing the lock field of the location.

Also stored in the memory of the transactional memory is a data structure table. A set of data structures makes up the data structure table. There is one such data structure for each hash bucket location in the hash table. Setting the lock field of a hash bucket location in the hash table locks access to the associated data structure for any processor other than the processor that sent the ALAL command. The processor that controls a locked data structure can unlock the data structure by writing to the associated hash bucket location in the hash table, and clearing the lock field of that associated location.

In one specific example, the circuitry of the transactional memory includes an atomic engine, a memory unit, a bulk engine, and a data bus interface. The atomic engine in turn includes a state machine selector, a state machine array including multiple state machines, an arbiter, a translator, a register pool, and a pipeline. The memory unit includes a memory, input FIFOs, output FIFOs, and a pair of crossbar switches. The hash table of hash buckets is stored in the memory unit. The data structure table of data structures is also stored in the memory unit.

When the transactional memory receives an ALAL command, the command passes through the data bus interface and to the state machine selector of the atomic engine. The state machine selector selects one of the state machines of the state machine array that is idle. The state machine selected then transitions operation from the idle state to a pull state. As a result, a pull occurs across the CPP data bus so that a hash key is read back across the CPP data bus and is stored in the register pool. The state machine transitions from the pull state to the output state. This results in the state machine outputting an operation instruction. The operation instruction is translated by the translator into a hash index and a set of op codes. The set of op codes includes one op code for each of the stages of the pipeline.

A first stage of the pipeline, as determined by its op code, issues a read request to the memory unit to read a hash bucket addressed by the hash index. The read request is serviced by a memory controller of the memory unit. The memory unit returns the requested hash bucket to the second stage of the pipeline. The hash key (that was pulled across the CPP data bus) is also supplied by the register pool to the second stage of the pipeline. Next, a third stage of the pipeline, as determined by its op code, checks each of the hash bucket locations of the hash bucket to determine if any one of the hash bucket locations is storing the hash key. Depending on whether the hash key is found or not, and whether the hash bucket location containing the hash key is locked or not, the hash bucket value is changed as appropriate to generate an updated hash bucket value. A subsequent stage in the pipeline, as determined by its op code, then issues a write request to the memory unit to write the updated hash bucket value back into the hash bucket if appropriate. In addition, the stage of the pipeline outputs a results packet that is sent to the requesting processor via the CPP data bus. The results packet indicates, among other information, which hash bucket location of the hash bucket contained the hash key, if any, and also indicates whether the hash bucket location was locked.

There is only one pipeline, use of which is shared by the several state machines of the state machine array. Multiple state machines can be using the pipeline at the same time. The state machines and the pipeline are dedicated hardware circuits and involve no processor that fetches instructions, decodes the instructions, and executes the instructions. The processor that controls a locked data structure can unlock the data structure across the CPP data bus by using the bulk engine to write a value into the hash bucket location associated with the data structure, where the value written causes the lock field of the hash bucket location to be cleared. The ALAL command is not limited to use with hash function and hash key lookups, but rather the ALAL command has general utility. The description of the ALAL command in connection with a hash key lookup is just presented as one representative application of the command.

In a second novel aspect, the processor on the first island sends a Stats Add-and-Update (AU) command across the command mesh of the CPP data bus to the novel transactional memory of the second island. The AU command includes a second value. A memory unit of the transactional memory stores a plurality of first values in a corresponding set of memory locations. A hardware engine of the transactional memory receives the AU, and in response performs a pull using other meshes of the CPP data bus thereby obtaining a set of addresses, uses the pulled addresses to read the first values out of the memory unit, adds the same second value to each of the first values thereby generating a corresponding set of updated first values, and causes the set of updated first values to be written back into the plurality of memory locations. The actual operations are performed as a read, an update, and a write, where these steps are performed over and over, once for each memory location to be updated. To carry out these add and update operations, there is only one bus transaction value sent across the command mesh of the CPP data.

In one specific example, the circuitry of the transactional memory includes a stats engine, a memory unit, and a data bus interface. The stats engine in turn includes a state machine selector, a state machine array including multiple state machines, an arbiter, a translator, a register pool, and a pipeline. The memory unit includes a memory, input FIFOs, output FIFOs, and a pair of crossbar switches. The first values are stored in a corresponding set of memory locations in the memory.

When the transactional memory receives an AU command, the command passes through the data bus interface and to the state machine selector of the stats engine. The state machine selector selects one of the state machines of the state machine array that is idle. The state machine selected then transitions operation from the idle state to a pull state. A pull occurs across the CPP data bus so that the set of addresses is read back across the CPP data bus and is stored in the register pool. The state machine transitions from the pull state to the output state. This results in the state machine outputting an operation instruction. The operation instruction is translated by the translator into a byte number value, a packet number value, and a set of op codes. The set of op codes includes one op code for each of the stages of the pipeline.

A first stage of the pipeline, as determined by its op code, issues a read request to the memory unit to use the first address (the first address that was pulled across the CPP data bus) to read a corresponding memory location of the memory unit. The read request is serviced by a memory controller of the memory unit. The memory unit returns the requested contents of the memory location. In one example, the contents is a packet number value. Next, a third stage of the pipeline, as determined by its op code, adds the packet number value received from the translator to the packet number value read out of the memory location, thereby generating an updated packet count value. A subsequent stage in the pipeline, as determined by its op code, then issues a write request to the memory unit to write the updated packet count value back into the memory location. This process is repeated for each successive one of the addresses pulled across the CPP data bus. If the count value read out of the memory location is a packet count value, then the packet count value from the translator is added to the packet count value read from the memory unit, and the resulting updated packet count value is written back into the memory location in the memory unit. Likewise, if the count value read out of the memory location is a byte count value, then the byte count value from the translator is added to the byte count value read from the memory unit, and the resulting updated byte count value is written back into the memory location in the memory unit. In some embodiments, multiple count values are read out of memory together, and these multiple count values are updated in parallel, and the resulting multiple updated count values are written back into memory together.

There is only one pipeline, use of which is shared by the several state machines of the state machine array. Multiple state machines can be using the pipeline at the same time. The state machines and the pipeline are dedicated hardware circuits and involve no processor that fetches instructions, decodes the instructions, and executes the instructions. The AU command is not limited to keeping packet counts and byte counts, but rather is usable to log counts of other quantities. The example of using the AU command to log a packet count and a byte count is presented just as one application to which the AU command can be put.

In addition to executing the AU command, the stats hardware engine of the transactional memory can also execute a stats "Read and Clear" (RC) command. The stats read and clear command is similar to the stats AU command in that one command is sent across the command mesh of the CPP bus but multiple memory operations result. Rather than writing back a count value into each memory location, the stats read and clear command results in writing a zero value into each indicated memory location. In addition, the write stage of the pipeline returns a stats data value that is sent via the data bus interface and CPP data bus back to the processor. The stats data value is the set of count values for all the memory locations that were cleared.

In a third novel aspect, the lookup engine of the transactional memory on the second island has a novel hardware trie structure. The processor on the first island sends a lookup command across the command mesh of the CPP data bus to the transactional memory of the second island. The lookup command includes address information. The address information identifies the location of a block of information stored in the memory unit of the transactional memory. In response to receiving the lookup command, the lookup engine pulls a key input value (IV) across the CPP bus from the first island. In one example, the IB-NFP is part of a router, the key to lookup is an IP destination address of an IP packet, and the information to be looked up is an identifier that identifies a next hop output port to which the IP packet is to be sent. Once the IP address has been received by the lookup engine, the lookup engine uses the address information received in the lookup command to read the block of information from the memory unit. The block of information includes information for configuring the hardware trie structure. In one example, the block of information is a block of three 128-bit words. This 3×128-bit block includes a plurality of multi-bit node control values (NVCs), a plurality of multi-bit result values (RV), and a lookup type value. The lookup engine is capable of performing several different types of lookups, including a trie lookup operation. The lookup type value is supplied to an ALU within the lookup engine so that the hardware trie structure will be used to perform the lookup operation.

The lookup engine also includes a storage device (for example, a register) whose outputs are coupled to inputs of the ALU. The lookup type value read from the memory unit is supplied to the ALU by loading the lookup type value into an appropriate location in the storage device. Similarly, the NVCs and the RVs are loaded into other positions in the storage device such that the storage device supplies the NVCs and the RVs to the proper inputs of the hardware trie structure. Similarly, the IP address is loaded into an appropriate position in the storage device so that the IP address is supplied onto a set of input leads of the hardware trie structure. The hardware trie structure includes a plurality of internal node circuits and a plurality of leaf node circuits. Each of the NVCs as output by the storage device is received by, and configures, a corresponding respective one of the internal node circuits. The internal node circuits are organized as a tree with the root node circuit receiving the IP address via the set of input leads. Each of the RVs as output by the storage device is received by a corresponding respective one of the leaf node circuits. The hardware trie structure is purely combinatorial logic such that supplying the IP address onto the set of input leads causes signals to propagate through the combinatorial logic of the hardware trie structure thereby causing one of the leaf nodes to output its corresponding RV value onto a set of output leads of the hardware trie structure.

In one example, the result value RV output by the hardware trie structure includes a final result bit (FRB). The value of the FRB indicates whether or not the result value as output by the hardware trie structure is a final result value (in this case, a next hop output port identifier). If the FRB indicates that the result value is a final result value, then the lookup engine sends the result value back to the first island across the CPP data bus. The next hop output port identifier is used to route the IP packet (the IP packet of which the IP destination address was a part) through the router to an output port of the router. If, on the other hand, the FRB indicates that the result value is not a final result value then the lookup engine performs another lookup operation. The result value includes address information that identifies a second block of information in the stored in the memory unit. The lookup engine uses this address information to read the second block of information from the memory of the transactional memory. If the second lookup is an algorithmic lookup, then the lookup type value of the second block determines the type of algorithmic lookup. The lookup type may, for example, indicate that the second lookup operation is to also be a trie lookup. In this way, multiple lookup operations may be performed by the lookup engine in a recursive fashion until a final result value is obtained. When the final result value is obtained, it is supplied via the CPP data bus to the processor that issued the original lookup command. In a sequence of such recursive lookups, different types of lookups can be performed on different parts of a single key. The hardware trie structure, the transactional memory and the related methods are of general utility in looking up different types of information and are not limited to looking up next hop output port information from incoming IP addresses.

In a fourth novel aspect, the processor on the first island sends a direct 32-bit lookup command across the command mesh of the CPP data bus to the novel transactional memory of the second island. The lookup command includes a base address value, a starting bit position value, and a mask size value. A memory unit of the transactional memory stores a plurality of result values in a corresponding set of memory locations. A state machine within a hardware engine of the transactional memory receives the lookup command and in response performs a pull using other meshes of the CPP data bus thereby obtaining an input value (IV). The hardware engine uses the starting bit position value and mask size value to select a portion of the IV and generates a memory address by summing a first sub-portion of the portion of the IV with the base address value. The memory address is used to generate a read request that is communicated to the memory unit from the hardware engine. In response to the read request, the memory unit sends a word containing multiple result values to the hardware engine. The hardware engine uses a second sub-portion of the portion of the IV to select one of the set of result values, and communicate the result value to the initiating state machine. The initiating state machine then checks if the result value is a final result value. If the result value is a final result, then the state machine causes the result value to be communicated back to the processor. If the result value is not a final result, then the state machine causes a new lookup operation based upon the contents of the result value. The actual operations are performed as a read, a lookup, and a result communication, where these steps are performed repeatedly until a final result value is found. To carry out these multiple lookup operations, there is only one bus transaction value sent across the command mesh of the CPP data bus.

In one specific example, the circuitry of the transactional memory includes a lookup engine, a memory unit, and a data bus interface. The lookup engine in turn includes a state machine selector, a state machine array including multiple state machines, an arbiter, a translator, a register pool, and a pipeline. The memory unit includes a memory, input FIFOs, output FIFOs, and a pair of crossbar switches. The result values are stored in a corresponding set of memory locations in the memory.

When the transactional memory receives a direct 32-bit lookup command, the command passes through the data bus interface and to the state machine selector of the lookup engine. The state machine selector selects one of the state machines of the state machine array that is idle. The state machine selected then transitions operation from the idle state to a pull state. A pull occurs across the CPP data bus so that an input value is read back across the CPP data bus and is stored in the register pool. The state machine transitions from the pull state to the output state. This results in the state machine outputting an operation instruction. The state machine transitions from the output state to the wait for result state. The operation instruction is translated by the translator into address information and a set of op codes. The set of op codes includes one op code for each of the stages of the pipeline. After the pipeline has performed each op-code a final result value is communicated to the initiating state machine and the state machine transitions to the idle state.

A first stage of the pipeline, as determined by its op code, issues a read request to the memory unit to use the starting bit position value and the mask size value to select a portion of the IV. A first sub-portion of the portion of the IV is added to the base address value (both of which were included in the lookup command) to generate a memory address. The memory address is used to generate a read request. The read request is serviced by a memory controller of the memory unit. The memory unit returns the requested contents of the memory location. In one example, the contents is a word containing multiple result values. Another stage of the pipeline, as determined by its op code, performs a lookup operation, thereby selecting one of the multiple result values included in the received word. A result value is selected based upon a second sub-portion of the IV. A subsequent stage in the pipeline, as determined by its op code, then communicates the selected result value to the initiating state machine. If the result value is a final result value then the state machine communicates the result value to the processor. If the result value is not a final result value, then the state machine issues a new operation instruction based upon the contents of the result value.

There is only one pipeline, use of which is shared by the several state machines of the state machine array. Multiple state machines can be using the pipeline at the same time. The state machines and the pipeline are dedicated hardware circuits and involve no processor that fetches instructions, decodes the instructions, and executes the instructions. The lookup command is not limited to performing direct 32-bit lookup operations, but rather is usable to perform many other types of lookup operations. The example of using the lookup command to perform a direct 32-bit lookup operation is presented just as one operation that the lookup engine can perform.

In a fifth novel aspect, the lookup engine of the transactional memory has multiple hardware lookup structures. The lookup engine is configurable in a first configuration such that a first hardware lookup structure of the lookup engine is usable to perform a first lookup operation. The lookup engine is configurable in a second configuration such that a second hardware lookup structure of the lookup engine is used to perform a second lookup operation. The first lookup operation may, for example, be a first type of lookup such as a direct lookup operation, and the second lookup operation may be a second type of lookup such as an algorithmic lookup operation. Initially, a lookup command and an input value (IV) are received onto the transactional memory. In some examples, the IV is not a part of the lookup command but rather is received onto the transactional memory in a second bus transaction. In other examples, the IV is a part of the lookup command. A first block of first information is read from the memory unit of the transactional memory by the lookup engine. The lookup engine then uses the first information to configure the lookup engine in the first configuration. The lookup engine so configured is used to perform a first lookup operation on a part of the input value. The part of the input value may be determined by a starting point value of the first information. A barrel shifter within the lookup engine may receive the starting point value so that the barrel shifter outputs the part of the input value that is used as an input value to the lookup operation. As a result of the first lookup operation, the lookup engine obtains a first result value. Based on the first result value, the lookup engine determines to do one of the following: 1) perform a second lookup operation, 2) output the first result value from the transactional memory as a result of the lookup command.

In one example, the first result value has a Final Result Bit (FRB). The value of the FRB indicates whether the first result value is a final result value. If the first result value is a final result value, then the final result value is output from the transactional memory as the result of the lookup command. If, on the other hand, the FRB indicates that the first result value is not a final result value, then address information in the first result value is used by the lookup engine to read a second block of information from the memory unit. The lookup engine then uses the second information to configure the lookup engine in the second configuration. The lookup engine so configured is used to perform a second lookup operation on another part of the input value. As a result of the second lookup operation, the lookup engine obtains a second result value and based on the second result value, the lookup engine determines to do one of the following: 1) perform a third lookup operation, 2) output the second result value from the transactional memory as a result of the lookup command. In this way, the lookup engine performs lookup operation after lookup operation in a recursive fashion. In one example, the type of each successive lookup operation is determined at least in part by a type value that is a part of the block of information read from the memory unit at the beginning of the lookup operation. Address information in the result value of the previous lookup operation is used by the lookup engine to determine where to read the next block of information from the memory unit. In one exemplary application, a first lookup operation is a direct lookup type of lookup operation. If the first lookup operation does not result in obtaining a final result value, then the result of the first lookup operation is used to select either a direct lookup as the second lookup operation or an algorithmic lookup as the second lookup operation. If the address space being considered in the second lookup operation is densely packed with result values then the second lookup operation is a direct lookup, whereas if the address space being considered in the second lookup operation is sparsely populated with result values then the second lookup operation is an algorithmic lookup.

In a sixth novel aspect, the processor on the first island sends a direct 24-bit lookup command across the command mesh of the CPP data bus to the novel transactional memory of the second island. The lookup command includes a base address value, a starting bit position value, and a mask size value. A memory unit of the transactional memory stores a plurality of result values in a corresponding set of memory locations. Each result value is a final result value. A state machine within a hardware engine of the transactional memory receives the lookup command and in response performs a pull using other meshes of the CPP data bus thereby obtaining an input value (IV). The hardware engine uses the starting bit position value and mask size value to select a portion of the IV. The portion of the IV is used to generate a lookup block offset value, a word offset value, and a result location value. The hardware engine generates a memory address by summing the lookup block offset value, the word offset value, and the base address value. The memory address is used to generate a read request that is communicated to the memory unit from the hardware engine. In response to the read request, the memory unit sends a word containing multiple result values to the hardware engine. The hardware engine uses the result location value to select one of the set of result values, and communicates the result value to the initiating state machine. The state machine causes the result value to be communicated back to the processor. To carry out the lookup operation, there is only one bus transaction value sent across the command mesh of the CPP data bus.

In one specific example, the circuitry of the transactional memory includes a lookup engine, a memory unit, and a data bus interface. The lookup engine in turn includes a state machine selector, a state machine array including multiple state machines, an arbiter, a translator, a register pool, and a pipeline. The memory unit includes a memory, input FIFOs, output FIFOs, and a pair of crossbar switches. The result values are stored in a corresponding set of memory locations in the memory.

When the transactional memory receives a direct 24-bit lookup command, the command passes through the data bus interface and to the state machine selector of the lookup engine. The state machine selector selects one of the state machines of the state machine array that is idle. The state machine selected then transitions operation from the idle state to a pull state. A pull occurs across the CPP data bus so that an input value is read back across the CPP data bus and is stored in the register pool. The state machine transitions from the pull state to the output state. This results in the state machine outputting an operation instruction. The state machine transitions from the output state to the wait for result state. The operation instruction is translated by the translator into address information and a set of op codes. The set of op codes includes one op code for each of the stages of the pipeline. After the pipeline has performed each op-code a final result value is communicated to the initiating state machine, the state machine cause the result value to be communicated to the processor, and the state machine transitions to the idle state.

A first stage of the pipeline, as determined by its op code, issues a read request to the memory unit to use the starting bit position value and the mask size value to select a portion of the IV. The portion of the IV is used to generate a lookup block offset value, a word offset value, and a result location value. The hardware engine generates a memory address using the block offset value, the word offset value, and the base address value. The read request is serviced by a memory controller of the memory unit. The memory unit returns the requested contents of the memory location. In one example, the contents is a word containing multiple result values. Another stage of the pipeline, as determined by its op code, performs a lookup operation, thereby selecting one of the multiple result values included in the received word. A result value is selected based upon the result location value. A subsequent stage in the pipeline, as determined by its op code, then communicates the selected result value to the initiating state machine. The state machine communicates the result value to the processor.

There is only one pipeline, use of which is shared by the several state machines of the state machine array. Multiple state machines can be using the pipeline at the same time. The state machines and the pipeline are dedicated hardware circuits and involve no processor that fetches instructions, decodes the instructions, and executes the instructions. The lookup command is not limited to performing direct 24-bit lookup operations, but rather is usable to perform many other types of lookup operations. The example of using the lookup command to perform a direct 24-bit lookup operation is presented just as one operation that the lookup engine can perform.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 3 is diagram of a bus transaction value communicated across the CPP data bus.

FIG. 4 is a table listing the parts of the command payload of the bus transaction value of FIG. 3, when the bus transaction value is a command sent across the command mesh of the CPP data bus.

FIG. 5 is a table listing the width and description of each field within the payload of a bus transaction value sent across the pull-id mesh of the CPP data bus.

FIG. 6 is a table listing the width and description of each field within the payload of a bus transaction value sent across the data0 or data1 mesh of the CPP data bus.

FIG. 7 is a table listing the width and description of each field within the data payload of a pull transaction.

FIG. 8 is a table listing the width and description of each field within the data payload of a push transaction.

FIG. 21 is a table listing the width and description of each field within a results packet.

FIG. 40 is a diagram of the direct 32-bit lookup memory packing scheme.

FIG. 41 is a circuit diagram of the request stage of the pipeline within the lookup engine of FIG. 39.

FIG. 42 is a circuit diagram of the lookup stage of the pipeline within the lookup engine of FIG. 39.

DETAILED DESCRIPTION

Reference will now be made in detail to background examples and some embodiments of the invention, examples of which are illustrated in the accompanying drawings. In the description and claims below, relational terms such as "top", "down", "upper", "lower", "top", "bottom", "left" and "right" may be used to describe relative orientations between different parts of a structure being described, and it is to be understood that the overall structure being described can actually be oriented in any way in three-dimensional space.

Figure 1:
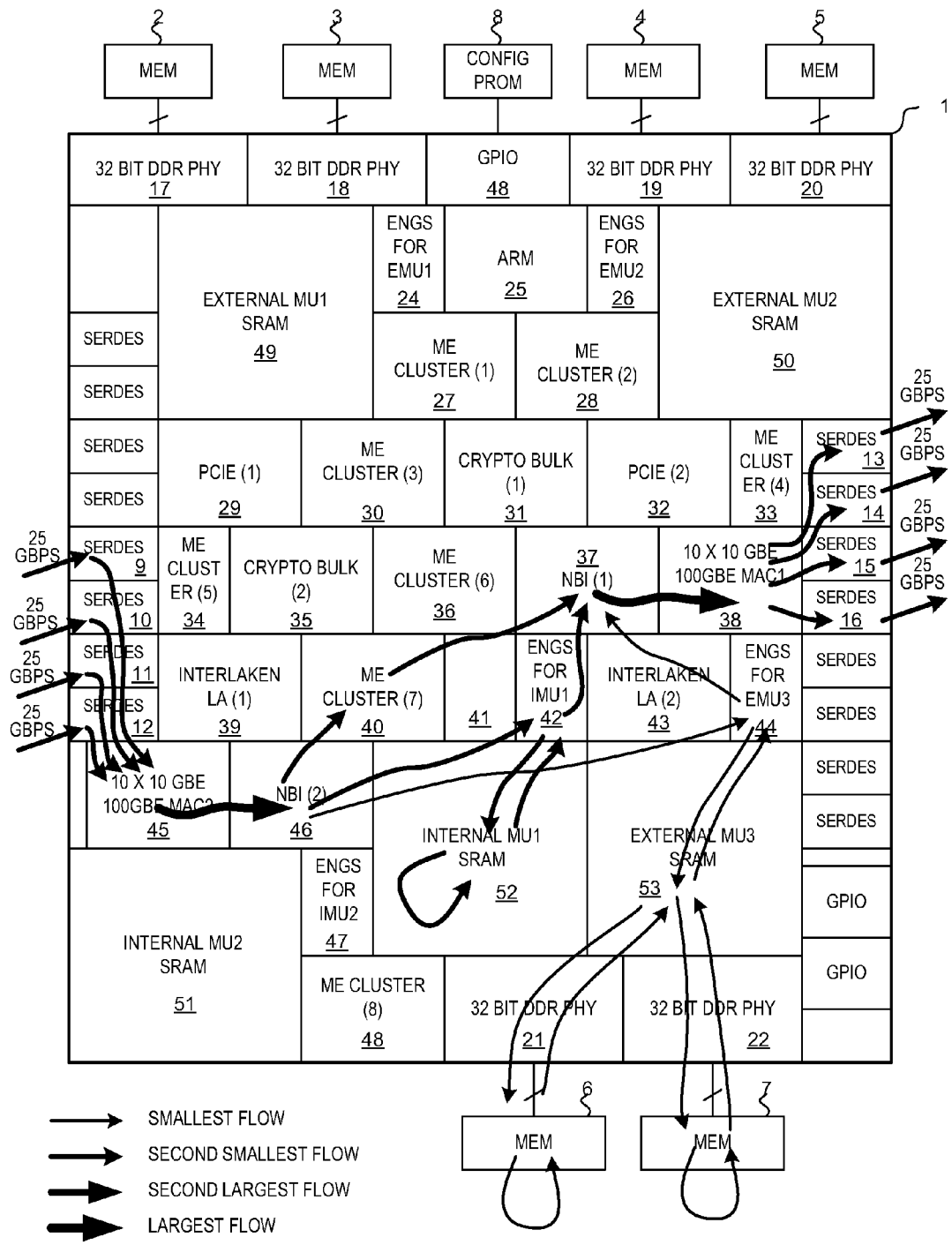
FIG. 1 is a top-down diagram of an Island-Based Network Flow Processor (IB-NFP) integrated circuit 1 and associated memory circuits 2-7 in an MPLS router application.

FIG. 1 is a top-down diagram of an Island-Based Network Flow Processor (IB-NFP) integrated circuit 1 and associated memory circuits 2-7 in an MPLS router application. IB-NFP integrated circuit 1 includes many I/O (input/output) terminals (not shown). Each of these terminals couples to an associated terminal of the integrated circuit package (not shown) that houses the IB-NFP integrated circuit. The integrated circuit terminals may be flip-chip microbumps and are not illustrated. Alternatively, the integrated circuit terminals may be wire bond pads.

SerDes circuits 9-12 are the first set of four SerDes circuits that are used to communicate with an external network via optical cables. SerDes circuits 13-16 are the second set of four SerDes circuits that are used to communicate with a switch fabric (not shown) of the router. Each of these SerDes circuits 13-16 is duplex in that it has a SerDes connection for receiving information and it also has a SerDes connection for transmitting information. Each of these SerDes circuits can communicate packet data in both directions simultaneously at a sustained rate of 25 Gbps. IB-NFP integrated circuit 1 accesses external memory integrated circuits 2-7 via corresponding 32-bit DDR physical interfaces 17-22, respectively. IB-NFP integrated circuit 1 also has several general purpose input/output (GPIO) interfaces. One of these GPIO interfaces 23 is used to access external PROM 8.

In addition to the area of the input/output circuits outlined above, the IB-NFP integrated circuit 1 also includes two additional areas. The first additional area is a tiling area of islands 24-48. Each of the islands is either of a full rectangular shape, or is half the size of the full rectangular shape. For example, the island 29 labeled "PCIE (1)" is a full island. The island 34 below it labeled "ME CLUSTER (5)" is a half island. The functional circuits in the various islands of the tiling area are interconnected by: 1) a configurable mesh Command/Push/Pull (CPP) data bus, 2) a configurable mesh control bus, and 3) a configurable mesh event bus. Each such mesh bus extends over the two-dimensional space of islands with a regular grid or "mesh" pattern.

In addition to this tiling area of islands 24-48, there is a second additional area of larger sized blocks 49-53. The functional circuitry of each of these blocks is not laid out to consist of islands and half-islands in the way that the circuitry of islands 24-48 is laid out. The mesh bus structures do not extend into or over any of these larger blocks. The mesh bus structures do not extend outside of island 24-48. The functional circuitry of a larger sized block may connect by direct dedicated connections to an interface island and through the interface island achieve connectivity to the mesh buses and other islands.

The arrows in FIG. 1 illustrate an operational example of IB-NFP integrated circuit 1 within the MPLS router. 100 Gbps packet traffic is received onto the router via an optical cable (not shown), flows through an optics transceiver (not shown), flows through a PHY integrated circuit (not shown), and is received onto IB-NFP integrated circuit 1, is spread across the four SerDes I/O blocks 9-12. Twelve virtual input ports are provided at this interface. The symbols pass through direct dedicated conductors from the SerDes blocks 9-12 to ingress MAC island 45. Ingress MAC island 45 converts successive symbols delivered by the physical coding layer into packets by mapping symbols to octets, by performing packet framing, and then by buffering the resulting packets for subsequent communication to other processing circuitry. The packets are communicated from MAC island 45 across a private inter-island bus to ingress NBI (Network Bus Interface) island 46. In addition to the optical cable that supplies packet traffic into the IB-NFP integrated circuit from the router, there is another optical cable that communicates packet traffic in the other direction out of the IB-NFP integrated circuit and to the router.

For each packet received onto the IB-BPF in the example of FIG. 1, the functional circuitry of ingress NBI island 46 examines fields in the header portion to determine what storage strategy to use to place the packet into memory. In one example, NBI island 46 examines the header portion and from that determines whether the packet is an exception packet or whether the packet is a fast-path packet. If the packet is an exception packet then the NBI island determines a first storage strategy to be used to store the packet so that relatively involved exception processing can be performed efficiently, whereas if the packet is a fast-path packet then the NBI island determines a second storage strategy to be used to store the packet for more efficient transmission of the packet from the IB-NFP. NBI island 46 examines a packet header, performs packet preclassification, determines that the packet is a fast-path packet, and determines that the header portion of the packet should be placed into a CTM (Cluster Target Memory) in ME (Microengine) island 40. The header portion of the packet is therefore communicated across the configurable mesh data bus from NBI island 46 to ME island 40. The CTM is tightly coupled to microengines in the ME island 40. The ME island 40 determines header modification and queuing strategy for the packet based on the packet flow (derived from packet header and contents) and the ME island 40 informs a second NBI island 37 of these. The payload portions of fast-path packets are placed into internal SRAM (Static Random Access Memory) MU block 52 and the payload portions of exception packets are placed into external DRAM 6 and 7.

Half island 42 is an interface island through which all information passing into, and out of, SRAM MU block 52 passes. The functional circuitry within half island 42 serves as the interface and control circuitry for the SRAM within block 52. For simplicity purposes in the discussion below, both half island 42 and MU block 52 may be referred to together as the MU island, although it is to be understood that MU block 52 is actually not an island as the term is used here but rather is a block. The payload portion of the incoming fast-path packet is communicated from NBI island 46, across the configurable mesh data bus to SRAM control island 42, and from control island 42, to the interface circuitry in block 52, and to the internal SRAM circuitry of block 52. The internal SRAM of block 52 stores the payloads so that they can be accessed for flow determination by the ME island.

In addition, a preclassifier in the ingress NBI island 46 determines that the payload portions for others of the packets should be stored in external DRAM 6 and 7. For example, the payload portions for exception packets are stored in external DRAM 6 and 7. Interface island 44, external MU SRAM block 53, and DDR PHY I/O blocks 21 and 22 serve as the interface and control for external DRAM integrated circuits 6 and 7. The payload portions of the exception packets are therefore communicated across the configurable mesh data bus from NBI island 46, to interface and control island 44, to external MU SRAM block 53, to 32-bit DDR PHY I/O blocks 21 and 22, and to external DRAM integrated circuits 6 and 7. At this point in the operational example, the packet header portions and their associated payload portions are stored in different places. The payload portions of fast-path packets are stored in internal SRAM in MU block 52, whereas the payload portions of exception packets are stored in external SRAM in external DRAMs 6 and 7.

ME island 40 informs second NBI island 37 where the packet headers and the packet payloads can be found and provides the second NBI island 37 with an egress packet descriptor for each packet. The egress packet descriptor indicates a queuing strategy to be used on the packet. Second NBI island 37 uses the egress packet descriptor to read the packet headers and any header modification from ME island 40 and to read the packet payloads from either internal SRAM 52 or external DRAMs 6 and 7. Second NBI island 37 places packet descriptors for packets to be output into the correct order. For each packet that is then scheduled to be transmitted, the second NBI island 37 uses the packet descriptor to read the header portion and any header modification and the payload portion and to assemble the packet to be transmitted. The header modification is not actually part of the egress packet descriptor, but rather it is stored with the packet header by the ME when the packet is presented to the NBI. The second NBI island 37 then performs any indicated packet modification on the packet. The resulting modified packet then passes from second NBI island 37 and to egress MAC island 38.

Egress MAC island 38 buffers the packets, and converts them into symbols. The symbols are then delivered by conductors from the MAC island 38 to the four SerDes I/O blocks 13-16. From SerDes I/O blocks 13-16, the 100 Gbps outgoing packet flow passes out of the IB-NFP integrated circuit 1 and to the switch fabric (not shown) of the router. Twelve virtual output ports are provided in the example of FIG. 1.

Figure 2:
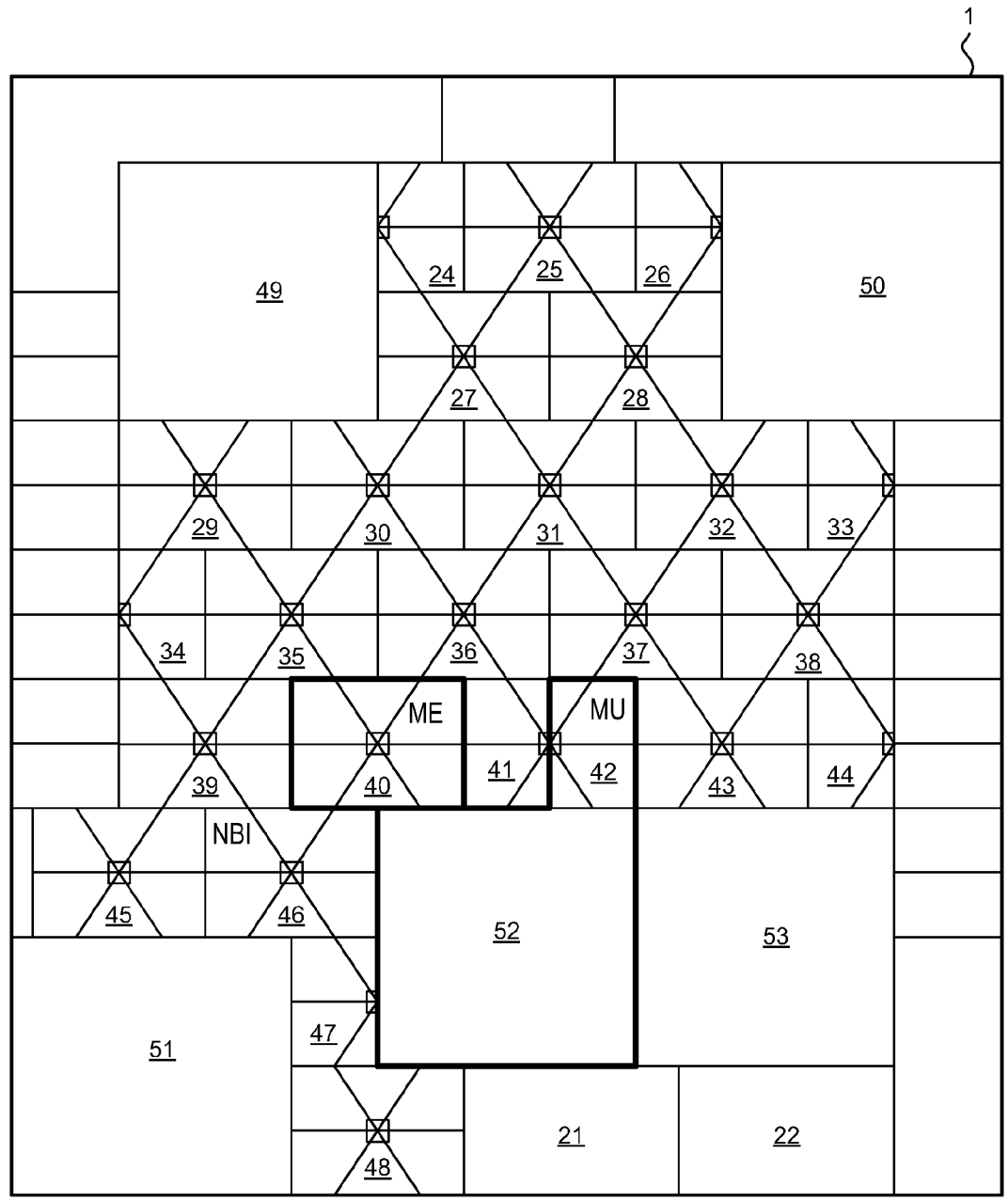
FIG. 2 shows the Command-Push-Pull (CPP) data bus structure that interconnects functional circuitry in the islands of FIG. 1.

General Description of the CPP Data Bus: FIG. 2 shows the Command-Push-Pull (CPP) data bus structure that interconnects functional circuitry in the islands of FIG. 1. Within each full island, the CPP data bus actually includes four mesh bus structures, each of which includes a crossbar switch that is disposed in the center of the island, and each of which includes six half links that extend to port locations at the edges of the island, and each of which also includes two links that extend between the crossbar switch and the functional circuitry of the island. These four mesh bus structures are referred to as the command mesh bus, the pull-id mesh bus, and data0 mesh bus, and the data1 mesh bus. The mesh buses terminate at the edges of the full island such that if another identical full island were laid out to be adjacent, then the half links of the corresponding mesh buses of the two islands would align and couple to one another in an end-to-end collinear fashion to form the staggered pattern illustrated in FIG. 2. For additional information on the IB-NFP, the IB-NFP's islands, the CPP data bus, the CPP meshes, operation of the CPP data bus, and the different types of bus transactions that occur over the CPP data bus, see: U.S. patent application Ser. No. 13/399,433 entitled "Staggered Island Structure in an Island-Based Network Flow Processor" filed on Feb. 17, 2012 (the entire subject matter of which is incorporated herein by reference).

General Description of a Write That Results in a Pull: In one example of a CPP bus transaction, a microengine (a master) on ME island 40 uses the data bus interface of ME island 40 to perform a write operation to a hardware engine (a target) on MU half island 42, where the MU island 42 responds by performing a pull operation. To do this, the microengine on the ME island 40 uses the data bus interface to output a bus transaction value onto the command mesh of the CPP data bus. The format of the bus transaction value is as set forth in FIG. 3. A bus transaction value 54 includes a metadata portion 55 and a payload portion 56 as shown. The metadata portion 55 includes a final destination value 57 and a valid bit 58.

The functional circuitry that receives the bus transaction value and the data to be written is referred to as the "target" of the write operation. The write command is said to be "posted" by the master onto the command mesh. As indicated in FIG. 3, the write command includes a metadata portion and a payload portion. The metadata portion includes the 6-bit final destination value. This final destination value identifies an island by number, where the island identified is the final destination of the bus transaction value. The final destination value is used by the various crossbar switches of the command mesh to route the bus transaction value (i.e., the command) from the master to the appropriate target, in this case to a hardware engine on MU island 42. All bus transaction values on the command mesh that originate from the same island that have the same final destination value will traverse through the configurable command mesh along the same one path all the way to the indicated final destination island.

A final destination island may include more than one potential target. The 4-bit target field of payload portion indicates which one of these targets in the destination island it is that is the target of the command. In the case of MU island 42, this 4-bit field indicates one of several hardware engines of the MU island 42. The 5-bit action field of the payload portion indicates that the command is a write. The 14-bit data reference field is a reference usable by the master to determine where in the master the data is to be found. The address field indicates an address in the target where the data is to be written. The length field indicates the amount of data.

The target (a hardware engine of MU island 42) receives the write command from the command mesh and examines the payload portion of the write command. From the action field the hardware engine in MU island 42 determines that it is to perform a write action. To carry out this action, the hardware engine (i.e., posts) a bus transaction value called a pull-id onto the pull-id mesh. FIG. 3 shows the format of the overall bus transaction value, and FIG. 5 shows the format of the payload. The final destination field of the metadata portion indicates the island where the master (in this case, a microengine on the ME island 40) is located. The target port field identifies which sub-circuit target it is within the target's island that is the target of the command. In this example, the target island is the MU island 42 so the sub-circuit is a hardware engine on the MU island. The pull-id is communicated through the pull-id mesh back to ME island 40.

The master in the ME island receives the pull-id from the pull-id mesh and uses the content of the data reference field of the pull-id to find the data. In the overall write operation, the master in the ME island knows the data it is trying to write into the MU island. The data reference value that is returned with the pull-id is used by the master in the ME island as a flag to match the returning pull-id with the write operation the ME had previously initiated.

The master on ME island 40 responds by sending the identified data to the target on MU island 42 across one of the data meshes data0 or data1 as a "pull" data bus transaction value. The term "pull" means that the data of the operation passes from the master (a microengine on the ME island) to the target (a hardware engine on the MU island). The term "push" means that the data of the operation passes from the target to the master. The format of the "pull" data bus transaction value sent in this sending of data is also as indicated in FIG. 3. The format of the payload portion in the case of the payload being pull data is as set forth in FIG. 7. The first bit of the payload portion is asserted. This bit being a digital high indicates that the transaction is a data pull as opposed to a data push. The target on MU island 42 then receives the data pull bus transaction value across the data1 or data0 mesh. The data received by the hardware engine as the data for the write is the content of the data field (the data field of FIG. 7) of the pull data payload portion.

FIG. 6 is a generic description of the data payload, and FIG. 7 is a description of the data payload when the first bit of the data payload indicates the data payload is for a pull transaction. FIG. 8 is a description of the data payload when the first bit of the data payload indicates that payload is for a push transaction.

General Description of a Read That Results in a Push: In another example, a master (for example, a microengine on ME island 40) uses the data bus interface of island 40 to perform a read operation from a target (for example, a hardware engine on MU island 42), where the target responds by performing a push operation. The microengine circuitry in ME island 40 uses the data bus interface of island 40 to output (to "post") a bus transaction value onto the command mesh bus of the configurable mesh CPP data bus. In this case, the bus transaction value is a read command to read data from the target hardware engine in MU island 42. The format of the read command is as set forth in FIGS. 3 and 4. The read command includes a metadata portion and a payload portion. The metadata portion includes the 6-bit final destination value that indicates the island where the target is located. The action field of the payload portion of the read command indicates that the command is a read. The 14-bit data reference field is usable by the master as a flag to associate returned data with the original read operation the master previously initiated. The address field in the payload portion indicates an address in the target where the data is to be obtained. The length field indicates the amount of data.

The target (a hardware engine of MU island 42) receives the read command and examines the payload portion of the command. From the action field of the command payload portion the target determines that it is to perform a read action. To carry out this action, the target uses the address field and the length field to obtain the data requested. The target then pushes the obtained data back to the master across data mesh data1 or data0. To push the data, the target outputs a push bus transaction value onto the data1 or data0 mesh. FIG. 3 sets forth the format of the overall push bus transaction value and FIG. 8 sets forth the format of the payload portion of this push bus transaction value. The first bit of the payload portion indicates that the bus transaction value is for a data push, as opposed to a data pull. The master (the microengine of ME island 40) receives the bus transaction value of the data push from the data mesh bus. The master in the ME island then uses the data reference field of the push bus transaction value to associate the incoming data with the original read command, and from the original read command determines where the pushed data (data in the date field of the push bus transaction value) should be written into the master. The master then writes the content of the data field into the master's memory at the appropriate location.

Figure 9:
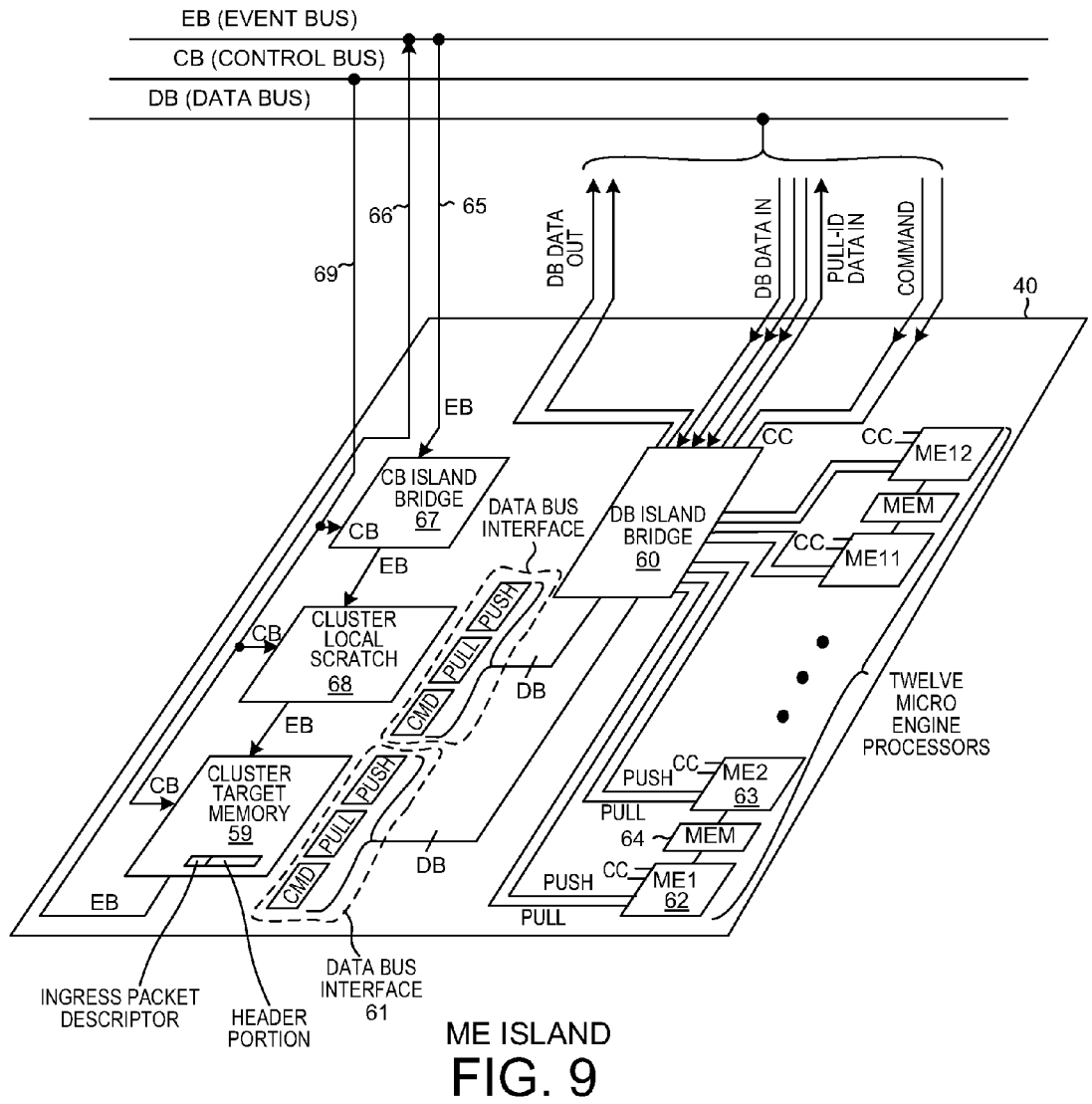
FIG. 9 is a simplified diagram of microengine (ME) island 40 of the IB-NFP integrated circuit of FIG. 1.

ME Island: FIG. 9 is a diagram of the microengine (ME) island 40. In the operational flow of FIG. 1, packet headers and the associated preclassification results are DMA transferred from the ingress NBI island 46 across the configurable mesh data bus and into the Cluster Target Memory (CTM) 59 of ME island 40. A DMA engine in the ingress NBI island 46 is the master and CTM 59 in ME island 40 is the target for this transfer. The packet header portions and the associated ingress packet descriptors pass into the ME island via data bus island bridge 60 and data bus interface circuitry 61. Once in the CTM 59, the header portions are analyzed by one or more microengines. The microengines have, through the DB island bridge 60, a command out interface, a pull-id in interface, a pull-data out interface, and a push data in interface. There are six pairs of microengines, with each pair sharing a memory containing program code for the microengines. Reference numerals 62 and 63 identify the first pair of microengines and reference numeral 64 identifies the shared memory. As a result of analysis and processing, the microengines modify each ingress packet descriptor to be an egress packet descriptor. Each egress packet descriptor includes: 1) an address indicating where and in which ME island the header portion is found, 2) an address indicating where and in which MU island the payload portion is found, 3) how long the packet is, 4) sequence number of the packet in the flow, 5) an indication of which queue the packet belongs to (result of the packet policy), 6) an indication of where the packet is to be sent (a result of the packet policy), 7) user metadata indicating what kind of packet it is.

Memory errors and other events detected in the ME island are reported via a local event ring and the global event chain back to the ARM island 25. A local event ring is made to snake through the ME island 40 for this purpose. Event packets from the local event chain are received via connections 65 and event packets are supplied out to the local event chain via connections 66. The CB island bridge 67, the cluster local scratch 68, and CTM 59 can be configured and are therefore coupled to the control bus CB via connections 69 so that they can receive configuration information from the control bus CB.

Figure 10:
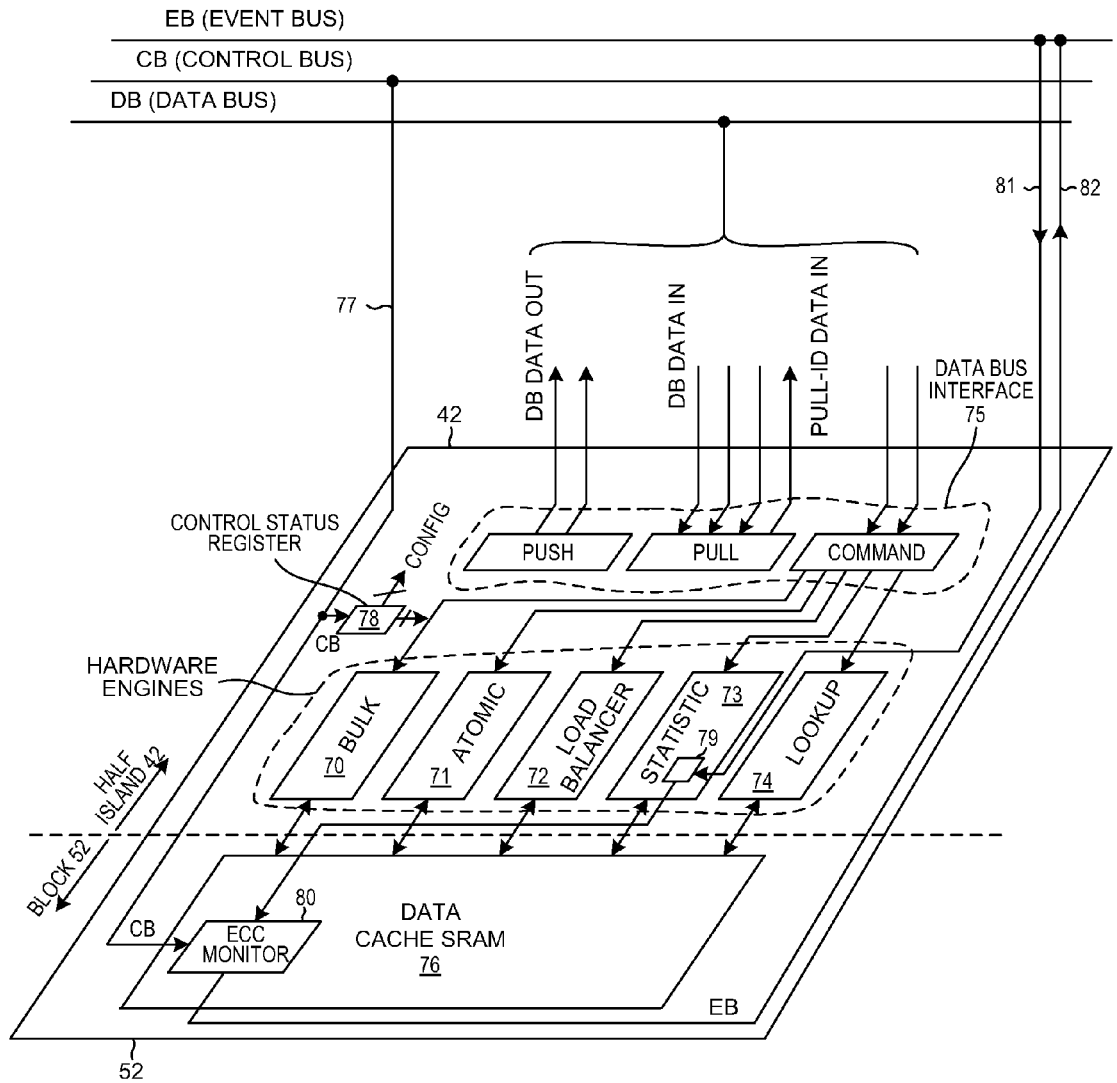
FIG. 10 is a simplified diagram of the memory unit (MU) half island 42 and memory unit (MU) block 52 of the IB-NFP integrated circuit of FIG. 1.

MU Island: FIG. 10 is a diagram of MU half island 42 and SRAM block 52. MU half island 42 includes several hardware engines 70-74. In the operational example, fast path packet payloads are DMA transferred directly from ingress NBI island 46 and across the configurable mesh data bus, through data bus interface 75 of half island 42, and into the data cache SRAM 76 of block 52. The ingress NBI DMA engine issues a bulk write command across the configurable mesh data bus to the bulk transfer engine 70. The destination is the MU island 42. The action is bulk write. The address where the data is to be written into the MU island is the address taken out of the appropriate buffer list. The bulk write command received at the MU is a bulk write, so the data bus interface 75 presents the command to the bulk engine 70. The bulk engine 70 examines the command which is a write. In order to perform a write the bulk engine needs data, so the bulk engine issues a pull-id through the pull portion of interface 75, which in turn issues a pull-id back onto the configurable mesh data bus. The DMA engine in NBI island 46 receives the pull-id. Part of the pull-id is a data reference which indicates to the DMA engine which part of the packet is being requested as data. The DMA engine uses the data reference to read the requested part of the packet, and presents that across the data part of the data bus back to bulk engine 70 in MU island 42. The bulk engine 70 then has the write command and the packet data. The bulk engine 70 ties the two together, and it then writes the packet data into SRAM 76 at the address given in the write command. In this way, fast path packet payload portions pass from DMA engine in the ingress NBI island, across the configurable mesh data bus, through the data bus interface 75, through a bulk transfer engine 70, and into data cache SRAM 76 of block 52. In a similar fashion, exception packet payload portions pass from the DMA engine in ingress NBI island 46, across the configurable mesh data bus, through the data bus interface of half island 44, through the bulk transfer engine of half island 44, and through DDR PHYs 21 and 22, and into external memories 6 and 6.

Various parts of MU island 42 are configurable by changing the contents of registers and memory via the control bus CB and connections 77 and control status registers 78. Errors detected on the MU island by circuits 79 and 80 are reported into a local event ring. Event packets from the local event ring are received via input connections 81 and the MU island outputs event packets to the local even ring via output connections 82.

Figure 11:
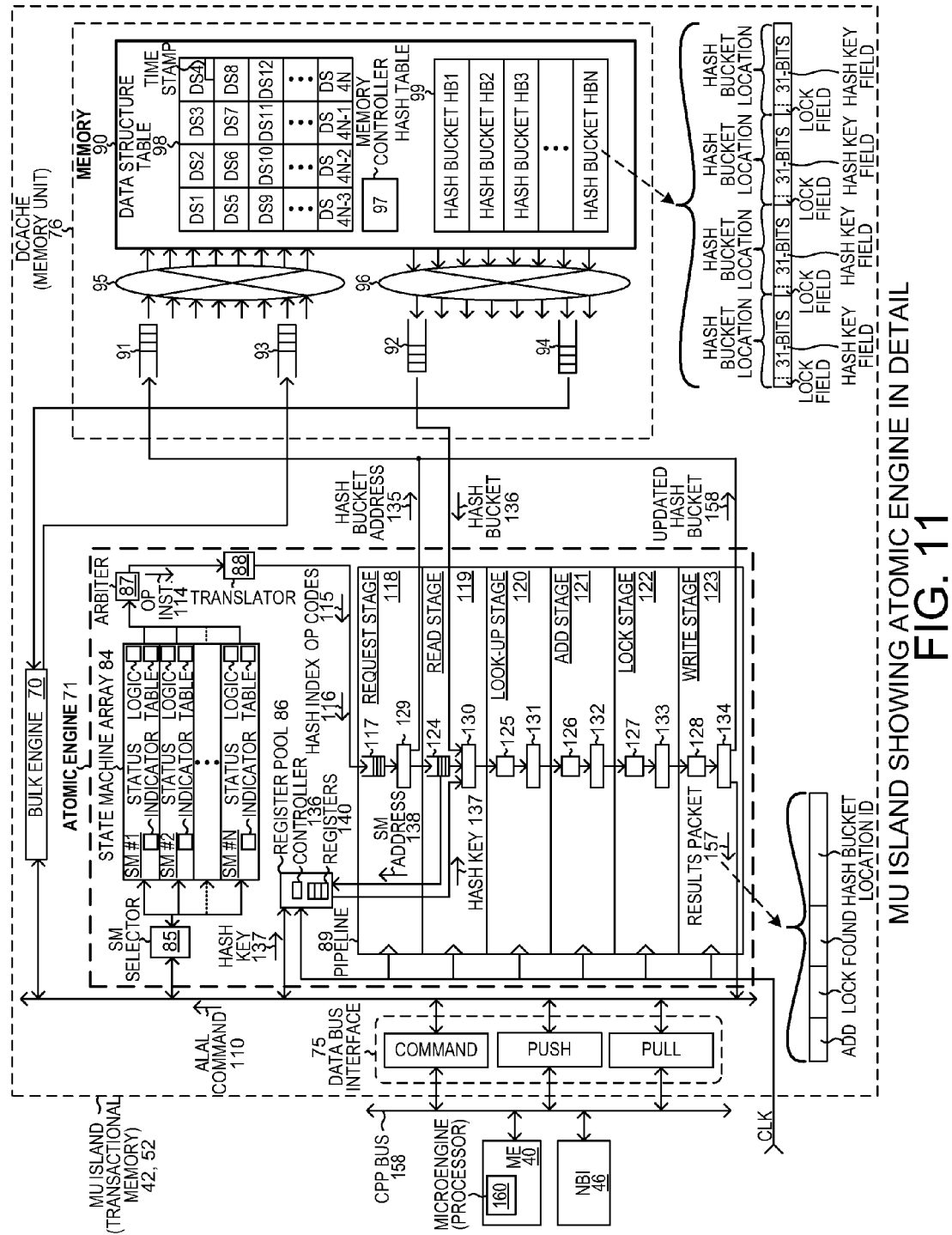
FIG. 11 is a diagram showing further detail of the atomic engine in the MU half island and block of FIG. 10.

FIG. 11 is a diagram showing the atomic engine 11 and data cache SRAM 76 of FIG. 10 in more detail. The MU island 42, 52 is a transactional memory. Atomic engine 11 includes a state machine array 84, a state machine selector 85, a register pool 86, an arbiter 87, a translator 88, and a pipeline 89. Dcache ("Memory Unit") 76 includes a memory 90, FIFOs 91-94, and two cross-bar switches 95 and 96. Memory controller 97 manages reads from and writes to the memory. Memory 90 stores a data structure table 98 and a hash table 99. Data structure table 98 includes a plurality of data structures DS1-DSN. Hash table 99 includes a plurality of hash buckets HB1-HBN.

Figure 12:
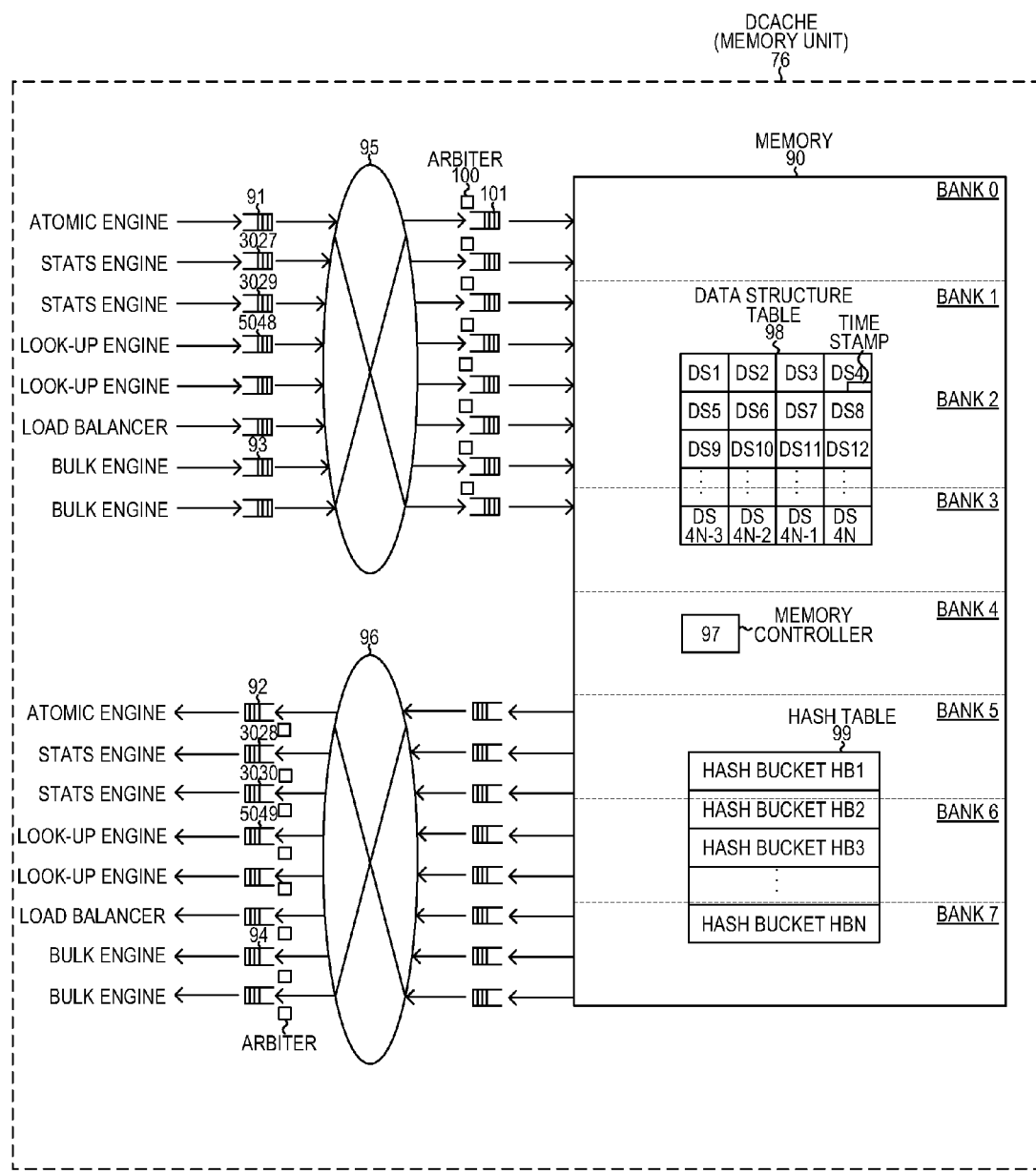
FIG. 12 is a diagram showing further detail of the Dcache (memory unit) in the MU half island and block of FIG. 10.

FIG. 12 is a more detailed diagram of Dcache ("Memory Unit") 76.

Each incoming FIFO of a crossbar switch has an associated arbiter. For example, arbiter 100 is the arbiter for incoming FIFO 101. Each of the arbiters, such as arbiter 100, receives a separate request signal from each of the input FIFOs on the other side of IN crossbar 95. For additional information on crossbar switches, their arbiters, and their operation, see: U.S. patent application Ser. No. 13/399,433 entitled "Staggered Island Structure in an Island-Based Network Flow Processor" filed on Feb. 17, 2012 (the entire subject matter of which is incorporated herein by reference).

Figure 13:
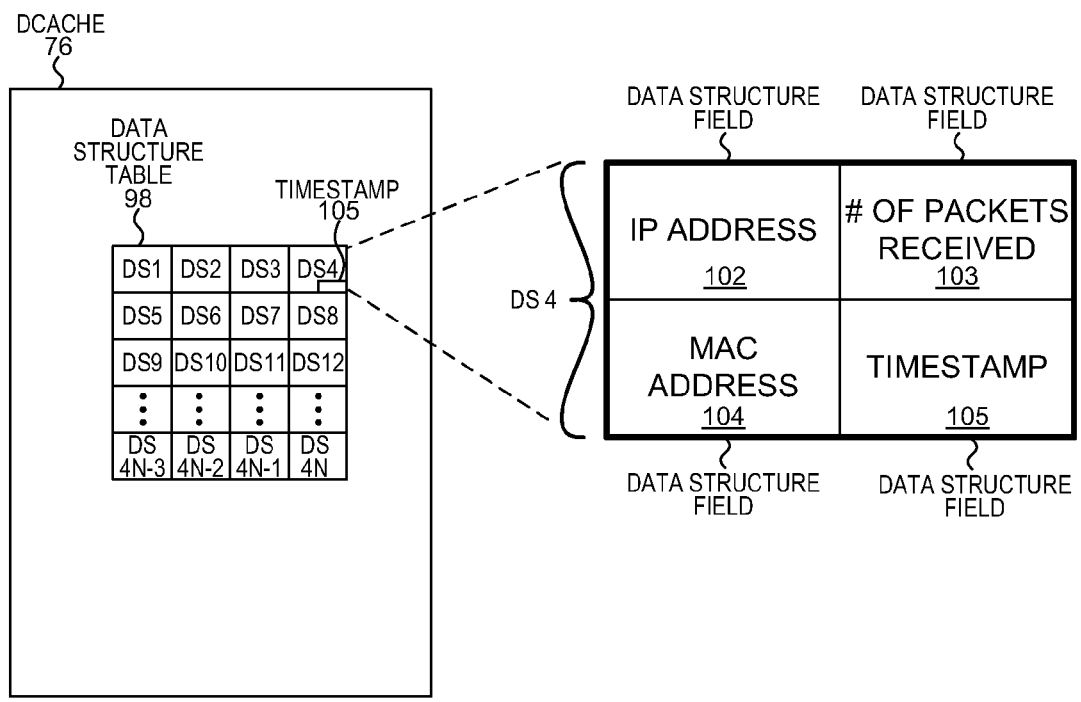
FIG. 13 is a diagram showing further detail of the data structure table stored in the Dcache 76 of FIG. 12.

FIG. 13 is a more detailed diagram of the data structure table 98 of FIG. 12. Each data structure includes four data structure fields: 1) an IP address field for storing an IP address, 2) a number of packets field for storing a number of packets received, 3) a MAC address field for storing a MAC address, and 4) a timestamp field for storing a timestamp.

Data structure DS4 includes IP address field 102, number of packets received field 103, MAC address field 104 and timestamp field 105.

Figure 15:
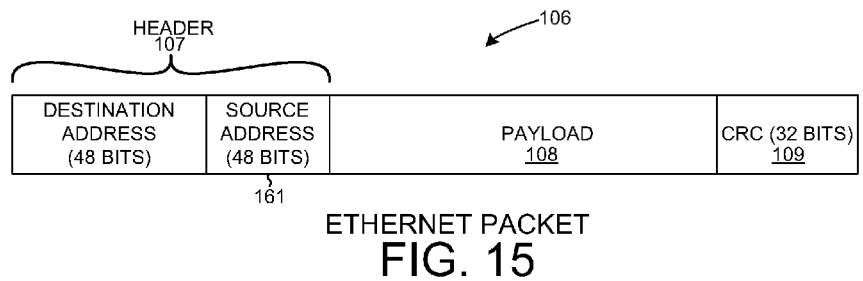
FIG. 15 is a diagram illustrating the contents of an ethernet packet.

In one example, one of the microengines 160 in ME island 40 receives an ethernet packet 106. The contents of ethernet packet 106 are illustrated in FIG. 15. Ethernet packet 106 includes a header 107, a payload 108, and a CRC 109. There is one data structure stored in memory 90 for each source address of incoming ethernet packets. Data structure DS4 in this example is the data structure for ethernet packets having the source address 161. A task to be performed is to use to source address 161 of the incoming ethernet packet to locate and access the data structure DS4, and then to update the timestamp field 105 in the data structure to log the time when the ethernet packet was received.

Figure 14:
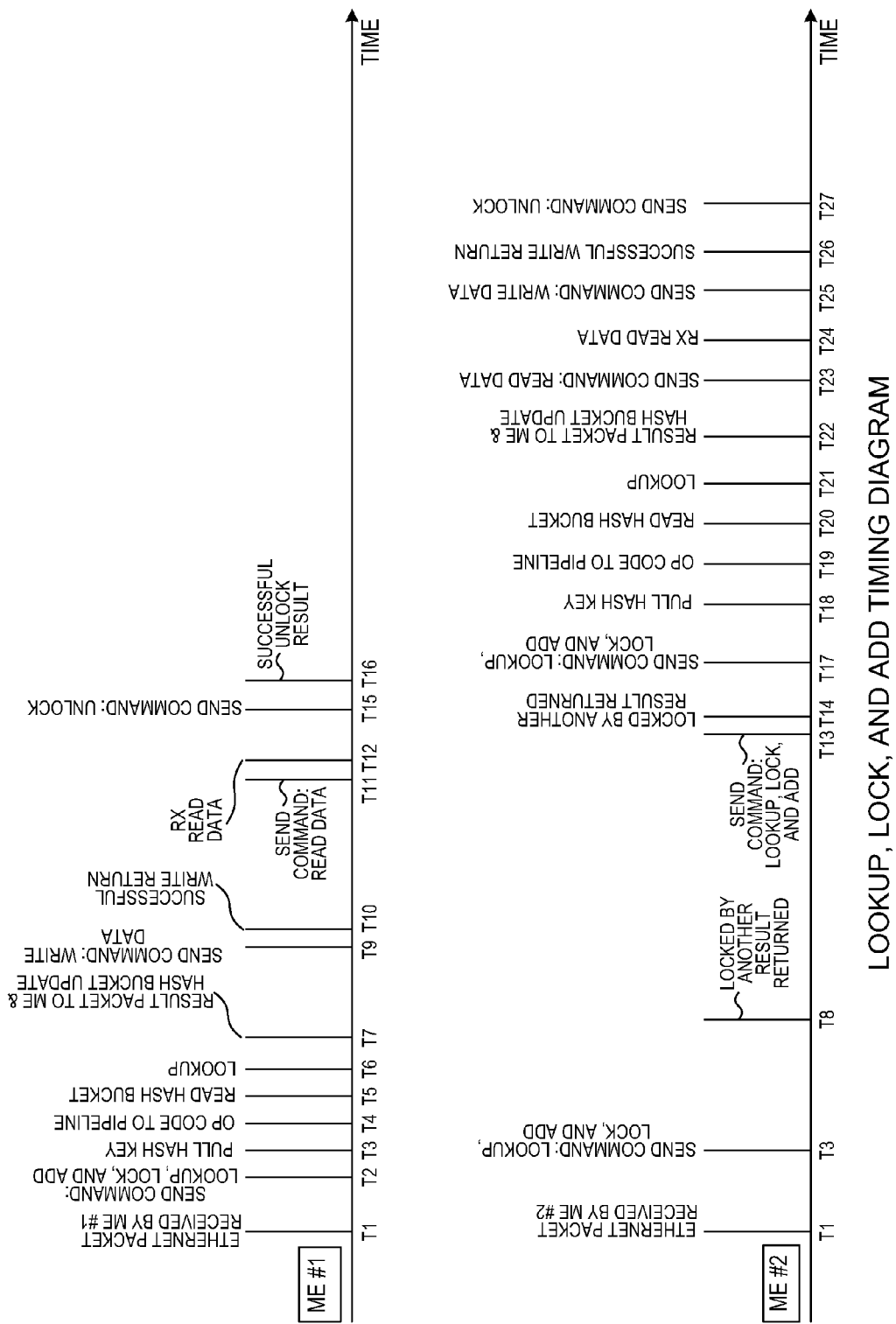
FIG. 14 is a timing diagram showing actions that occur during a carrying out of an Atomic Look-up, Add and Lock command.

FIG. 14 is a timeline. Events noted in the top line of FIG. 14 indicate actions pertaining to microengine 160 in ME island 40. Events noted in the bottom line indicate actions pertaining to another microengine in another ME island. The receiving of the ethernet packet 106 is indicated at time T1 in the timeline of FIG. 14. In response to receiving the packet, microengine 160 in ME island 40 uses a hash function to calculate a hash index 116. The hash index is related to the source address. In addition, microengine 160 sends an Atomic Lookup, Add and Lock (ALAL) command across the Command-Push-Pull (CPP) data bus 159 to the atomic engine 71 of MU island 42, 52. FIG. 14 shows the sending of the ALAL command to occur at time T2. Arrow 110 of FIG. 11 shows the incoming ALAL command. State machine selector 85 monitors the status indicator of each state machine and allocates the ALAL command 110 to an idle state machine.

Figure 16:
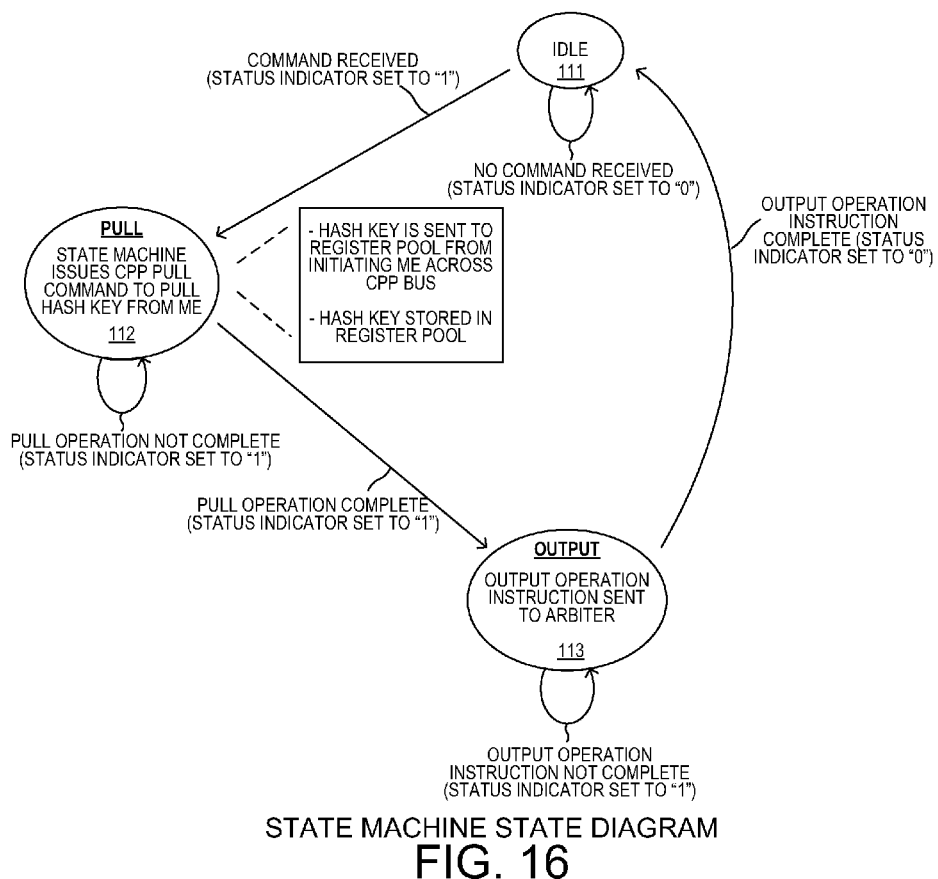
FIG. 16 is a state diagram illustrating the different states of one of the state machines within the atomic engine.

FIG. 16 is a state diagram for one of the state machines. Before receiving the ALAL command 110 from the state machine selector 85 the state machine is in the IDLE state 111. Receiving the ALAL command causes the state machine to transition from the IDLE state 111 to the PULL state 112. The state machine then causes a PULL bus transaction value to be sent via data bus interface 75 back to microengine 160 in ME island 40. This pull is an instruction to the microengine to write data (the data is a hash key) to the register pool 86 within MU island 42, 52. FIG. 14 shows the sending of the pull command to occur at time T3. Once the hash key 137 is received into the register pool, then the state machine transitions to the OUTPUT state 113. In state 113, the state machine outputs an operation instruction 114 to arbiter 87. The arbiter 87 arbitrates information flow to translator 88. Once the output operation is complete the state machine operations transitions from OUTPUT state 113 to IDLE state 111. Translator 88 converts the operation instruction 114 into a plurality of OP CODES 115. Part of the instruction is the hash index 116. Hash index 116 and the OP CODES 115 are supplied by the translator 88 to pipeline 89. FIG. 14 shows the sending of the OP CODES and the hash index to the pipeline occurring at time T4. The OP CODES 115 and hash index 116 are pushed into a FIFO 117 of request stage 118 of the pipeline. As indicated in FIG. 11, the pipeline includes stages 118-123. Each pipeline stage has an input register or FIFO, and an ALU. Reference numeral 124 identifies the input FIFO of the read stage 119 of the pipeline. Reference numerals 125-128 identify the incoming registers for pipeline stages 120-123, respectively. Reference numerals 129-134 identify the ALUs for pipeline stages 118-123, respectively.

Request stage 118 of the pipeline, in response to receiving the OP CODES 115 and hash index 116, outputs a hash bucket address 135. The hash bucket address 135 includes the hash index 116, as well as a hash base identifier. The hash base identifier indicates one of several possible hash tables. In the case that only one hash table is utilized, the hash base identifier is not necessary. FIG. 14 shows the outputting of hash bucket address 135 to read a hash bucket from hash table 99 at time T5. Request stage 118 generates a read request including hash bucket address 135. The hash bucket address passes through FIFO 91, and crossbar switch 95, to memory controller 97. The hash bucket address is an address that identifies one of the hash buckets. The identified hash bucket 136 is returned via crossbar switch 96 and FIFO 92 to the read stage 119 of the pipeline.

Figure 17:
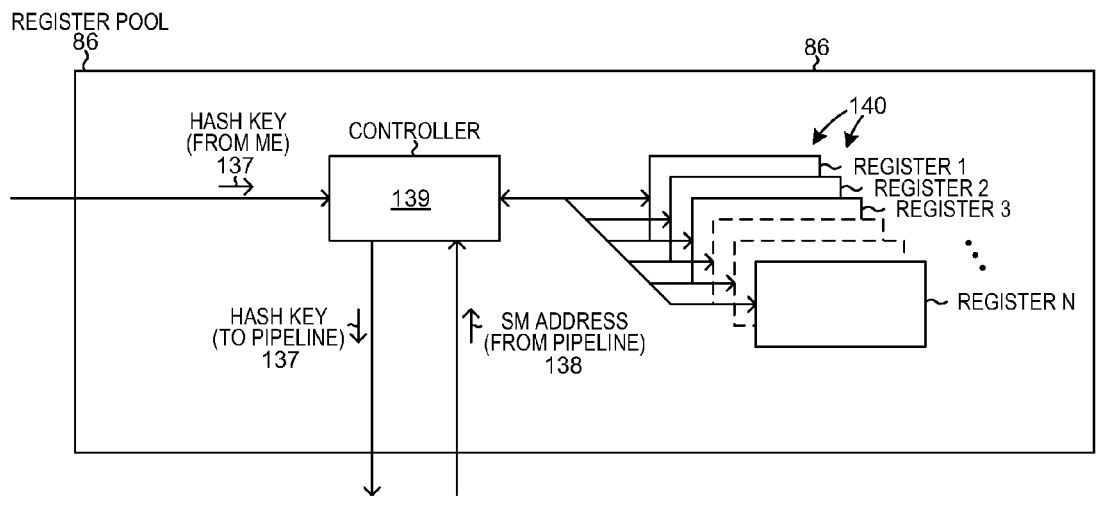
FIG. 17 is a simplified diagram of the register pool within the MU half island and block.

FIG. 17 is a more detailed diagram of register pool 86. Register pool 86 includes a controller 139 and a plurality of registers 140. There is one register in the register pool for each state machine. Controller 139 reads a state machine address 138 out of the last location of the FIFO 124 of the read stage 119 of the pipeline, and uses the state machine address 138 to identify the associated register. The associated register stores the hash key 137 that was pulled from the ME island. Controller 139 reads the hash key 137 from the appropriate register and supplies the hash key 137 to the read stage 119.

Figure 18:
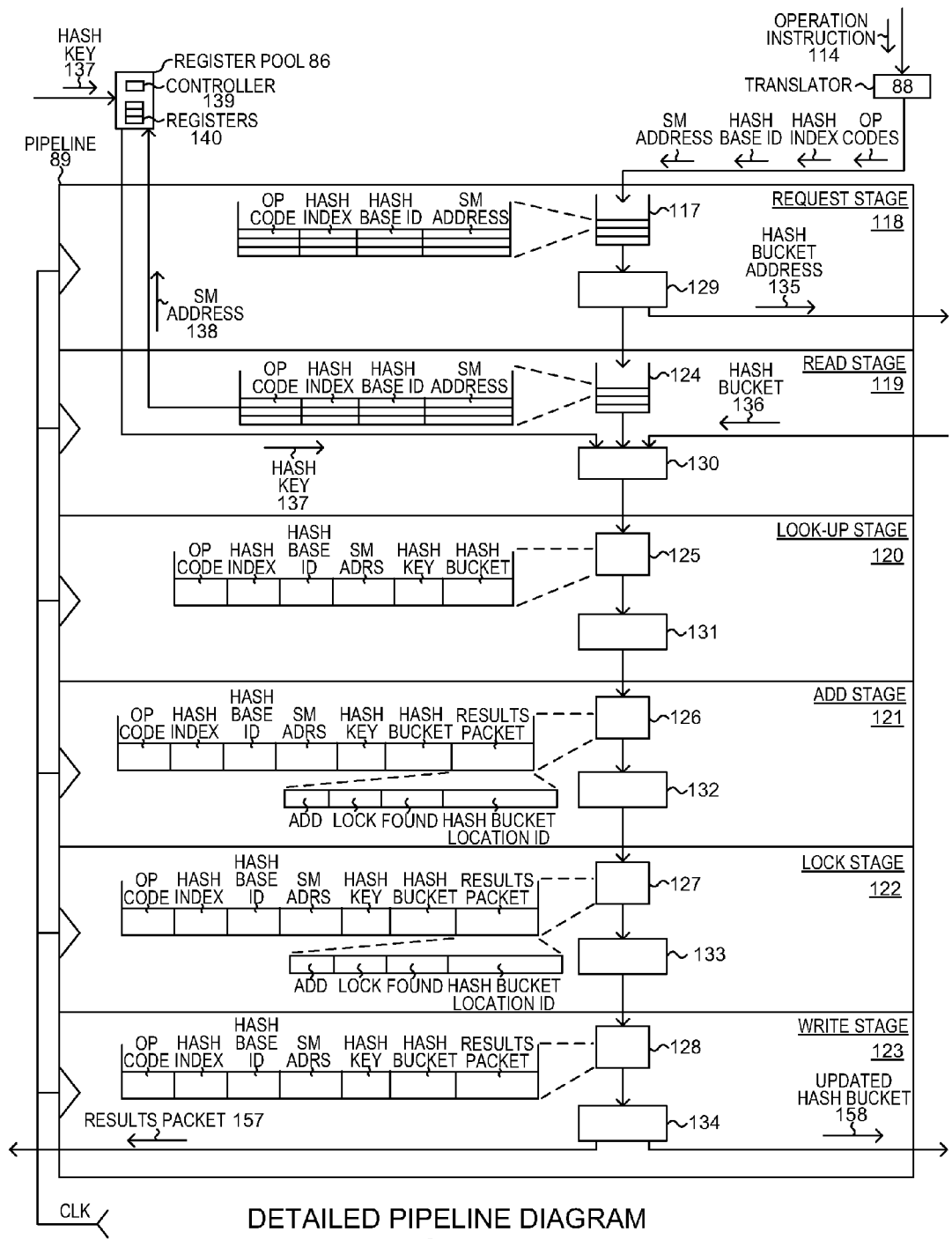
FIG. 18 is a more detailed diagram of the pipeline showing the contents of each FIFO and register within the atomic engine of the MU half island and block.

FIG. 18 is a more detailed diagram that shows the contents of the FIFOs and registers of the various stages of the pipeline. The hash key 137 and the hash bucket 136 pass through ALU and are loaded into register of lookup stage 120.

Figure 19:
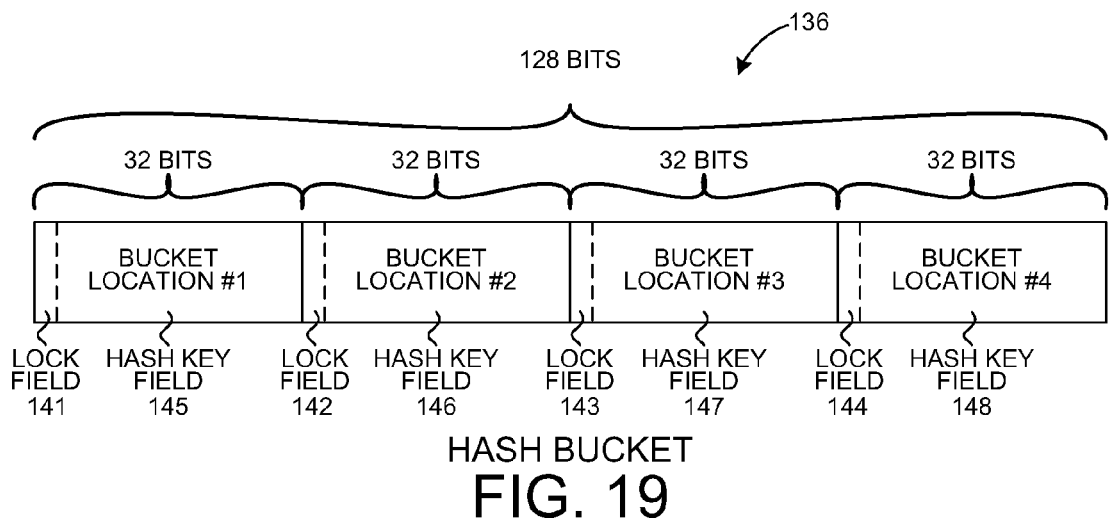
FIG. 19 is a diagram illustrating the contents of a hash bucket.

FIG. 19 is a more detailed diagram of hash bucket 136. Hash bucket 136 includes four 32-bit fields. Each 32-bit field includes a hash bucket location and an associated lock field. In one example, the hash bucket location is 31 bits and the associated lock field if 1 bit. The lock fields are indicated with reference numerals 141-144. The hash bucket locations are indicated with reference numerals 145-148. Each hash bucket has the identical structure. A hash bucket location may be occupied in that it stores a hash key, or may be vacant in that it does not store a hash key.

Figure 20:
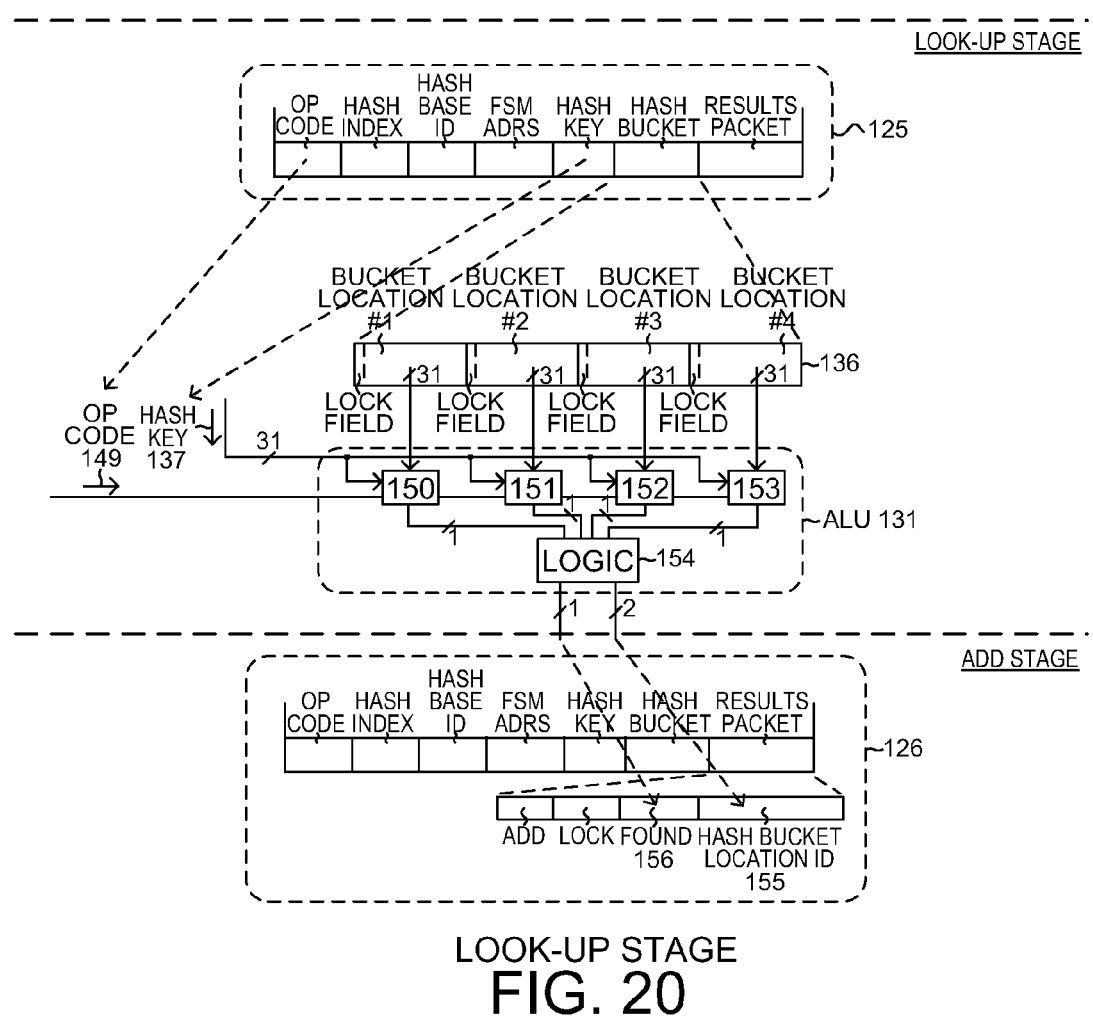
FIG. 20 is a more detailed diagram of the Look-Up stage within the pipeline of the atomic engine of the MU half island and block.

FIG. 20 is a diagram that illustrates operation of the lookup stage 120 of the pipeline. The OP CODES 115 shown in FIG. 11 include an OP CODE for each of the stages of the pipeline. The OP CODE 149 for the lookup stage is supplied to the ALU 131 to determine the combinatorial logic function performed by the ALU. In the present example, ALU 131 includes four comparators 150-153. Each comparator compares the contents of a corresponding hash key field of the hash bucket 136 with the hash key 137. As indicated in FIG. 20, the hash bucket 136, the OP CODE 149, and the hash key 137 are supplied to the ALU 131 by the register 125. Each one of the comparators 150-153 outputs a single digital bit value indicating whether the corresponding hash bucket entry matched the hash key 137. The resulting four digital bit values as output by the comparators are encoded by logic 154 into a two-bit hash bucket location ID value 155 and a one bit found value 156. The hash bucket location ID value 155 and the found bit value 156 are loaded into bit locations in the register 126 of the next stage of the pipeline. If the found bit 156 is set then an entry in a hash bucket location matched the hash key 137, whereas if the found bit 156 is not set then no hash bucket location matched the hash key 137. If there was a match, then the two-bit hash bucket location ID is a number that identifies one of the four hash bucket locations that had the matching entry. The information stored in the FIFOs and registers of the various stages is indicated in FIG. 18. Depending on the OP CODES, the various stages perform various operations and fill in information in a results packet 157. An example of the contents included in the results packet is illustrated in FIG. 21. FIG. 14 shows the lookup operation occurring at time T6.

In this example, the data structure associated with the source address of ethernet packet 106 was not found. As a result, the add stage 121 of the pipeline adds the missing hash key into a vacant hash bucket location within the hash bucket. Once the missing hash key has been added, the lock stage of the pipeline sets the lock field of the added hash bucket location, thereby locking the associated data structure. Next, the write stage 123 of the pipeline supplies the results packet 157 via data bus interface 75 across the CPP data bus to the initiating microengine 160 on the ME island 40. In addition, the write stage 123 of the pipeline generates and communicates a write command including the updated hash bucket 158 (that contains the added hash key 137) to memory controller 97 via FIFO 91. Memory controller 97 writes the updated hash bucket 158 into hash bucket HB1 of the hash table 99. FIG. 14 shows the supplying of the results packet 157 to the ME island 40 and the updating of the hash bucket HB1 to be occurring at time T7.

At this point in the process, the data structure DS4 for the source address of the received packet 106 has been locked and microengine 160 has received the results packet 157. From the hash bucket location ID value of the results packet 157, the microengine 160 determines the location of the data structure DS4. Microengine 160 then performs a write across the CPP data bus 159, through the bulk engine 70, and to the timestamp field 105 of data structure DS4. FIG. 14 shows this writing of the timestamp to be occurring at time T9 and communication of a successful write operation at time T10. Microengine 160 can read from, and write to, data structure DS4 as it wishes multiple times. In FIG. 14, such reads and writes are indicated to be occurring at times T11-T12. Once microengine 160 no longer needs access to DS4, then microengine 160 unlocks DS4 by issuing an atomic command to the atomic engine 71. The atomic command causes the pipeline to clear the lock field of the hash bucket location associated with DS4. FIG. 14 shows this clearing of the lock field occurring at time T15. After the clearing, the pipeline returns a results packet to the initiating microengine 160 indicating that the associated hash bucket location is unlocked. In FIG. 14, this returning of the results packet indicating that the hash bucket location is unlocked is indicated to occur at time T16.

The ALAL command provides protection against memory contention. This is illustrated in FIG. 14 where a second microengine ME#2 attempts to access the same data structure DS4 while the data structure DS4 is locked by microengine 160. In this example, the other microengine receives the same ethernet packet 106 at time T1, but when it issues its atomic ALAL command at time T3, the data structure DS4 has already been locked. The results packet for the atomic command from the other microengine indicates that the data structure DS4 is locked. In FIG. 14, this is indicated to occur at time T8. The second microengine is barred from access to DS4 and waits until time T13 to attempt another atomic ALAL command to access the same data structure. At time T13, the data structure is still locked, so at time T14 the returning results packet indicates that the data structure DS4 is still locked. At time T17 the other microengine issues its third atomic command to access DS4. This time, DS4 is unlocked due to the unlock command sent by microengine 160 at time T15. As a result of the atomic command, at times T18-21 the transactional memory locks DS4 and returns a results packet at time T22 indicating that DS4 is now locked for use by the other microengine. The operations performed at times T18-21 correspond to the operations performed at times T3-6. The other microengine can then read and write to the data structure (as indicated to occur at times T23-26). When the other microengine now longer needs access to DS4, the other microengine sends an atomic command to unlock DS4 at time T27.

Figure 22A:
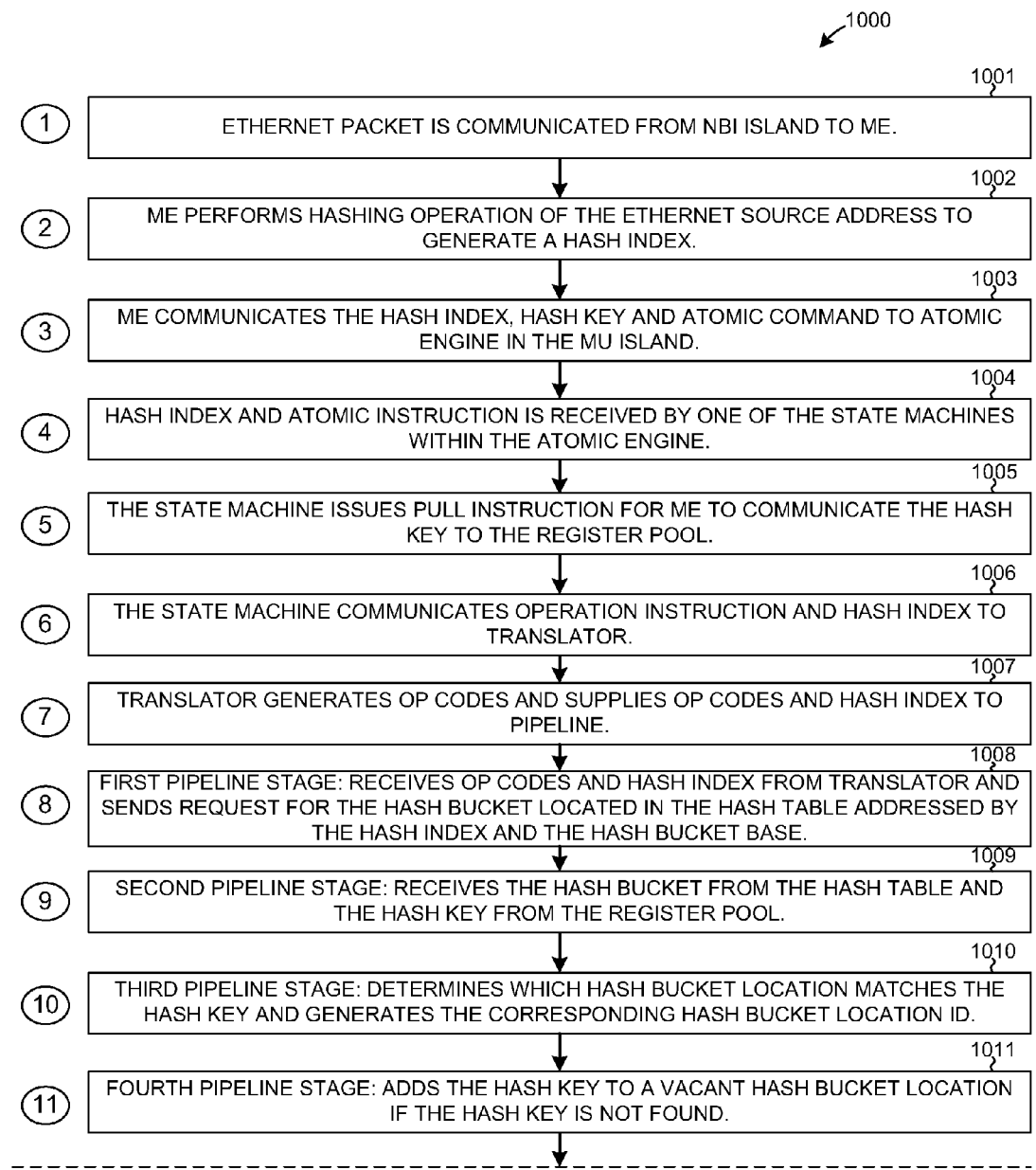
FIGS. 22A and 22B are a flowchart of describing the operation of a transactional memory in response to an Atomic Look-up, Add, and Lock command.
Figure 22B:
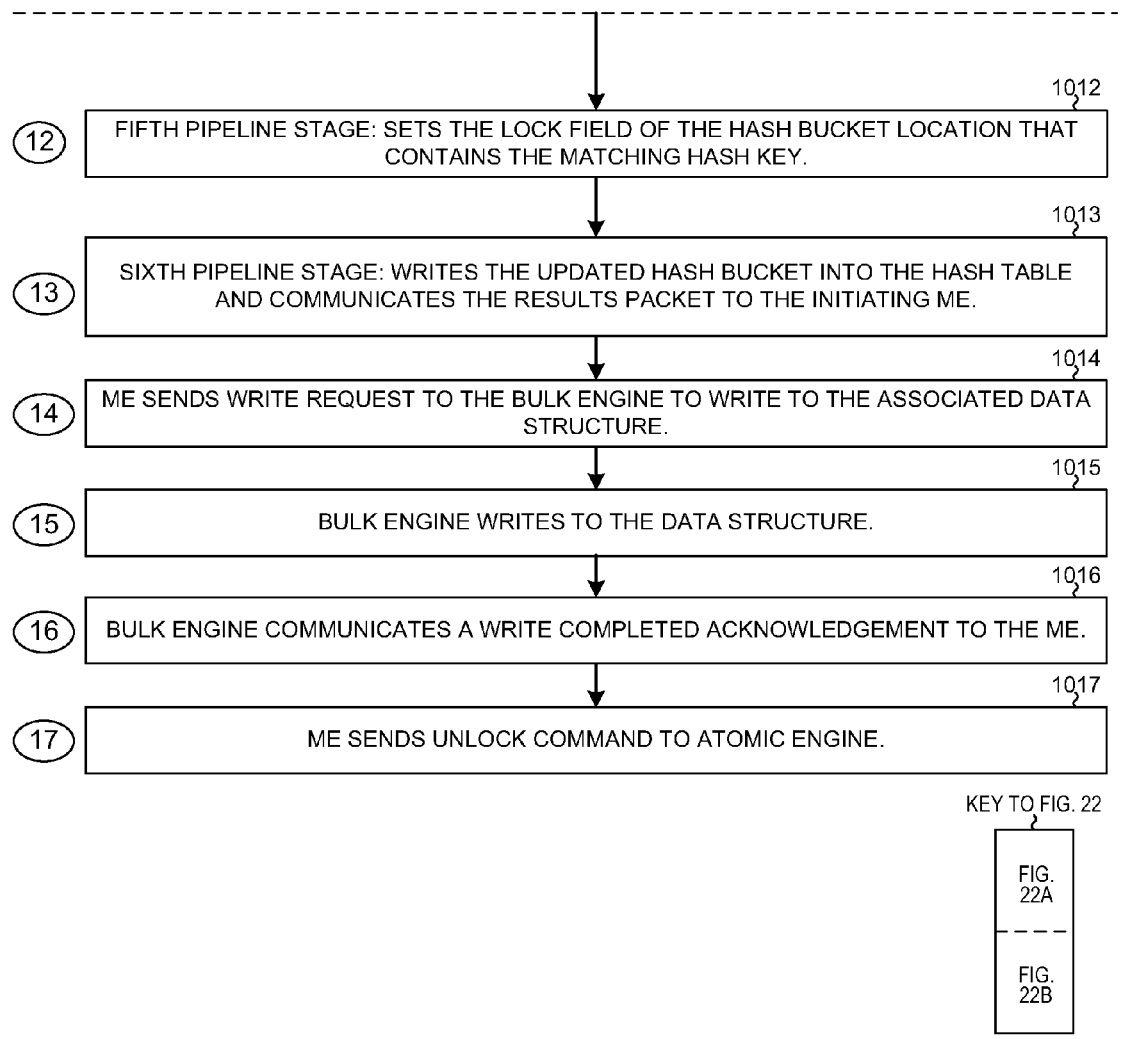

FIG. 22 is a flowchart of a method 1000 in accordance with one novel aspect. The steps 1001-1017 of method 1000 are steps in the example described above.

Figure 23:
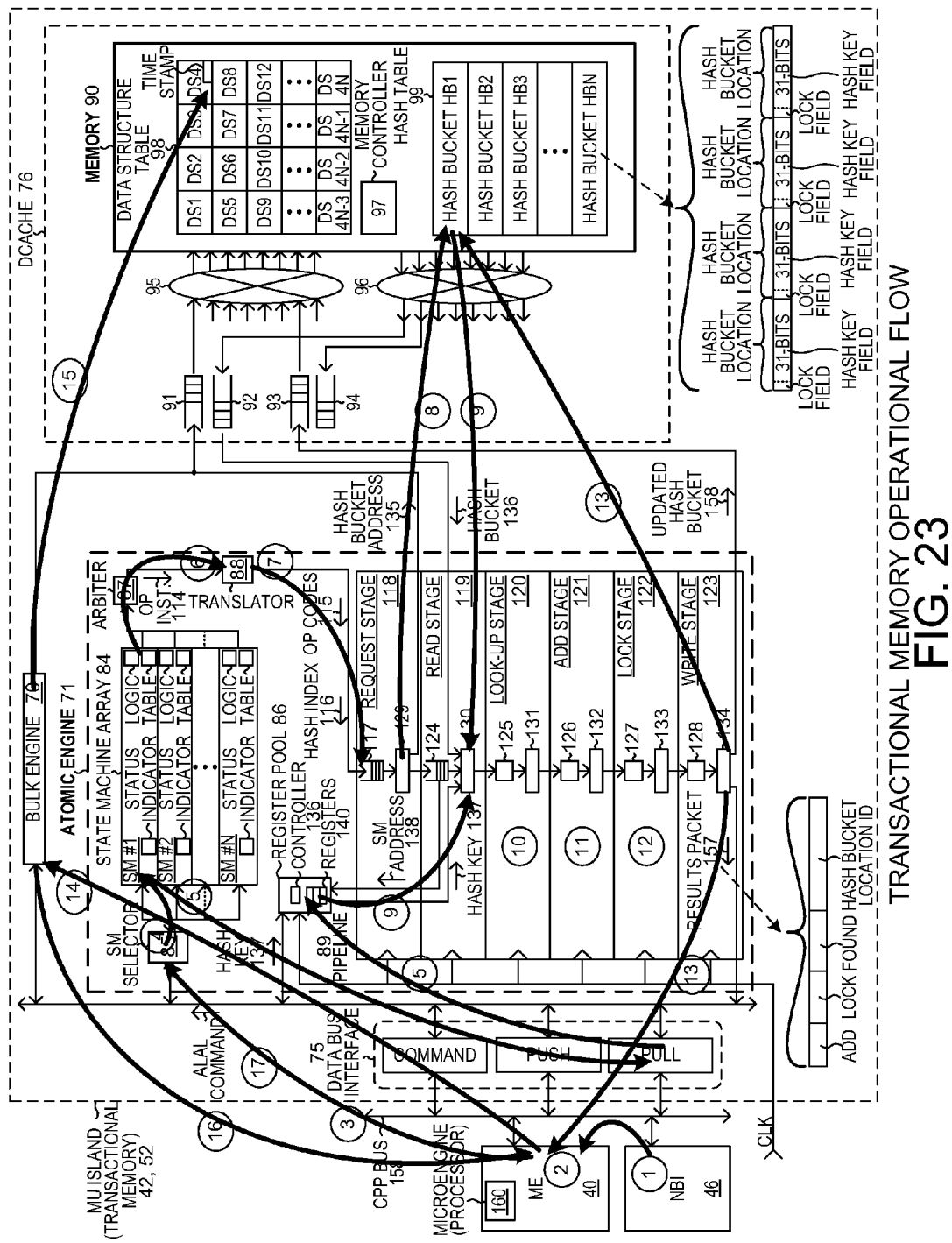
FIG. 23 is a diagram showing action arrows that correspond to each step described in the flowchart of FIGS. 22A and 22B.

FIG. 23 is a diagram of ME island 40 and MU island (Transactional Memory) 42,52. In FIG. 23, an arrow labeled with a number in a circle corresponds to the step in of FIG. 22 that is labeled with the same circled number.

Figure 24:
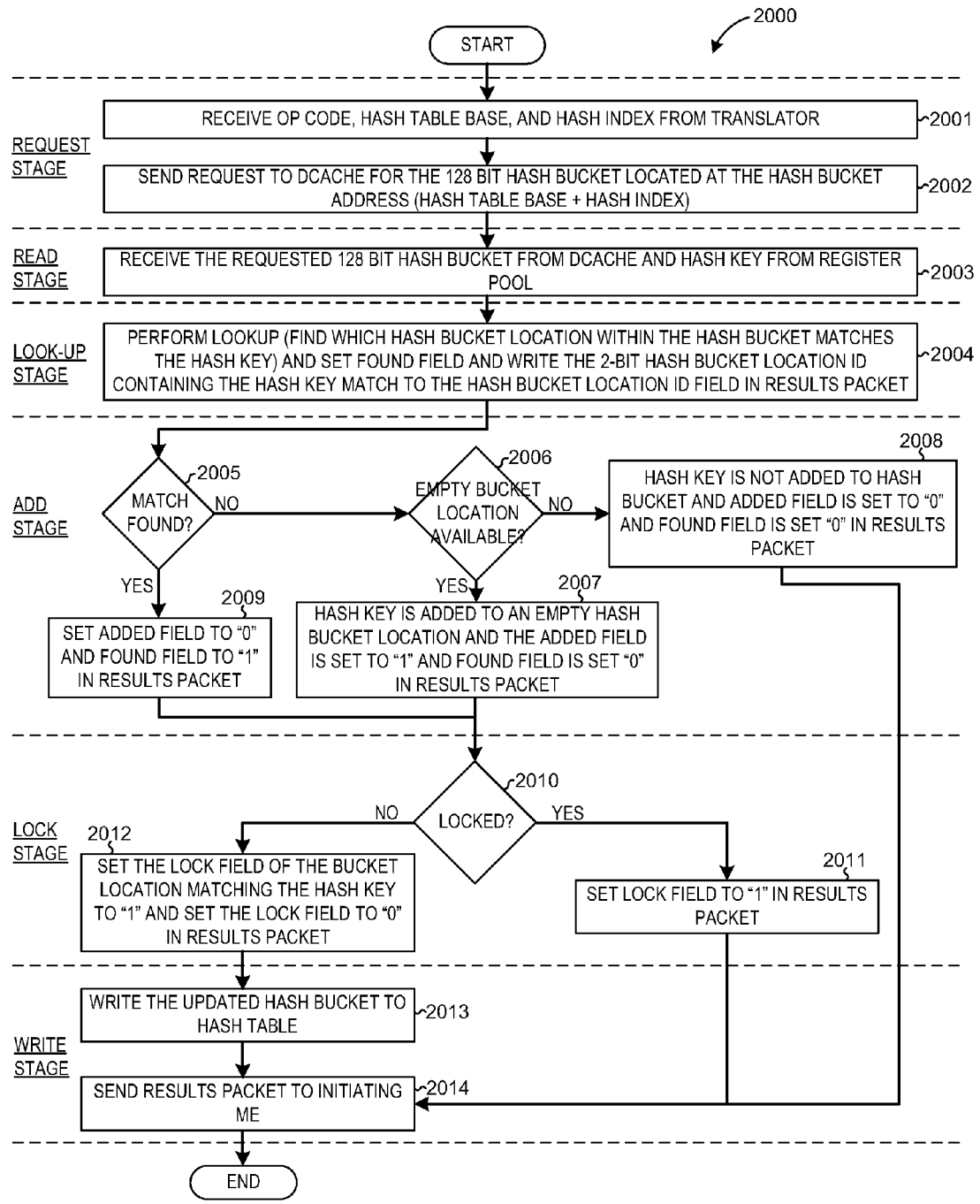
FIG. 24 is a detailed operational flowchart of the pipeline within the atomic engine of the MU half island and block 42,52 of the IB-NFP integrated circuit of FIG. 1.

FIG. 24 is a simplified logic flowchart that illustrates functions pipeline 89 can perform. Steps 2001-2004 correspond to steps 1008-1010 of the flowchart of FIG. 22. In the example described above in connection with FIG. 14, the scenario involved the hash key not being found and as a result the missing hash key was added to the hash bucket location. These operations are shown in FIG. 24 in blocks 2005-2007. If the hash key is not found, and there are no vacant hash bucket locations within the hash bucket location, then (step 2008) the results packet sent to the microengine indicates that the hash key was not found and that the hash key was not added to the hash bucket. In other scenarios, the hash key is found in the hash table. This corresponds to match found decision diamond 2005 being true and processor flow proceeding to block 2009. When the hash key is found in the hash table, there are two possibilities: the hash bucket location is locked or the hash bucket location is unlocked. The situation of the hash bucket location being locked corresponds to decision diamond 2010 being true and process flow proceeding to block 2011. The lock field in the results packet is set and the results packet is sent (step 2014) to the initiating microengine to inform the initiating microengine that the associated data structure is locked by another microengine. The situation of the hash bucket location being unlocked corresponds to locked decision diamond 2010 being false and process flow proceeding to block 2012. The lock field in the results packet is cleared to "0" indicating to the initiating microengine that the associated data structure is not locked. The updated hash bucket is written into the hash table (step 2013), and the results packet is sent to the initiating microengine (step 2014) indicating to the initiating microengine that the hash key was found and that the associated data structure is not locked by another microengine.

Figure 25:
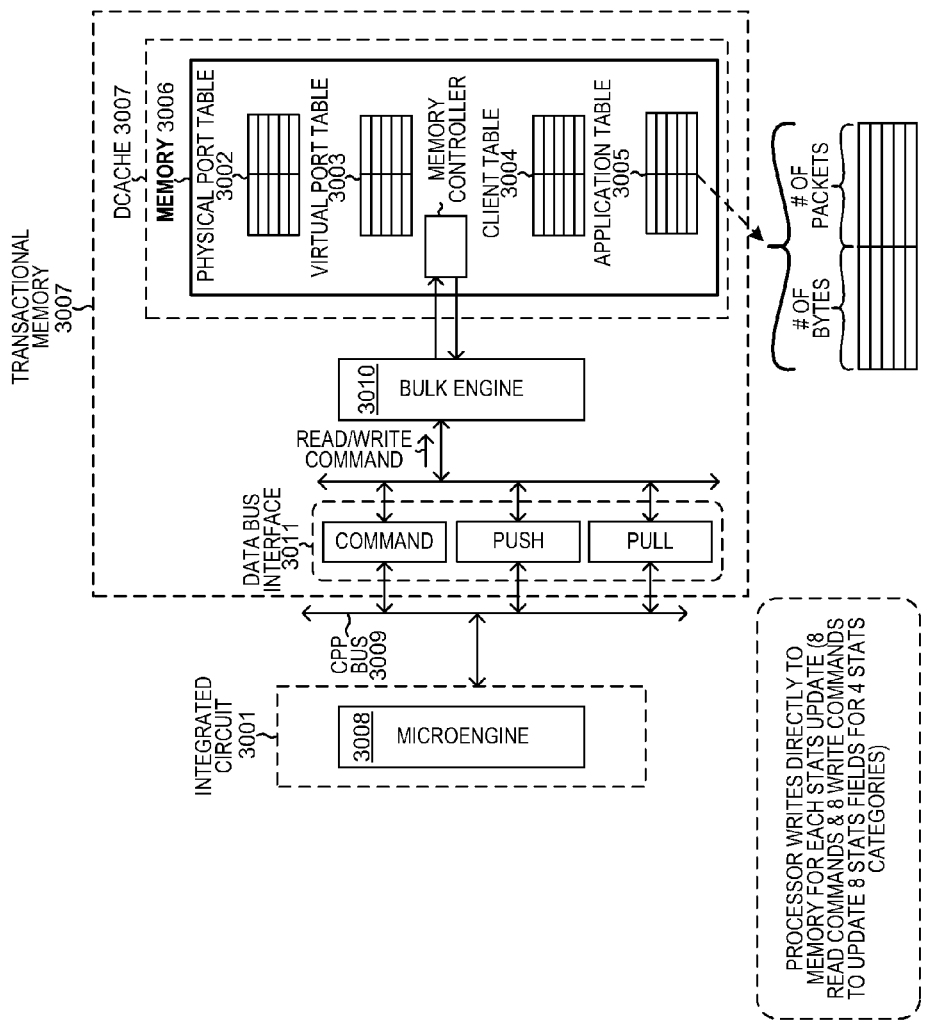
FIG. 25 (Prior Art) is a diagram of a transactional memory performing a count update.

FIG. 25 (Prior Art) is a diagram of a prior art transactional memory 3000 in a network processor integrated circuit 3001 sold by Netronome Systems, Inc., 5201 Great America Parkway, Santa Clara, Calif., 95054. The integrated circuit 3001 is part of a network device that that is on local area network with multiple users. Multiple tables 3002-3005 were stored in memory 3006 of a Dcache 3007. A microengine 3008 received ethernet packets from the local area network. Each received ethernet packet was received onto the network device and in turn onto the integrated circuit 3001 via a physical port and a virtual port. Table 3002 includes a packet count and byte count row for each physical port. Table 3003 includes a packet count and byte count row for virtual port. The packet may have been received from one of the users on the network. Table 3004 includes a packet count and byte count row for each such user. A received packet may also be associated with an application program executing on the user terminal. Table 3005 includes a packet count and byte count row for each such application program. In one example, the application program may be a web browser such as internet explorer.

In one operation, a packet is received onto the integrated circuit 3001. The packet count and byte count values maintained in the tables 3002-3005 in memory 3006 are updated. A microengine that receives the incoming ethernet packet updates the counts in the tables 3002-3005 by issuing read and write commands to bulk engine 3010 across CPP bus 3009 and data bus interface 3011. The bulk engine 3010 actually handles the read and writes from memory 3006. Typically for each incoming packet there were sixteen bulk read and write commands performed: two to update the packet count for physical port, two to update the byte count for physical port, two to update the packet count for virtual port, two to update the byte count for virtual port, two to update the packet count for user ID, two to update the byte count for user ID, two to update the packet count for application type, and two to update the byte count for application type. Each update operation involved reading a count value from memory 3006, adding a number to that count, and then writing the updated count value back into memory 3006 to the same memory location. In the case of a packet count, the packet count is incremented by one. In the case of a byte count, the number of bytes of the incoming ethernet packet is added to the prior byte count.

Figure 26:
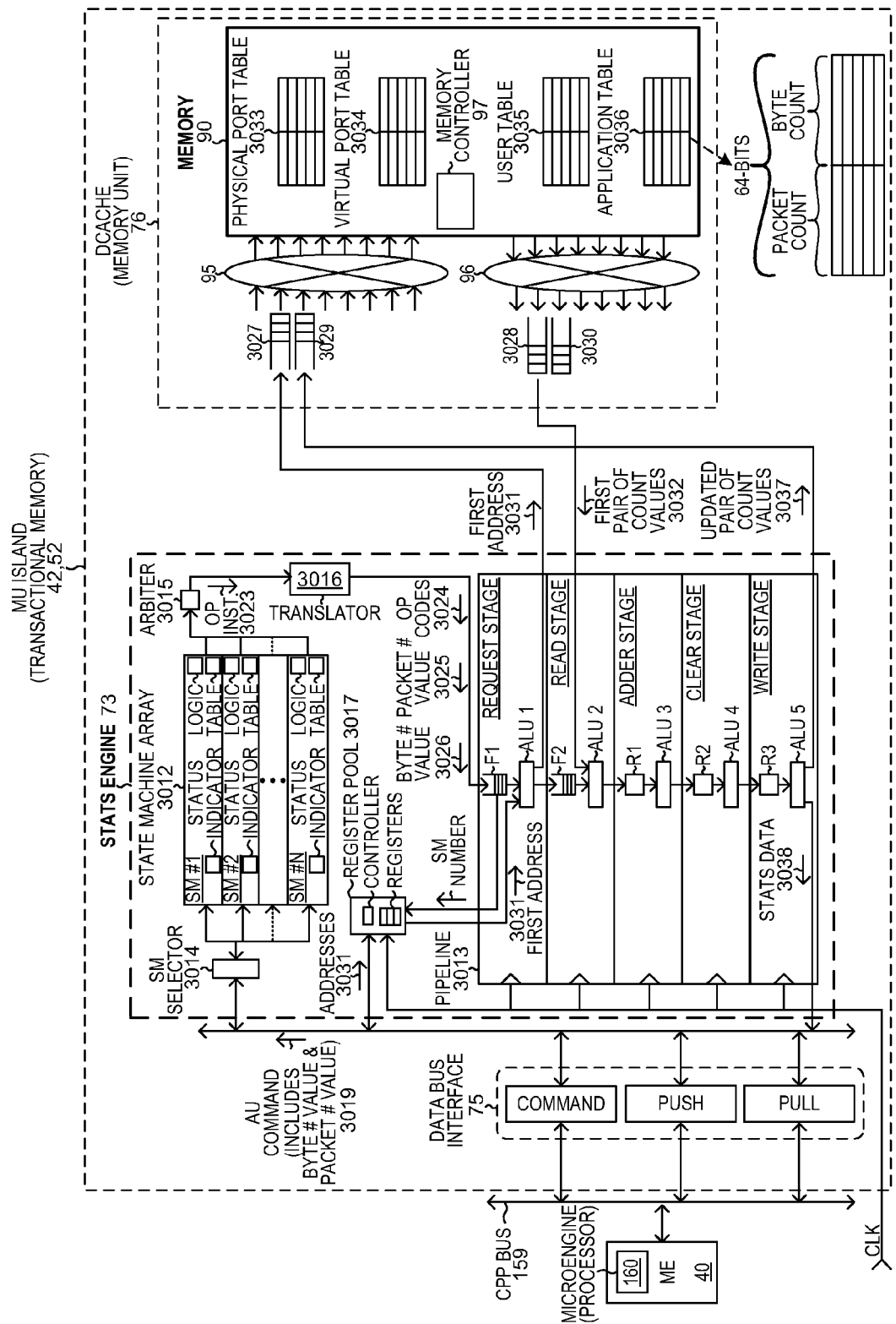
FIG. 26 is a detailed diagram of the stats engine within the MU half island and block 42,52 of the IB-NFP integrated circuit of FIG. 1.

FIG. 26 is a diagram of MU island ("Transactional Memory") 42, 52 showing the stats hardware engine 73 in further detail. Like the atomic hardware engine 71 described above, the stats hardware engine 73 is tightly coupled to memory 90 within Dcache ("memory unit") 76. The atomic hardware engine 71 interfaces to Dcache 76 using certain input and output FIFOs, whereas the stats hardware engine 73 interfaces to Dcache 76 using certain other input and output FIFOs. Like the atomic hardware engine 71 described above, the stats hardware engine 73 includes a state machine array 3012, a pipeline 3013, a state machine selector 3014, an arbiter 3015, a translator 3016, and a register pool 3017. The state machines SM#1 to SM#N share use of the pipeline. In the example shown in FIG. 26 all state machines SM#1 to SM#N share the single pipeline 3012. In another example, state machines SM#1 to SM#N share multiple pipelines. Any one of the state machines can execute an Add and Update command (AU Command) to update eight count values. For each count value, the state machine and pipeline 3013 operate together to cause a count value to be read from memory 90, to cause a value to be added to the count value thereby generating an updated count value, and to cause the updated count value to be written back into the memory location in memory 90. The memory controller 3018 actually performs the memory reads and writes at the direction of the pipeline 3013. The MU island ("transactional memory") 42, 52 does not include any processor that fetches instructions from a memory, decodes the instructions, and executes the instructions. In one example, microengine 160 receives an ethernet packet. The ethernet packet has an associated physical port, virtual port, user ID and application type. The packet is a number of bytes in length. Microengine 160 may receive multiple such ethernet packets so that a packet number value greater than one is to be added to the packet counts stored in memory 90, or microengine 160 may elect to perform the updating of the count values in memory 90 for just one ethernet packet. Regardless of the packet number value and the byte number value to be added to the count values in memory 90, the microengine 160 issues one Add and Update command ("AU Command") 3019 across the CPP command mesh of CPP bus 159. The AU command 3019 is of the format shown in FIG. 4. The AU command does not include any addresses of memory locations within the Dcache 76. The ACTION field indicates that the command is an AU command. The DATA_REF field gives a pull-id identifier for the AU command. The AU command 3019 includes the packet number value and the byte number value. A starting address value and a number of addresses to follow value is also included in the AU command. The starting address value points to a memory location within microengine 160. The number of addresses to follow value indicates how many addresses sequentially stored in the microengine memory (starting at the starting address value) are to be pulled onto the transactional memory 42, 52. The state machine selector 3014 monitors the status indicator of each state machine, and routes the AU command to an idle state machine.

Figure 27:
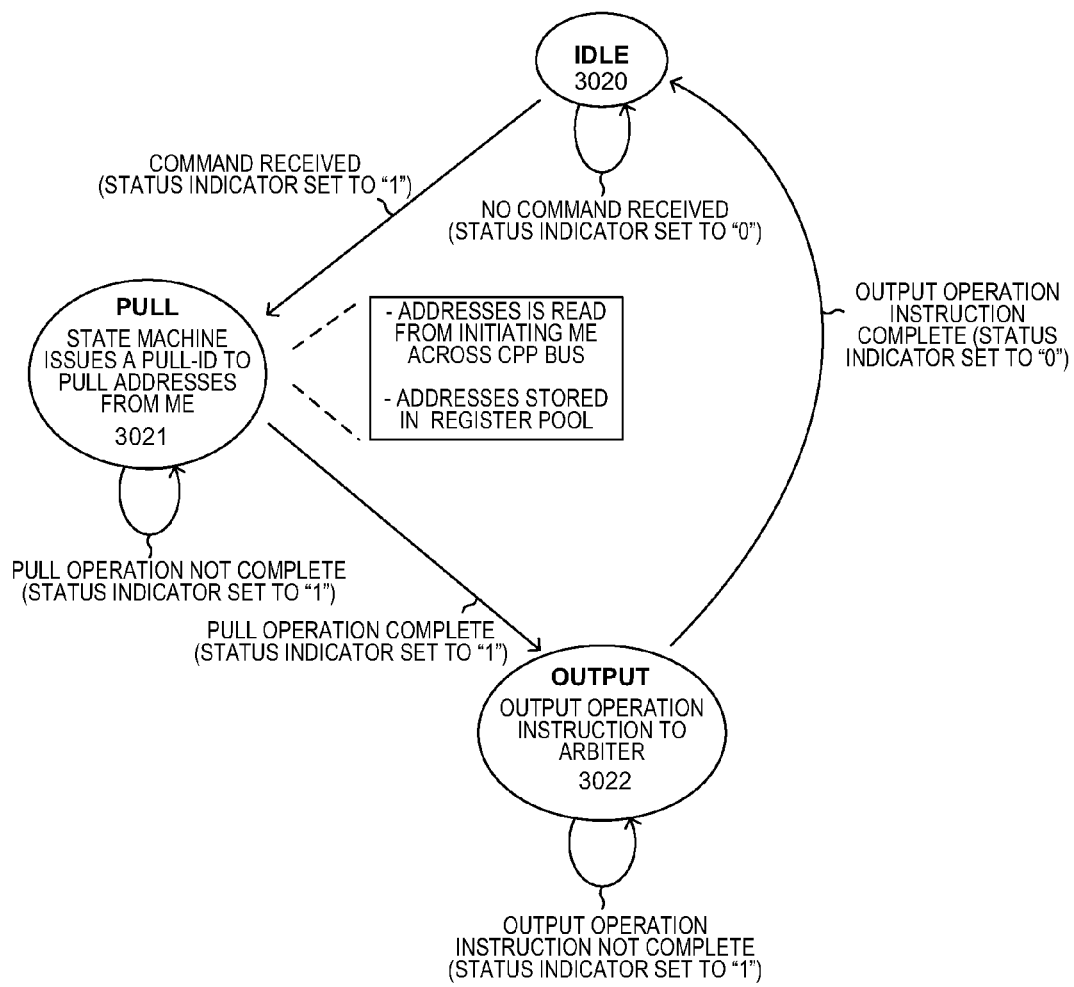
FIG. 27 is a state diagram of one of the state machines within the stats engine of FIG. 26.

FIG. 27 is a state diagram for a state machine of the stats hardware engine 73. The state machine transitions from the idle state 3020 to the pull state 3021 when an AU command sent by microengine 160 is received by the stats machine. The state machine causes a pull-id bus transaction to be sent back to the microengine 160 via data bus interface 75 and CPP bus 159. The format of the pull-id bus transaction is shown in FIG. 5. The DATA_REF field contains the pull-id identifier that the microengine 160 provided in the original AU command. The TARGET_REF field contains an identifier supplied by the state machine target. This target_ref is usable by the target to identify later received data payloads with the pull-id. The starting address value and number of addresses to follow value are also included in the pull-id bus transaction. The pull-id bus transaction is received by microengine 160 across the pull-id mesh. From the DATA_REF field of the pull-id bus transaction, the microengine 160 determines that the pull-id is associated with the original AU command and that the microengine 160 should return to the target a set of addresses. The addresses identify memory locations in memory 90 where the count values to be updated are stored. Microengine 160 therefore responds by sending one or more data bus transactions across the data0 or data1 mesh to register pool 3017. Register pool 3017 includes a controller and a plurality of registers. In one example, each register of the register pool is associated with an individual state machine of the state machine array 3012. The format of the data bus transactions is set forth in FIG. 6. The microengine 160 includes the TARGET_REF identifier from the pull-id so that the receiving state machine can associate the incoming data bus transactions with the pull-id. There may be one or more such data bus transactions. The LAST bit of a data bus transaction indicates whether there are more data bus transactions to follow, or whether the data bus transaction is the last data bus transaction for the pull-id. The DATA fields of these data bus transactions include the addresses where the count values are stored.

Once all the pull data has been received and is stored in the appropriate register in register pool 3017, then the state machine operation transitions from PULL state 3021 to OUTPUT state 3022. The state machine outputs an operation instruction 3023 to arbiter 3015. Once the output operation is complete, state machine operation transitions from OUTPUT state 3022 to IDLE state 3020. The arbiter 3015 arbitrates information flow to translator 3016. Translator 3016 receives the operation instruction 3023 and from the operation instruction outputs OP CODES 3024, PACKET # VALUE 3025, and BYTE # VALUE 3026. The PACKET # VALUE 3025 and the BYTE # VALUE 3026 are the numbers to be added to the count values stored in memory 90 once the count values have been read out of memory 90.

The request stage of the pipeline supplies the state machine number to the register pool. The register pool uses the state machine number to return to the pipeline the first address 3031 stored in the register pool for that state machine number. The request stage uses this address to issue a read request to memory controller 3018 via FIFOs 3027-3030 and crossbar switches 95 and 96. The memory controller 3018 handles reading the first pair of count values 3032 from the memory location indicated by the first address 3031 pulled out of the register pool. The read stage of the pipeline receives the first pair of count values 3032. In the present example, the first pair of count values 3032 is a packet count and byte count read from physical port table 3033. In the example of FIG. 26 each row of the physical port tables 3033 is a memory location that stores two values, a packet count value and a byte count value. In other examples, the memory location may store other values such as number of users per server or connections per user. An ALU in the adder stage adds the PACKET # VALUE 3025 and BYTE # VALUE to the first pair of count values 3032, thereby generating an updated pair of count values 3037. The write stage of the pipeline causes the updated pair of count values 3037 to be written back into the memory location in physical port table 3033. The pipeline causes the update to be performed by issuing a write request to memory controller 3018. This completes the updating of one pair of count values. There are, however, four updates to be performed (updating the pair of count values for the physical port, virtual port, user id, and application type). In the next clock cycle after the request stage received the first address 3031 from the register pool, the request stage receives the next address from the register pool, and in the next clock cycle the request stage receives the next address, and so forth. During a given clock cycle, each stage of the pipeline is processing an update to a different pair of count values. Packet count values can be either incremented by one or can be increased by a number greater than one depending on the PACKET # VALUE 3025 received in the AU command from the microengine 160. Byte count values are increased by the BYTE # VALUE 3026 received in the AU command from the microengine 160. There is only one AU command issued across the command mesh of the CPP data bus 159 despite the fact that eight count updates are performed.

In addition to executing the Add and Update command, the stats hardware engine 73 can also execute a stats "Read and Clear" (RC) command. The stats read and clear command is similar to the stats AU command described above in that one command is sent across the command mesh of the CPP bus but multiple memory operations result. Rather than writing back a count value into each memory location, the stats read and clear command results in writing a zero value into each indicated memory location. The write stage returns STATS DATA 3038 that is sent via data bus interface 75 and CPP data bus 159 to the microengine 160. The STATS DATA 3038 is the set of count values for all the memory locations that were cleared. In one embodiment the clear function is performed by the adder stage. In another embodiment, the clear function is performed by a separate stage within the pipeline.

Figure 28:
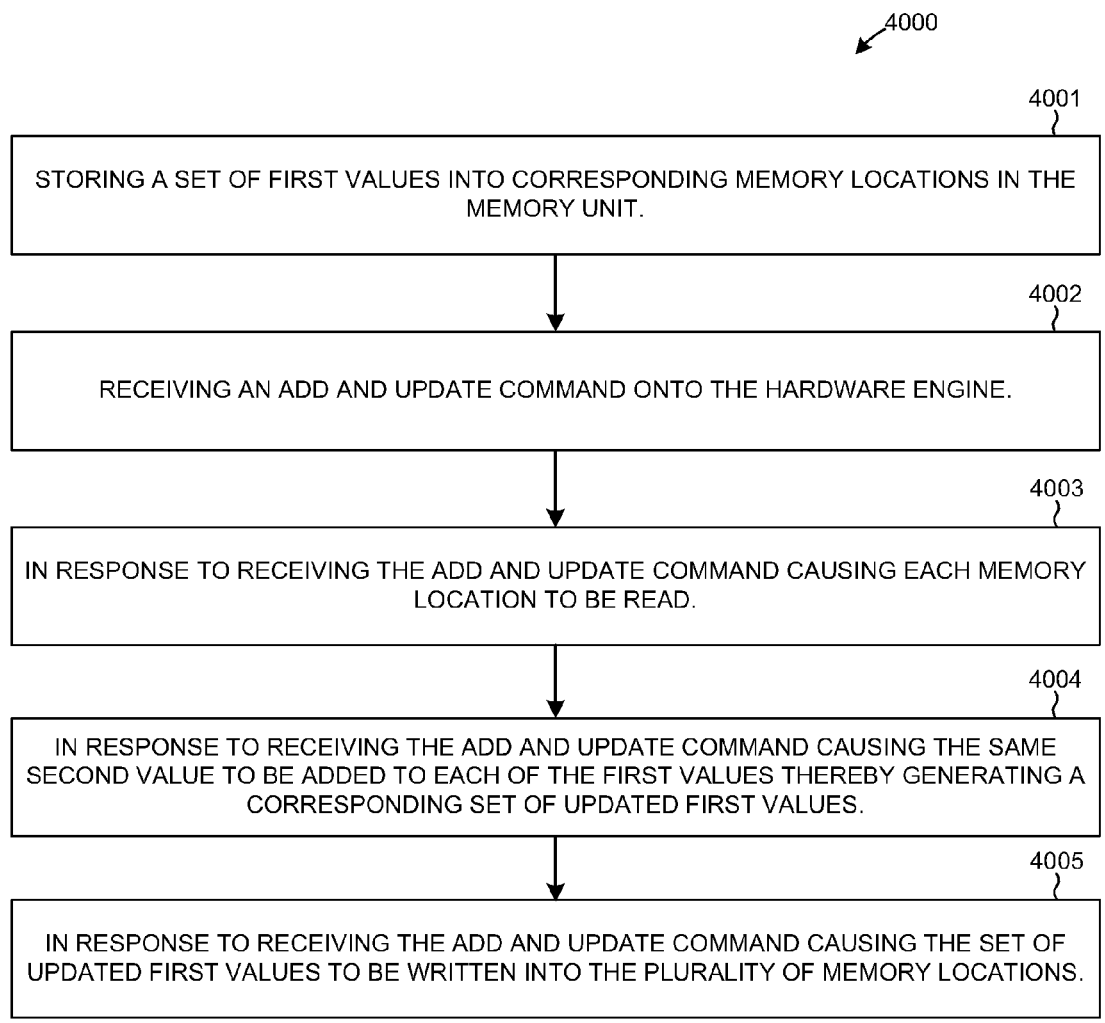
FIG. 28 is flowchart illustrating the operation of the pipeline within the stats engine in response to receiving an Add and Update command.

FIG. 28 is a flowchart 4000 illustrating the operation of stats engine 73. A set of first values are stored (Step 4001) into corresponding memory locations in the memory unit. An Add and Update command (AU command) is received onto the hardware engine (Step 4002). In response to receiving the AU command, each memory location is read from memory (step 4003). A same second value is then added to each of the first values (Step 4004) thereby generating a corresponding set of updated first values. The set of updated first values are written into the corresponding memory locations (Step 4005).

In one example, the pipeline within the stats engine is the only circuitry that can read or write to the memory locations in memory 90. In another example, the pipeline within the stats engine is the only circuitry that does read or write to the memory locations. In either example, the memory locations in memory 90 shown in FIG. 26 do not require a locking mechanism because the single pipeline is the only circuitry that will read data from or write data to the memory locations during operation.

Op codes 3024 is supplied to each ALU in each state of the pipeline. Op codes 3024 includes one operation code (op code) for each stage of the pipeline. Each operation code includes a plurality of bits. The particular combination of these bits indicate one of several different operation commands. The operation performed in each stage of the pipeline can be varied by changing the op code assigned to a given pipeline stage. For example, the operation of the third stage of the pipeline 3013 can be changed from adding values to subtracting values by changing the operation code assigned to the third stage of the pipeline. This allows flexible programming of each stage of the stats engine 73.

FIGS. 29-38 set forth a recursive lookup operation involving a hardware trie structure 5000 that has no sequential logic elements. In the method 5001 of FIG. 29, a router 5014 receives an IP packet 5015 (step 5002) on an input port of the router. The input port is one of many virtual ports of a physical input port 5016. Router 5014 includes a plurality of line cards 5017-5019 and a management card 5020 that fit into a attach to a backplane 5021. The line cards are identical. Line card 5017 includes optics transceivers 5022 and 5023, PHYs 5024 and 5025, an instance of the Island-Based Network Flow Processor (IB-NFP) integrated circuit 1 of FIG. 1, configuration PROM 8, and DRAM integrated circuits 2-7. The IP packet 5015 is communicated through optical fiber 5026, through optics transceiver 5022, through PHY 5024, and to IB-NFP 1. The IB-NFP 1 in this router looks at the IP destination address of the packet and identifies one of several output ports to which the IP packet is to be routed. The IB-NFP then forwards the IP packet so that the IP packet will be output from the router via the determined output port. In the illustrated example, the output port may be one of many virtual output ports of physical output port 5027, or may be one of the many virtual output ports of physical output port 5028, or may be one of the many virtual output ports of physical output port 5029.

Figure 31:
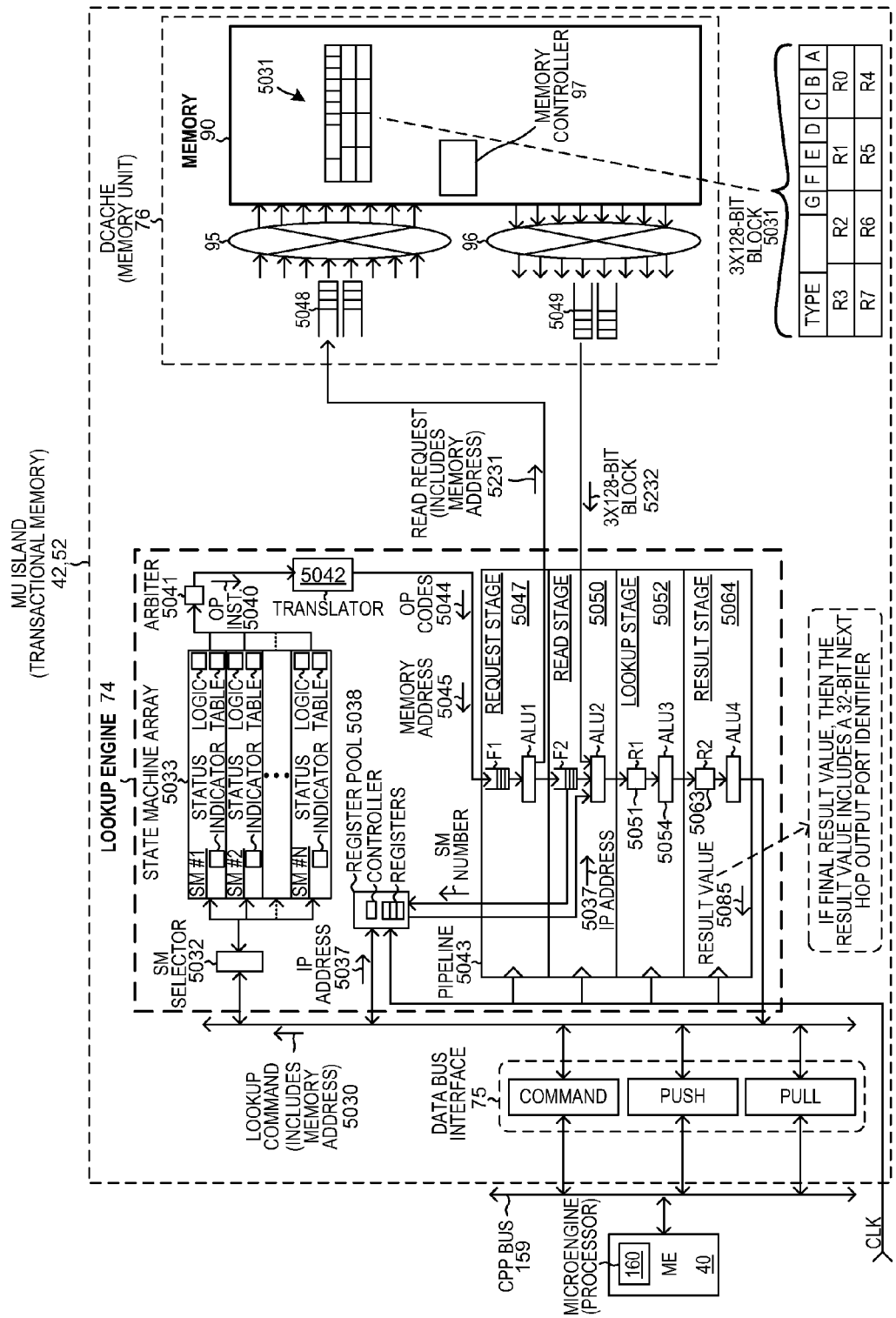
FIG. 31 is a diagram showing a lookup engine within an MU island in further detail.

FIG. 31 is a diagram that illustrates a second step (step 5003) in which a processor 160 of ME island 40 of the IB-NFP 1 sends a lookup command 5030 across the CPP data bus 159 to the transactional memory in the MU island 42, 52. Lookup engine 74 is one of several hardware engines of the MU island as indicated earlier in this patent document. The lookup engine 74 is illustrated in more detail here and illustrations of the other lookup engines are omitted. Lookup command 5030 includes address information that indicates where a 3×128-bit block 5031 of data is stored in memory 90 of the Dcache memory unit 76. The lookup command 5030 is received (step 5004) from the CPP data bus 159 onto the transactional memory via data bus interface 75. Lookup engine state machine selector 5032 examines the status indicators of the state machines SM#1-SM#N of state machine array 5033, and selects (step 5005) an idle state machine to process the incoming command.

Figure 32:
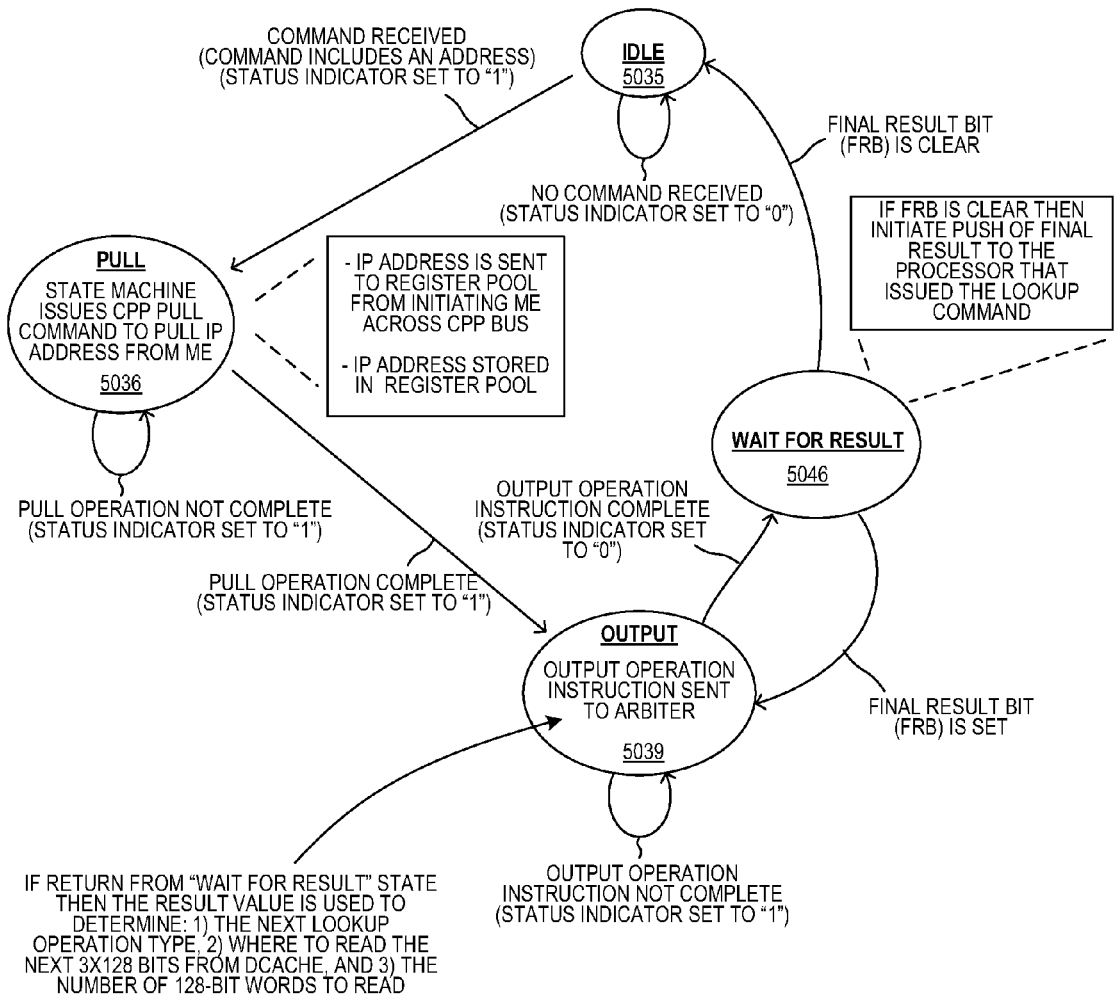
FIG. 32 is a state diagram for a state machine of the lookup engine of FIG. 31.

FIG. 32 is a state diagram for a state machine of the lookup engine 74. Initially the state machine was in the idle state 5035. The state machine selector 5032 passes the lookup command 5030 to the state machine, thereby causing the selected state machine to transition to operating in the pull state 5036. The selected state machine then initiates a pull (step 5006) across the CPP data bus to receive an input value (IV). For each IV value, there is a final result value stored. The overall function of the lookup operation is to receive one of the IV values and to lookup and result its associated final result value. In the present example, the IV value is the IP destination address 5037 of IP packet 5015. The selected state machine interacts with the pull interface of data bus interface 75 to cause the pull to occur.

In response, the IP destination address 5037 is received from the CPP bus 159 onto the transactional memory. The IP destination address 5034 is then stored in an appropriate one of the registers in register pool 5038. There is one register pool register associated with each state machine. The IP address is received (step 5007) onto the transactional memory and is stored into the register associated with the state machine that initiated the pull. As indicated by the state diagram of FIG. 32, completion of the pull causes the state machine to transition to the output state 5039. In the output state 5039, the state machine outputs an operation instruction 5040 (step 5008) to arbiter 5041. Arbiter 5041 may receive several such operation instructions from multiple ones of the state machines. Arbiter 5041 arbitrates and only supplies one of the operation instructions at a time to translator 5042. The translator translates the operation instruction 5041 into a set of op codes 5044, one for each stage of the pipeline 5043. In addition, the translator 5042 outputs the memory address 5045 to the pipeline. Once the operation instruction 5040 has been output from the state machine, the state machine transitions to the wait for result state 5046.

The request stage 5047 of pipeline 5043 issues (step 5009) a read request to the memory unit 76 to read the 3×128-bit block 5031 of data out of memory 90. The read request is pushed into input FIFO 5048. The read request passes through input FIFO 5048, and IN cross-bar switch 95, and is handled by the memory controller of memory 90. This is the same memory controller that handles read requests received from other hardware engines. The 3×128-bit block 5031 is read from memory 90, is passed through OUT crossbar switch 96, the through output FIFO 5049, and into the read stage 5050 of pipeline 5043.

The read stage 505 of the pipeline supplies the state machine number to register pool 5038. In response, the IV (IP address 5037 in this case) is sent from the register pool back to the read stage 5050. At this point in the process, pipeline 5043 has received (step 5010) both the 3×128-bit block of data and the IV (IP address in this case). These values are loaded into one long register R1 5051 of lookup stage 5052 of the pipeline.

Figure 33:
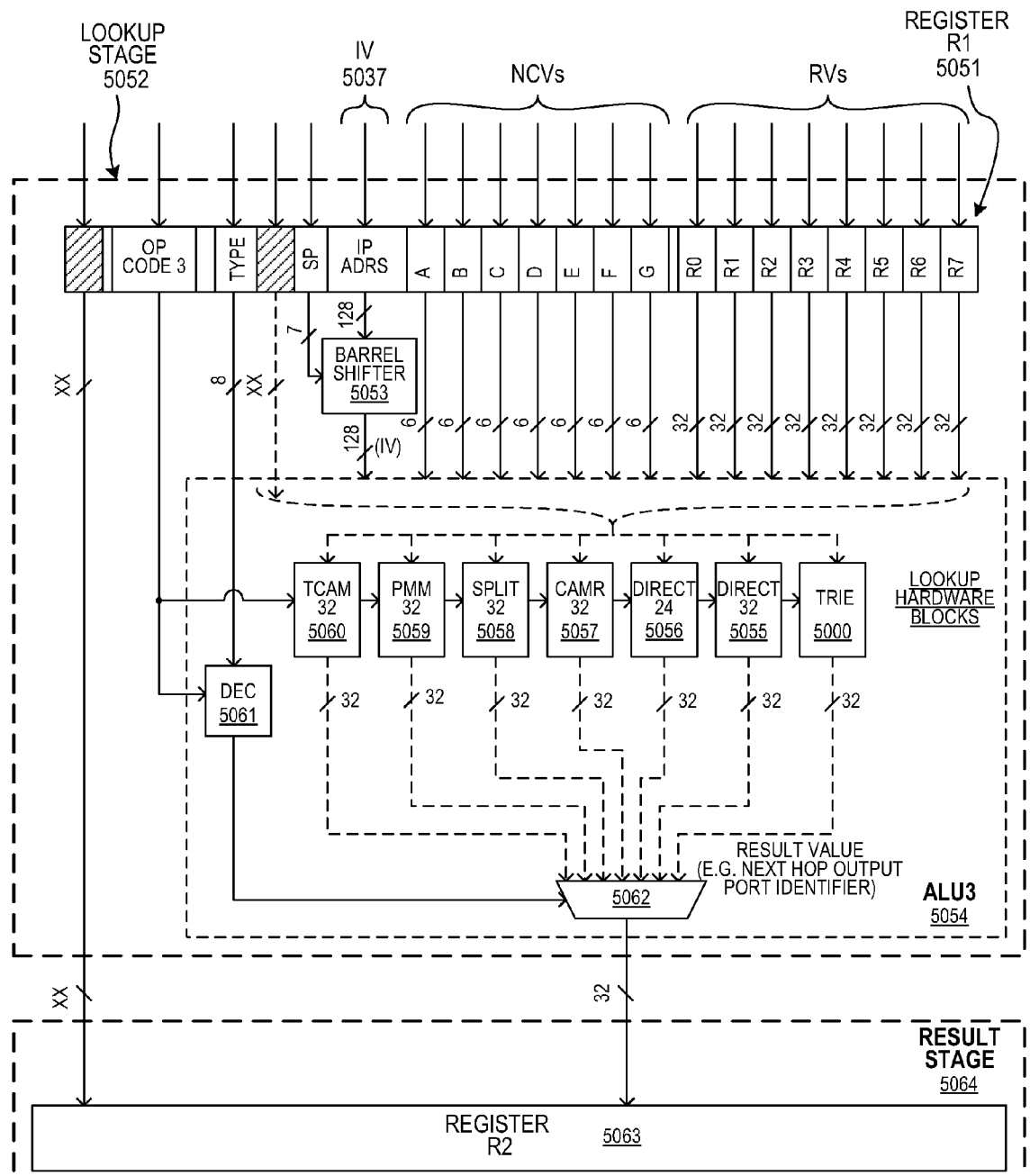
FIG. 33 is a block diagram of the lookup stage of the pipeline within the lookup engine of FIG. 31.

FIG. 33 is a more detailed diagram of lookup stage 5052. Lookup stage 5052 includes register R1 5051, a barrel shifter 5053, and ALU3 5054. ALU 3 includes a plurality of lookup hardware blocks 500 and 5055-5060, a decoder 5061, and an output multiplexing circuit 5062 interconnected as shown. Register R2 5063 in FIG. 33 is the register R2 at the front of the result stage 5064 of the pipeline. The 32-bit result from one of the lookup hardware blocks is output as the 32-bit output of ALU3 5054. Which one of the results it is that is output by multiplexing circuit 5062 is determined by OPCODE3 and TYPE.

Figure 34:
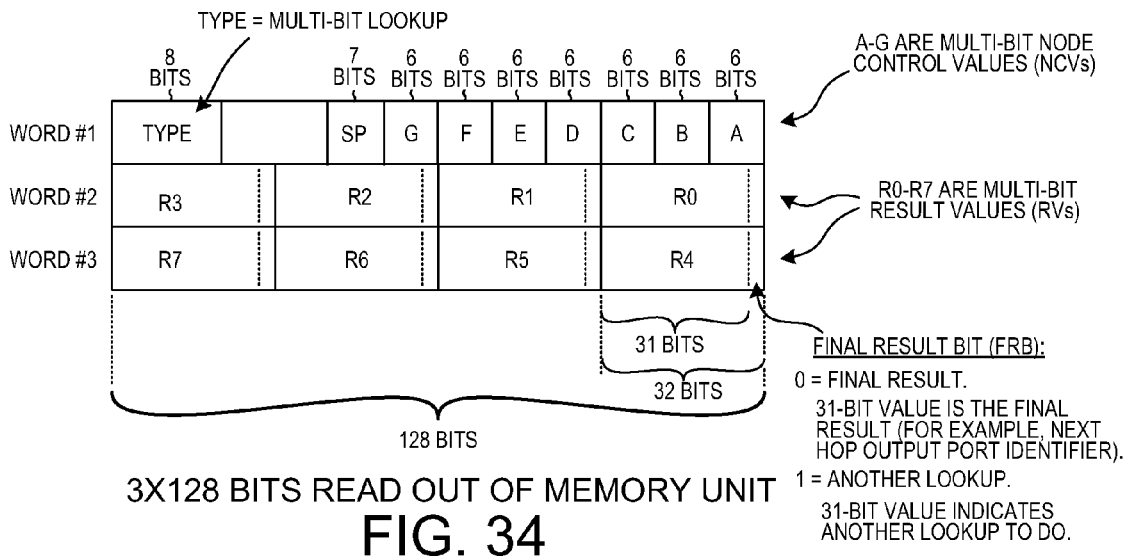
FIG. 34 is a diagram of a 3×128-bit block of information (stored in the memory of the transactional memory) that configures the hardware trie structure in the lookup stage of the lookup engine of FIG. 31.

FIG. 34 is a diagram of the 3×128-bit block 5031. The block includes three 128-bit words. The first word WORD#1 includes an 8-bit type value, a 7-bit starting position value (SP), and seven 6-bit multi-bit node control values (NCVs) A-G. The second and third words WORD#2 and WORD#3 include eight 32-bit multi-bit results values (RVs) R0-R7. Each RV includes a final result bit (FRB). The memory 90 stores and outputs 128-bit words, so the information to configure the hardware trie structure for a lookup is packed efficiently into a minimum number of 128-bit words.

The type value, the NCVs and the RVs from the 3×128-bit block 5031 are loaded into register R1 into the bit positions as indicated in FIG. 33. The outputs of the bits of register R1 are supplied in parallel to ALU3 as illustrated in FIG. 33. In addition to the values from the 3×128-bit block 5031 and the IV value 5037, the opcode OPCODE3 for the lookup stage 5052 is also stored in register R1. The lookup stage 5054 performs a three-level trie lookup operation in one pipeline clock cycle using combinatorial logic of the novel hardware trie structure 5000, thereby outputting a 32-bit result value. In this specific example, the 32-bit result value includes a 31-bit next hop output port identifier (step 5011).

Rather than the first sixty-four bits of the 128-bit IP address value being supplied directly to ALU3, the 128-bit IP address value may be supplied in shifted form. Barrel shifter 5053 shifts the 128-bit IP address 5037 by a number of bit positions. The number of bit positions is indicated by the 7-bit starting portion value (SP). Due to the use of barrel shifter 5053, a 64-bit section of the IP address can be supplied to ALU3 as the incoming IV value. The particular 64-bit section is predetermined by the starting point value SP stored in the 3×128-bit block. For simplicity of explanation here, the shifted IV value is referred to below simply as the IV value, although it is understood that the IV value actually received by hardware trie structure 500 may be a shifted sixty-four bit section of the IV value 5037.

Figure 35:
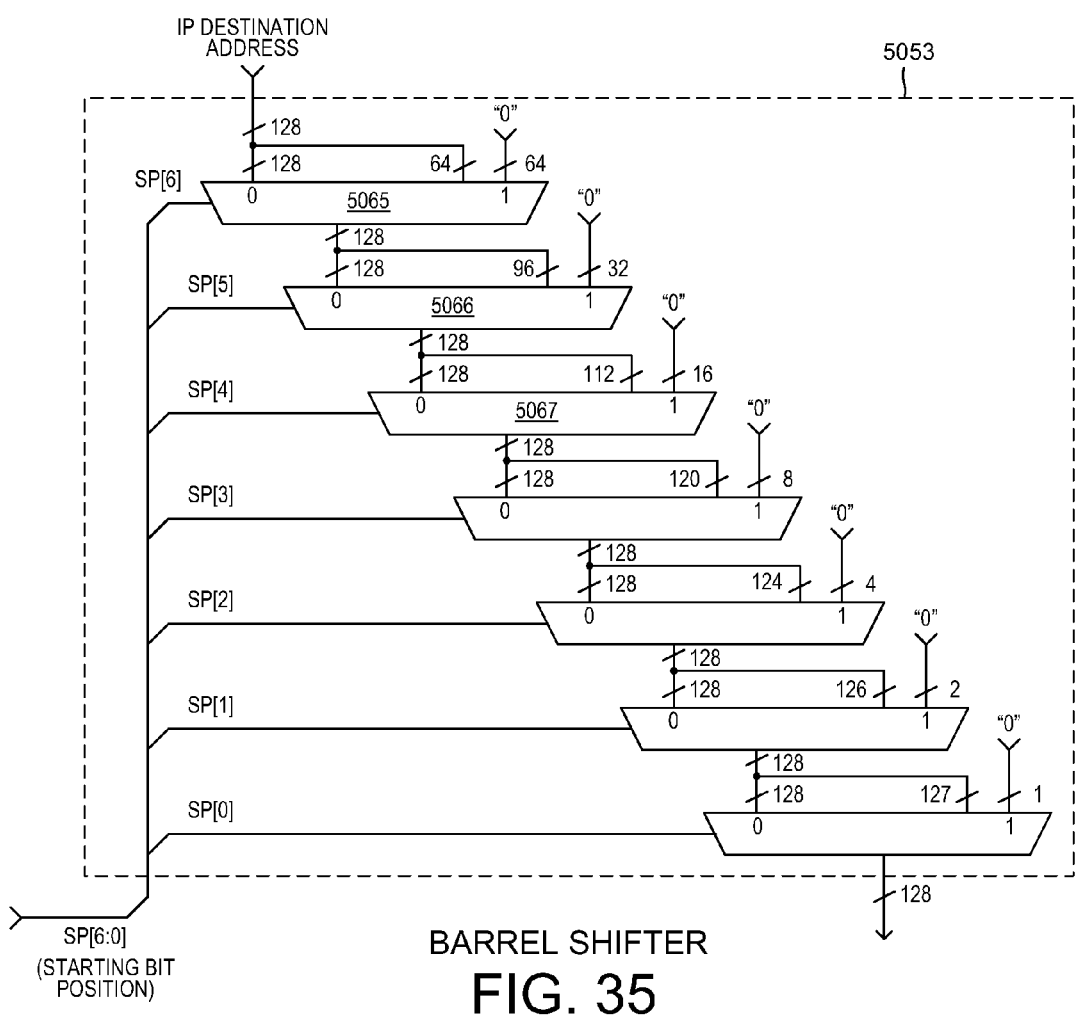
FIG. 35 is a circuit diagram of the barrel shifter in the lookup engine of FIG. 31.

FIG. 35 is a more detailed diagram of barrel shifter 5053. Each multiplexing circuit represented by a multiplexer symbol in the diagram involves one hundred twenty-eight 2:1 multiplexers. Multiplexing circuit 5065, for example, supplies either the incoming 128-bit IP address onto its output leads in unshifted form if the select input signal SP[6] is a digital low, or the multiplexing circuit 5065 supplies the IP address shifted sixty-four bits to the left. The leftmost sixty-four bits are therefore not passed on to the next lower multiplexing circuit, and the rightmost sixty-four bit positions of the 128-bit output value are filled in with digital zero values. This first multiplexing circuit 5065 shifts to the left by sixty-four bit positions if SP[6] is set, the second multiplexing circuit 5066 shifts to the left by thirty-two bit positions if SP[5] is set, the third multiplexing circuit 5067 shifts to the left by sixteen bit positions if SP[4] is set, and so forth.

Figure 36:
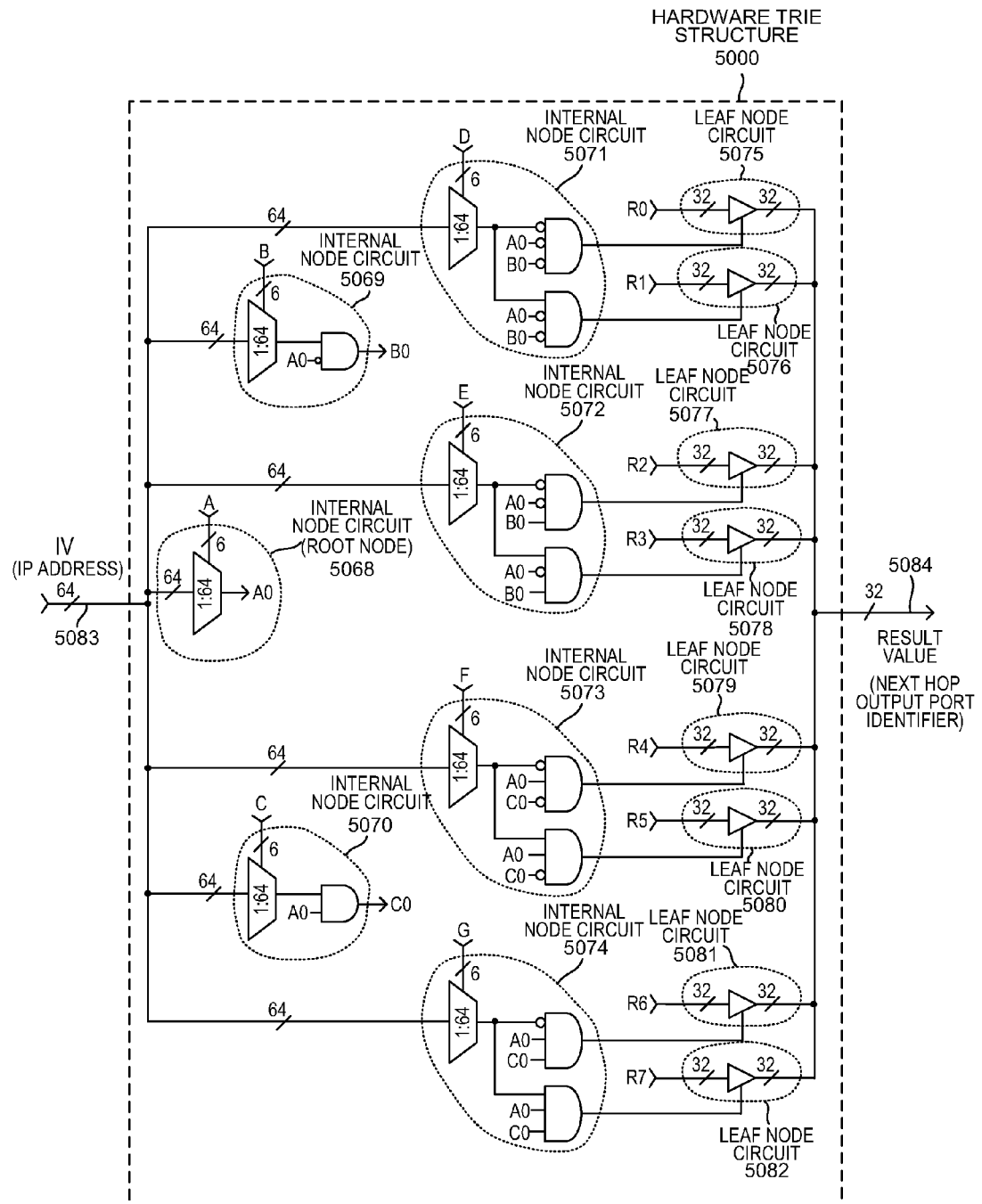
FIG. 36 is a circuit diagram of the hardware trie structure in the lookup stage of the lookup engine of FIG. 31.

FIG. 36 is a circuit diagram of hardware tri structure 5000 of ALU3 5054 of FIG. 33. Hardware trie structure 5000 includes a plurality of internal node circuits 5068-5074 and a plurality of leaf node circuits 5075-5082. Each internal node circuit receives and is configured by a corresponding one of the NCVs. The NCV is received onto select input leads of a multiplexing circuit of the internal node circuit. Each internal node circuit also receives sixty-four bits of the 128-bit IV value as output by barrel shifter 5053. The 64-bit IV value is received onto the hardware trie structure 5000 via a set of input leads 5083 of the hardware trie structure. Each leaf node receives a corresponding one of the RVs. A leaf node circuit, if it receives a digital high enable signal from its corresponding upstream internal node circuit, supplies its RV value onto the set of output leads 5084. Only one of the leaf node circuits is enabled at a time, so the leaf node circuits together perform a multiplexing function in that one of the RV values is supplied onto the set of output leads 5084, where which one of the RV values it is that is supplied onto the set of output leads is determined by the internal node circuit portion of the trie structure. There is no sequential logic element in the circuitry of the hardware trie structure 5000. The hardware trie structure is set up by supplying the NCVs A-G to the internal node circuits of the trie structure, and by supplying the RV values R0-R7 to the leaf node circuits of the trie structure. Supplying an IV value onto the set of input leads 5083 causes signals to propagate through the hardware trie structure 5000 such that a selected one of the RV values is output onto the output leads 5084.

Figure 37:
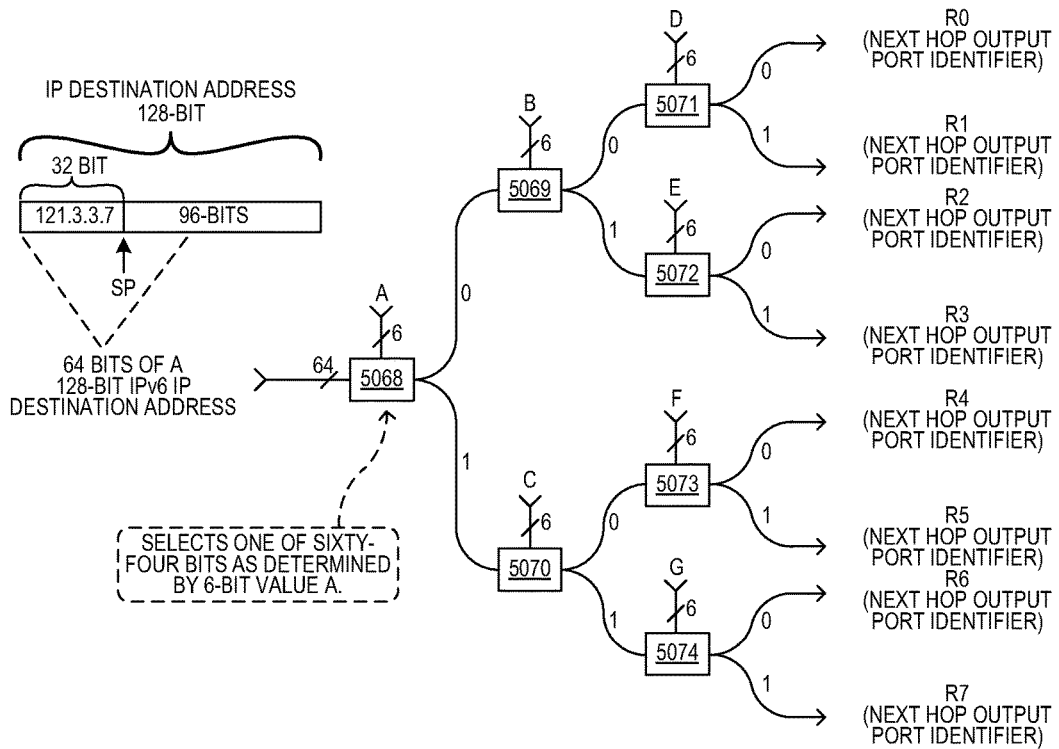
FIG. 37 is a conceptual diagram of the operation of the hardware trie lookup structure.

FIG. 37 is a diagram that illustrates operation of the hardware trie structure 5000. The 64-bit value IV is supplied to the root internal node circuit 5068. One of the bits of the 64-bit value IV is selected and is output. Which one of the bits it is that is output is determined by the value A. If the selected bit has a value of a digital high then decision flow proceeds downward in the tree to internal node circuit 5070, whereas if the selected bit has a value of a digital low then decision flow proceeds upward in the tree to internal node circuit 5069.

Consider the situation in which the selected bit was a digital high. Once a branch is not taken, all sub-branches to the right carry unasserted signals. Accordingly, in the example of FIG. 37, none of R0-R3 can be selected as the output result value of the trie. Internal node circuit 5070 selects another bit of the 64-bit value IV as determined by the value C. If this second selected bit has a value of a digital high then decision flow proceeds downward in the tree to internal node circuit 5074, whereas if the second selected bit has a value of a digital low then decision flow proceeds upward in the tree to internal node circuit 5073. In this way, decision flow passes through the trie structure such that only one asserted signal is output to one output of one of the internal node circuits. For example, if the bit indicated by A is a digital high, and if the bit indicated by C is a digital low, and if the bit indicated by F is a digital high, then decision flow terminates at the R5 next hop output port identifier. Only this R5 value is selected. Likewise, in the specific circuit of FIG. 36, if the bit of IV indicated by A is a digital high, and if the bit of IV indicated by C is a digital low, and if the bit of IV indicated by F is a digital high, then the enable signal supplied to leaf node circuit 5080 is asserted. The enable signals to all other leaf node circuits are not asserted. Leaf node circuit 5080 therefore outputs the RV value R5 onto the set of output leads 5084. Each RV value is output when three identified bits of the IV value have three particular digital values. In the example being described here, the IV value is supplied to the hardware trie structure, along with the configuring NCVs and RVs, so that the hardware trie structure outputs (step 5011) one RV value onto output leads 5084.

Figure 38:
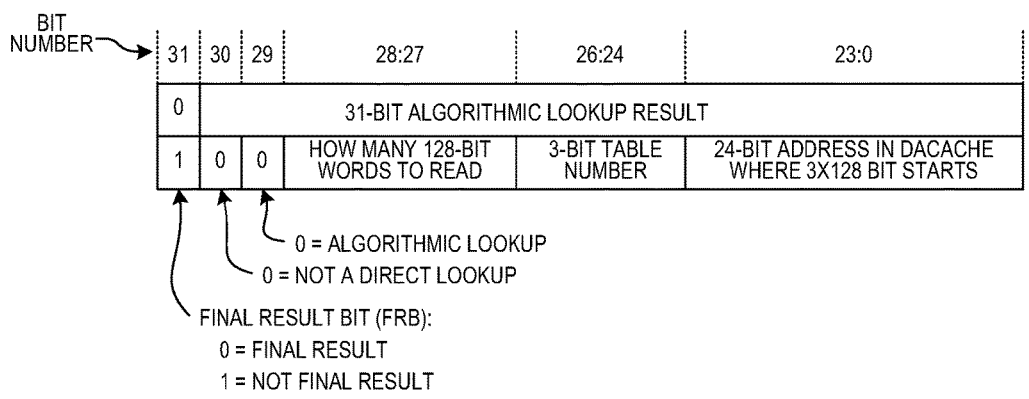
FIG. 38 is a diagram that shows the various parts of a result value as output by the hardware trie structure.

FIG. 38 is a diagram that shows the various bits of a result value as output by the hardware trie structure 5000. If the final result bit (FRB) is a digital logic low, then the remaining thirty-one bits of the RV contain the algorithmic lookup result. In the example of the router being described here, a final lookup result value is a next hop output port identifier. The result stage of the pipeline interacts with the data bus interface 75 to cause the result value to be sent to processor 160 in the ME that initiated the original lookup command 5030. As illustrated in FIG. 32, state machine operation transitions from the wait for result state 5046 to the idle state 5035.

Figure 29:
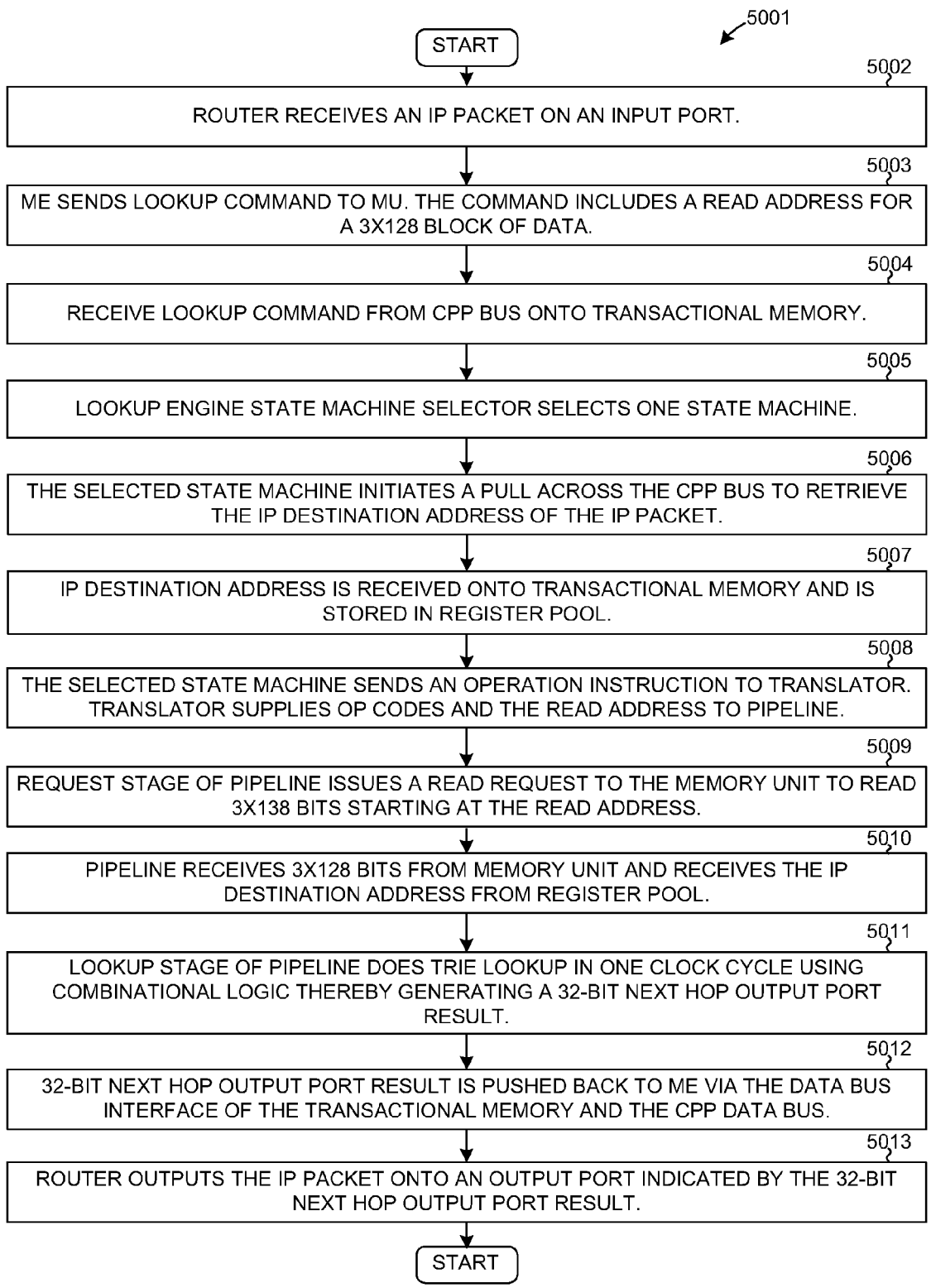
FIG. 29 is a flowchart of a method involving a novel hardware trie structure.
Figure 30:
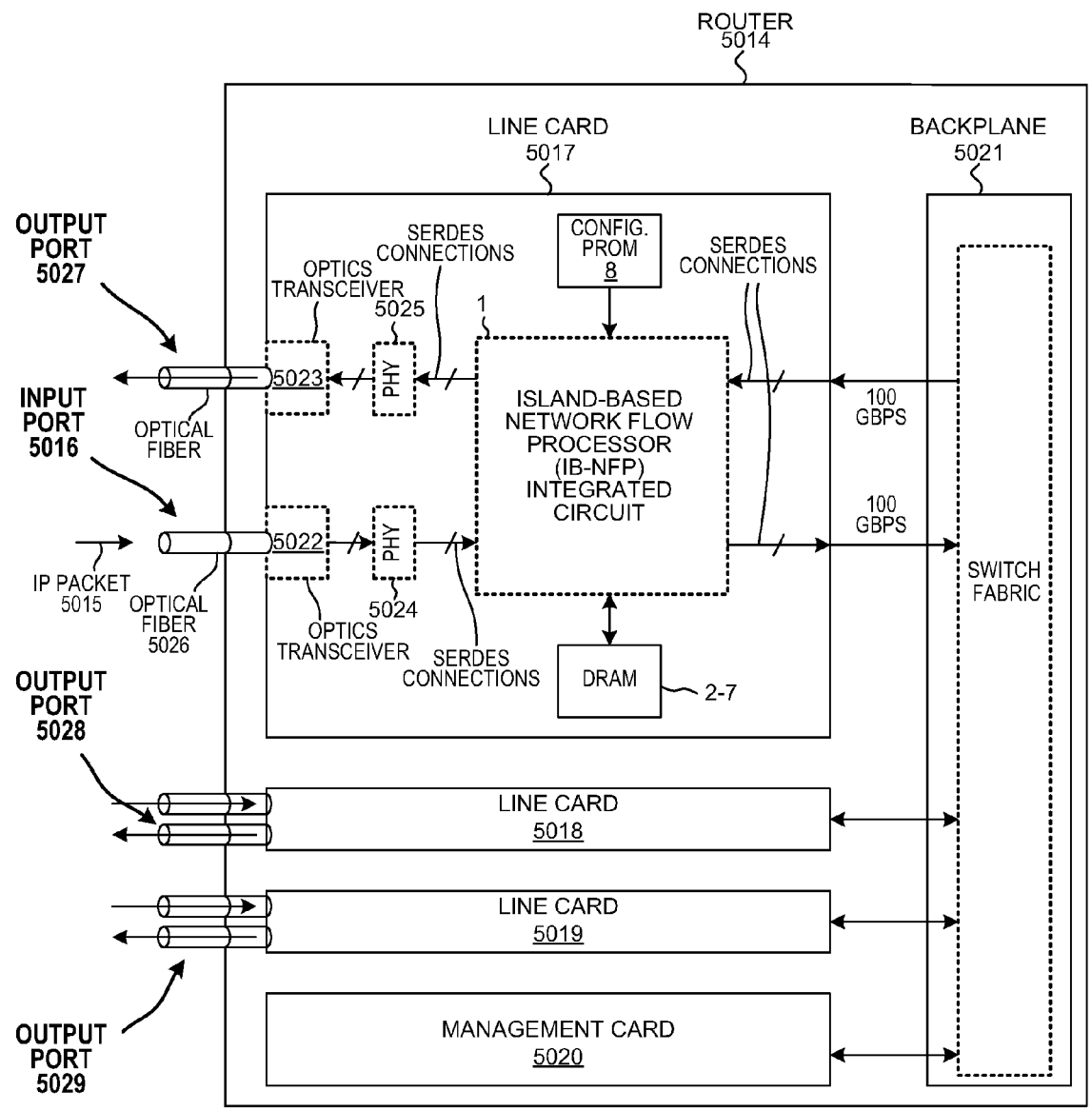
FIG. 30 is a diagram of a router that carries out the method of FIG. 29.

In the specific example of the method of FIG. 29, the FRB bit of the result value is clear indicating a final result value. The result stage 5064 of the pipeline therefore initiates a CPP bus push of the final result value 5085 (including the 31-bit algorithmic lookup result value output by the hardware trie structure) back to processor 160, so that the next hop value is returned (step 5012) to the processor 160 that issued the original lookup command. As a result, router 5014 outputs (step 5013) the IP packet 5015 onto the output port of the router identified by the final result 5085 (a next hop output port identifier).

As indicated in FIG. 38, the FRB bit of the result value output by the hardware trie structure 5000 need not be a digital logic low. If the FRB is a digital logic high, then the 31-bit remainder of the RV value is supplied back to the state machine of the lookup engine. The state machine transitions from the wait for result state 5046 to the output state 5039. The state machine receives this 31-bit value as a form of an instruction to perform another lookup operation. Rather than the address information on where to read a block from memory 90 coming from an original lookup command, the address information is supplied as part of the 31-bit result value. For example, if bit 30 is a digital logic low and if bit 29 is also a digital logic low, then the next lookup will be an algorithmic lookup. There are several types of algorithmic lookups, one of which is the trie lookup described above. What type of algorithmic lookup it is that is to be performed in the next lookup is not indicated in the result value supplied to the state machine, but rather is indicated by the type value of the next 3×128-bit block to be read from memory 90. Bits 23:0 are a 24-bit starting address in memory 90 where the beginning of the next 3×128-bit block to be read is stored. Bits 28:27 indicate how many 128-bit words to read starting at that address. These values are used to read an indicated second number of 128-bit words from memory 90. If the type value indicates the next lookup is another trie lookup, then the process repeats as described above with the values of the 3×128-bit block being used to configure the hardware trie hardware for the second lookup. If the type value indicates another type of lookup, then the contents of the 128-bit words are used in other ways by another selected one of the lookup hardware blocks 5055-5060. In this way, successive lookup operations can be performed by the lookup engine on different parts of the IP address until a final result is obtained. In the case of the next lookup being a direct lookup, then the type of direct lookup is determined by information in the non-final result value of the prior lookup. In the case of the next lookup being an algorithmic lookup, then the type of algorithmic lookup is determined the type value in the 3×128-bit block read from memory 90 at the beginning of the next lookup. When a lookup results in a final result being obtained, then the result stage 5064 initiates a CPP bus push operation to return the 31-bit final result (next hop output port indicator) back to the requesting processor via data bus interface 75 and CPP data bus 159.

The novel hardware trie structure, the transactional memory that contains it, and the related methods described above are of general utility in looking up different types of information and are not limited to looking up next hop output port information from incoming IP addresses. Although the IV is pulled across the bus in a second bus transaction after the initial lookup command passes across the bus in a first bus transaction in the example described above, the IV in other examples can be a part of the original lookup command.

FIG. 33 shows the various hardware lookup blocks within lookup engine 74. Only one output of the various hardware lookup blocks is utilized during a specific clock cycle. The contents stored in register R1 5051 varies depending on which hardware lookup block is being utilized in the given clock cycle. Register R1 5051 is coupled to each hardware lookup block. In one example, to reduce power consumption OP CODE is also supplied to each hardware lookup block and causes only one of the hardware lookup blocks to be turned on during a given clock cycle. In another example, OP CODE is only supplied to multiplexer 5062 and causes a single hardware lookup block output to be coupled the results stage. In one example, multiplexer circuit 5062 may be implemented utilizing a plurality of multiplexers. Three of the hardware lookup blocks (5055-50557) shown in FIG. 33 are direct lookup blocks. One of the three hardware lookup blocks (5055-5057) shown in FIG. 33 is a direct 32-bit lookup hardware lookup block 5055.

Figure 39:
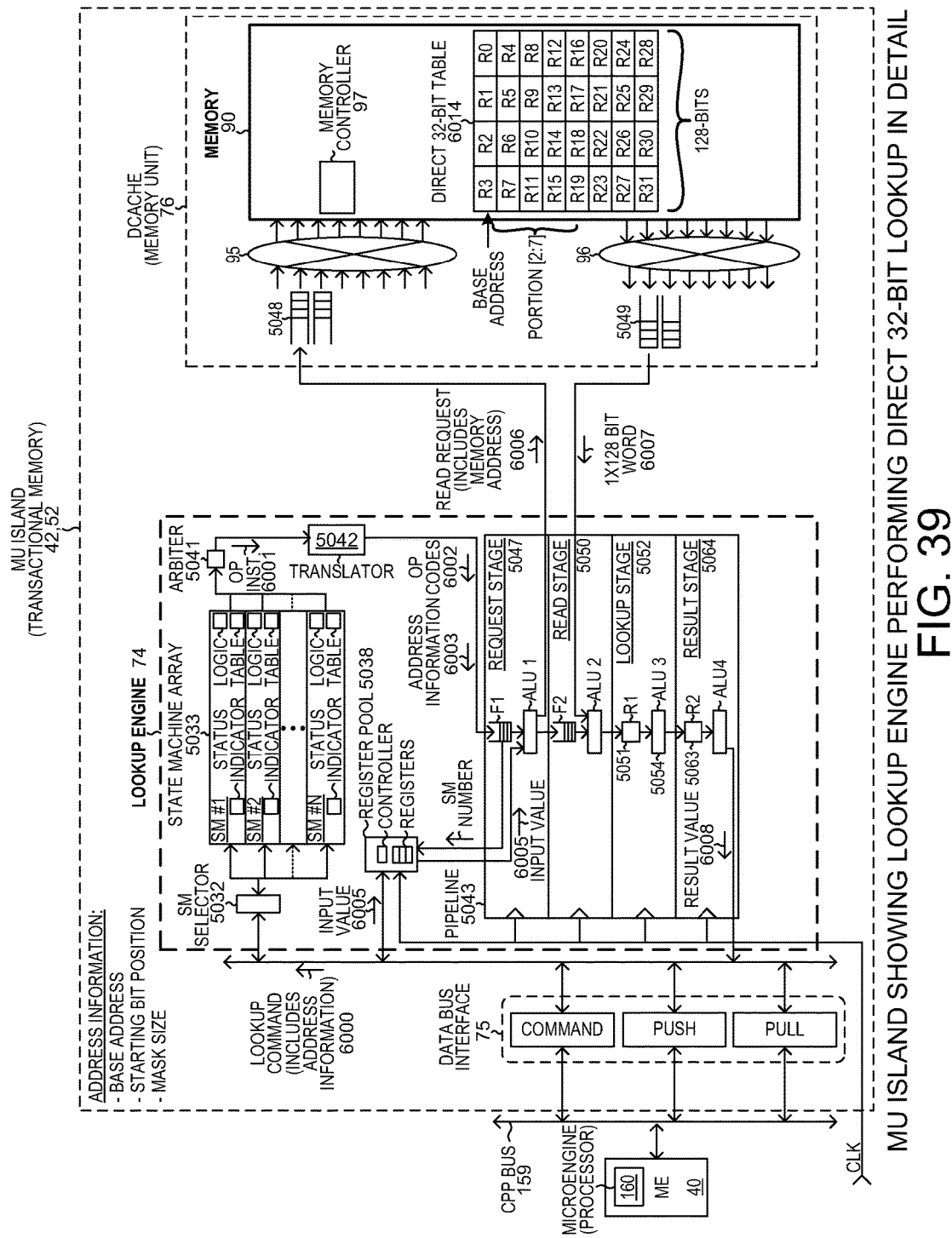
FIG. 39 is a detailed diagram of the lookup engine within an MU island performing a direct 32-bit lookup operation.

FIG. 39 illustrates the values communicated in the lookup engine 74 during a direct 32-bit lookup. In one example, upon receiving an ethernet packet microengine 160 sends a lookup command 6000 to transactional memory 42, 52 via a CPP bus 159. In this example, the purpose of the lookup command 6000 is to determine what physical port and virtual port the ethernet packet is to be routed to. The lookup command 6000 includes a base address value, a starting bit position value, and a mask size value. The combination of the base address value, starting bit position value, and mask size value is referred to as address information 6003. In another example, the mask size value is predetermined and not included in the address information 6003. The lookup command 6000 is communicated through the data bus interface 75 to state machine selector 5032. State machine selector 5032 monitors the status indicator in each state machine within state machine array 5033 and routes lookup command 6000 to idle state machine SM#1. In response to receiving lookup command 6000, the selected state machine SM#1 issues a pull-id command to the initiating microengine 160.

FIG. 32 is a state machine state diagram. The state machine transitions from the idle state 5035 to the pull state 5036 when a lookup command 6000 sent by microengine 160 is received by the state machine. The state machine causes a pull-id bus transaction to be sent back to the microengine 160 via data bus interface 75 and CPP bus 159. The format of the pull-id bus transaction is shown in FIG. 5. The DATA_REF field contains the pull-id identifier that the microengine 160 provided in the original lookup command 6000. The TARGET_REF field contains an identifier supplied by the state machine target. This target_ref is usable by the target to identify later received data payloads with the pull-id. The starting address value and number of addresses to follow value are also included in the pull-id bus transaction. The pull-id bus transaction is received by microengine 160 across the pull-id mesh. From the DATA_REF field of the pull-id bus transaction, the microengine 160 determines that the pull-id is associated with the original lookup command 6000 and that the microengine 160 should return to the target an input value 6005. In one example, the input value 6005 is a destination Internet Protocol (IP) address. The IP address 6005 is used by the lookup engine 74 to determine the destination (physical port and virtual port) to which the ethernet packet should be sent. Microengine 160 therefore responds by sending one or more data bus transactions across the data0 or data1 mesh to register pool 5038. Register pool 5038 includes a controller and a plurality of registers. In one example, each register of the register pool 5038 is associated with an individual state machine of the state machine array 5033. The format of the data bus transactions is set forth in FIG. 6. The microengine 160 includes the TARGET_REF identifier from the pull-id so that the receiving state machine can associate the incoming data bus transactions with the pull-id. There may be one or more such data bus transactions. The LAST bit of a data bus transaction indicates whether there are more data bus transactions to follow, or whether the data bus transaction is the last data bus transaction for the pull-id. The DATA fields of these data bus transactions include the addresses where the count values are stored.

Figure 43:
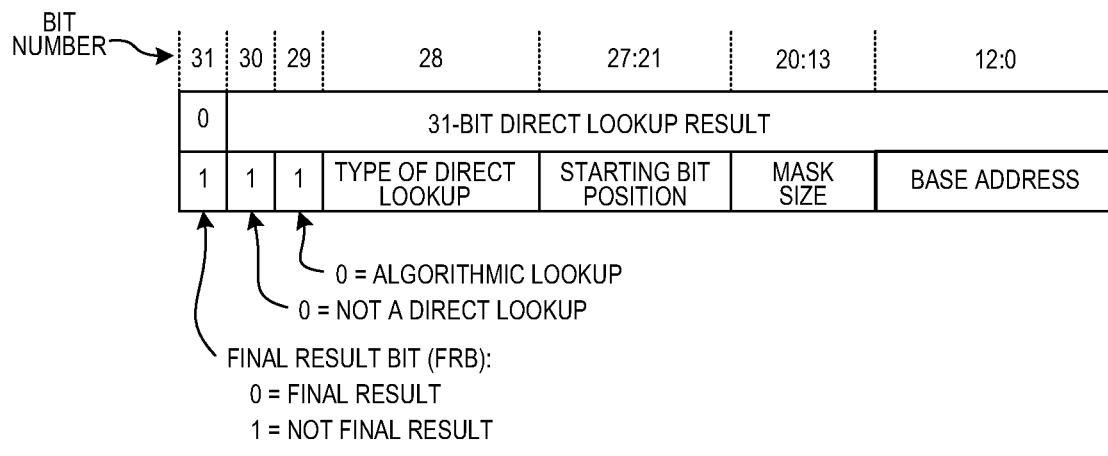
FIG. 43 is a diagram of a direct 32-bit result value.
Figure 44:
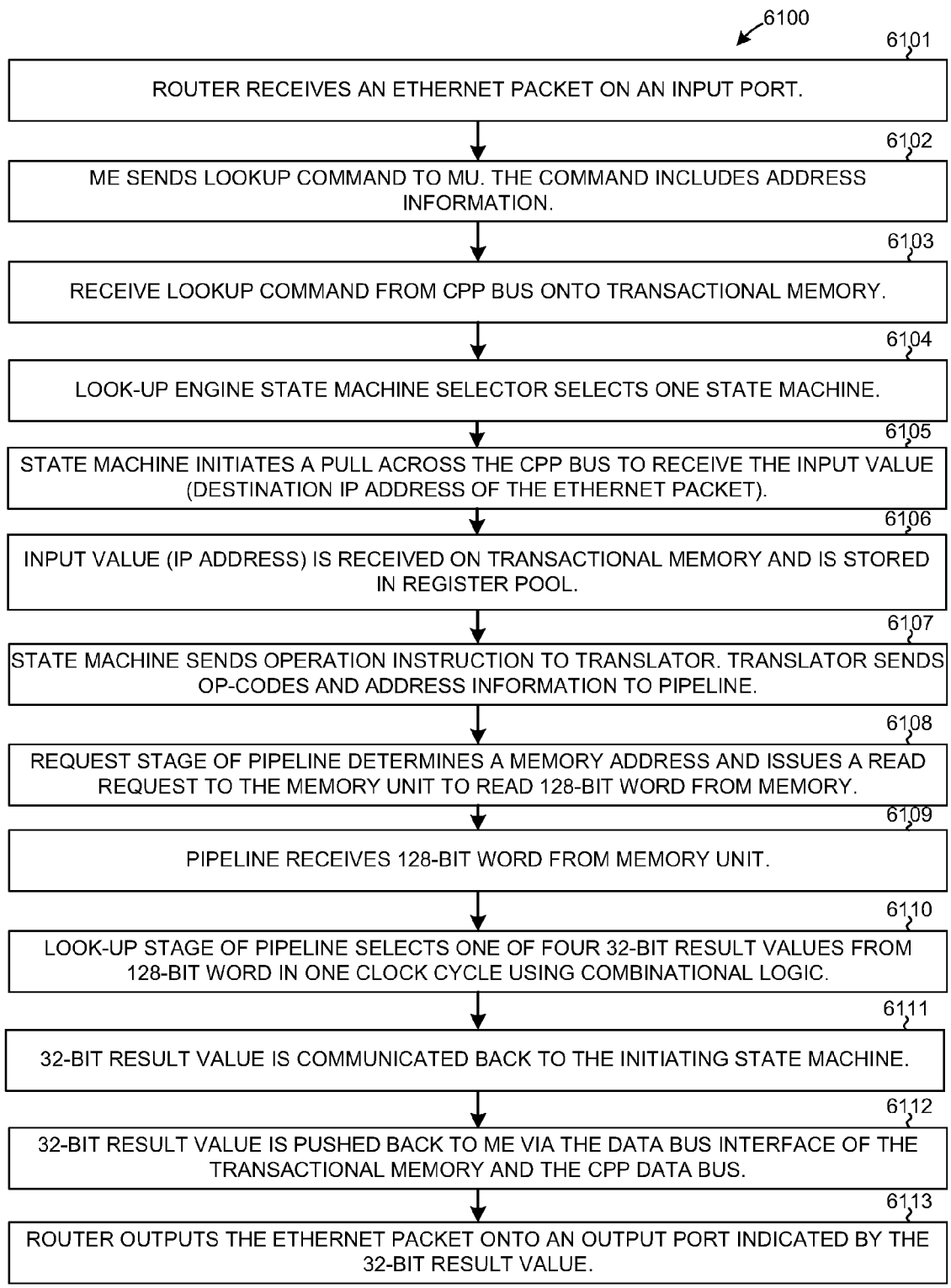
FIG. 44 is a flowchart of a method involving a novel hardware direct 32-bit lookup operation.

Once all the pull data has been received and is stored in the appropriate register in register pool 5038, then the state machine operation transitions from PULL state 5036 to OUTPUT state 5039. The state machine outputs an operation instruction 6001 to arbiter 5041. Once the output operation is complete, state machine operation transitions from OUTPUT state 5039 to WAIT FOR RESULT state 5046. During the WAIT FOR RESULT state 5046, the pipeline requests and reads a 128-bit word 6007 from memory 90, selects one of four 32-bit result values included in the received 128-bit word 6007, and returns the selected result value 6008 to the state machine (SM#1). FIG. 43 illustrates an example of the different fields included in result value 6008. The result value 6008 includes a final result field. In one example, the final result field is 1-bit wide. The result value 6008 has a first set of fields when the result value 6008 is a final result value. The result value 6008 has a second set of fields when the result value 6008 is not a final result value. When the result value 6008 is a final result value, 31 bits of the 32-bit result value is the desired lookup result field. When the result value 6008 is not a final result, the result value includes a type of direct lookup field, a base address field, a start bit position field, and a mask size field. If the final result field is set, a final result value has been found and the state machine operation transitions from WAIT FOR RESULT state 5046 to IDLE state 5035 and the result value 6008 is sent the ME. In one example, the result value 6008 is a next hop output port identifier. If the final result field is not set, the final result value has not been found and the state machine operation transitions from WAIT FOR RESULT state 5046 to OUTPUT state 5039 and a subsequent lookup operation is performed based upon the contents of the selected result value 6008. The arbiter 5041 arbitrates information flow to translator 5042. Translator 5042 receives the operation instruction and from the operation instruction outputs new OP CODES and new address information. Address information includes a base address, starting bit position, and mask size that are used in the pipeline to retrieve another result value.

As shown in FIG. 39, pipeline 5043 includes request stage 5047. Request stage 5047 of the pipeline 5043 is shown in greater detail in FIG. 41. Request stage 5047 includes FIFO F1 6013 and ALU 1 6014. ALU 1 6014 includes selecting circuit 6020 and adding circuit 6012. Selecting circuit 6020 includes barrel shifter 6009 and mask circuit 6010. The request stage of the pipeline supplies the state machine number to the register pool 5038. The register pool 5038 uses the state machine number to return to the pipeline the input value (IP address) 6005 stored in the register pool 5038 for that state machine number. The request stage uses the starting bit position and mask size to select a portion 6015 of the input value (IP address) 6005. In one example, the portion 6015 is an eight bit portion of the input value (IP address) 6005. The portion 6015 is selected by performing a barrel shift operation followed by a masking operation. The barrel shift operation is performed by barrel shifter 6009. Barrel shifter 6009 receives the input value (IP address) 6005 and starting bit position 6016 and generates a shifted version of input value (IP address) 6005. A detailed circuit diagram of the barrel shifter 6009 is provided in FIG. 35. Description of the barrel shifter operation is provided in the description of FIG. 35 above. Mask circuit 6010 receives the shifted version of the input value (IP address) 6005 from barrel shifter 6009 and the mask size 6017 and performs a masking operation whereby all bits received from the barrel shifter are masked out with exception to the desired portion bits 6015. In one example, masking circuit 6010 is an array of AND gates where all undesired bits are anded with "0" and desired bits are anded with "1". The portion bits 6015 are then separated into two different bit groupings. In one example, the portion 6015 is an eight bit value that is separated into a first two bit group PORTION [0:1] and a second six bit group PORTION [2:7]. Adding circuit 6012 receives PORTION [2:7] and base address 6018 and generates memory address 6019. Memory address 6019 is included in read request 6006 (shown in FIG. 39). PORTION [0:1] is communicated to the following stages of the pipeline and is utilized within the lookup stage 5052. Request stage 5047 then issues a read request to memory controller 97 via FIFO 5048 and crossbar switch 95. The memory controller 97 handles reading a single 128-bit word 6007 from the memory location indicated by the read request 6006. FIG. 40 illustrates how the direct 32-bit result values are packed in memory 90.

As shown in FIG. 39, read stage 5050 of pipeline 5043 includes FIFO F2 and ALU 2. In response to the read request 6006 send by request stage 5047, read stage 5050 of the pipeline 5043 receives 128-bit word 6007 from memory 90 via crossbar switch 96 and FIFO 5049. In one example, the 128-bit word 6007 includes four 32-bit result values (as shown in FIG. 40). Read stage 5050 also receives PORTION [0:1] from the read stage 5050. Read stage 5050 then writes both the 128-bit word 6007 and PORTION [0:1] to register R1 5051 within lookup stage 5052.

As shown in FIG. 39, pipeline 5043 includes register lookup stage 5052. Lookup stage 5052 of the pipeline is shown in greater detail in FIG. 42. Lookup stage 5052 includes register R1 5051 and ALU 3 5054. ALU 3 5054 includes a multiplexing circuit 6011. In one example, multiplexing circuit 6011 includes thirty-two one by four multiplexers. multiplexing circuit 6011 receives PORTION [0:1] and the four 32-bit result values from the 128-bit word 6007 received in read stage 5050. The multiplexing circuit 6011 selects one of the four 32-bit result values based upon the value of PORTION [0:1]. The selected 32-bit result value is then written to register R2 5063 of result stage 5064. Result stage 5064 causes the selected result value to be communicated to the initiating state machine.

FIG. 43 is a flowchart 6100 illustrating the direct 32 bit lookup operation of lookup engine 74. Router receives an ethernet packet on an input port (Step 6101). The ethernet packet includes a destination IP address. The ethernet packet is communicated to a microengine within the router. The microengine sends a lookup command to the transactional memory (Step 6102). The lookup command includes a base address value, a starting bit position value, and a mask size value. The base address value, starting bit position value, and mask size value are referred to as address information. The lookup command is received onto the transactional memory via the CPP bus (Step 6103). In response to receiving the lookup command, an idle state machine is selected to receive the command by a state machine selector (Step 6104). In response to receiving the lookup command, the selected state machine initiates a pull across the CPP bus to read the input value (destination IP address) of the ethernet packet from the microengine (Step 6105). The input value (destination IP address) is then received onto the transactional memory and stored in a register pool (Step 6106). The state machine then sends an operation instruction to a translator that causes the translator to send OP-CODES and address information to the pipeline (Step 6107). The request stage 5047 uses the input value (destination IP address) and the address information to determine a memory address. The request stage 5047 of the pipeline then issues a read request (including the memory address) to the memory unit to read a single 128-bit word (Step 6108). The pipeline then receives the 128-bit word from the memory unit (Step 6109). The lookup stage of the pipeline then selects one of four 32-bit result values from 128-bit word in one clock cycle using combinational logic (Step 6110). The result of the direct 32-bit lookup is a single 32-bit result value. The 32-bit result value is communicated back to the initiating state machine (Step 6111). The 32-bit result value is pushed back from the state machine to the microengine via the data bus interface of the transactional memory and the CPP data bus (Step 6112). The router then outputs the ethernet packet onto an output port indicated by the 32-bit result value (Step 6113).

Op codes 6002 is supplied to each ALU in each state of the pipeline. Op codes 6002 includes one operation code (op code) for each stage of the pipeline. Each operation code includes a plurality of bits. The particular combination of these bits indicates one of several different operation commands. The operation performed in each stage of the pipeline can be varied by changing the op code assigned to a given pipeline stage. For example, the operation of the lookup stage of the pipeline 5043 can be changed from performing a direct 32-bit lookup to a direct 24-bit lookup. This allows flexible programming of each stage of the lookup engine 74 so that various lookup operations can be performed by the single lookup engine.

Figure 45:
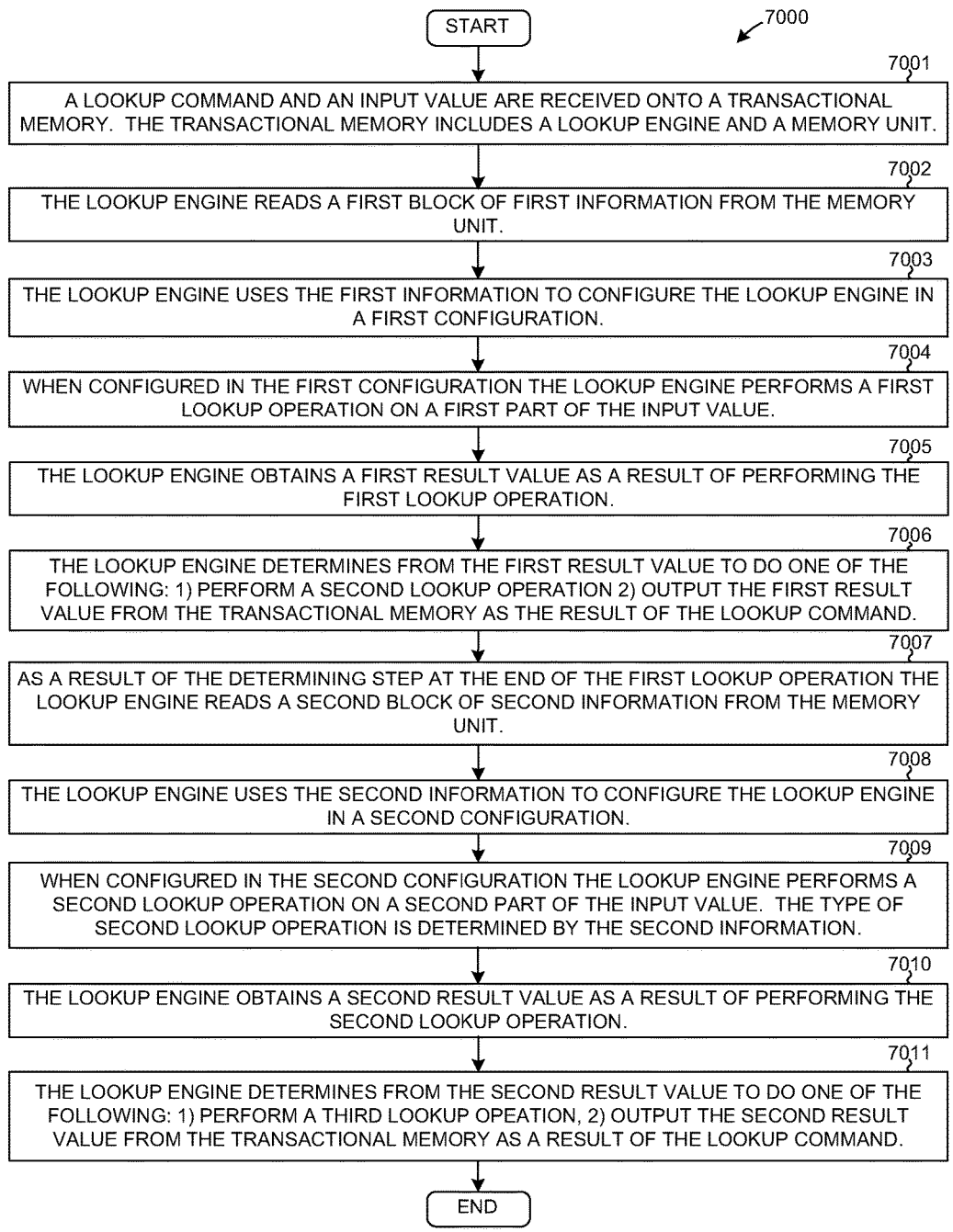
FIG. 45 is a flowchart of a method 7000 in accordance with another novel aspect.

FIG. 45 is a flowchart of a method 7000 in accordance with another novel aspect. The lookup engine of the transactional memory has multiple hardware lookup structures. The lookup engine is configurable in a first configuration such that a first hardware lookup structure of the lookup engine is usable to perform a first lookup operation. The lookup engine is also configurable in a second configuration such that a second hardware lookup structure of the lookup engine is usable to perform a second lookup operation. The first lookup operation may, for example, be a first type of lookup such as a direct lookup operation, and the second lookup operation may be a second type of lookup such as an algorithmic lookup operation. The first lookup operation may be the direct 32 lookup operation described above and the second lookup operation may be the hardware trie lookup operation described above.

Initially, a lookup command and an input value (IV) are received (step 7001) onto the transactional memory 42,53. In some examples, the IV is not a part of the lookup command but rather is received onto the transactional memory in a second bus transaction. In other examples, the IV is a part of the lookup command. The bus across which the lookup command is received onto the transactional memory is CPP data bus 159. A first block of first information is read (step 7002) from memory unit 76 of the transactional memory by lookup engine 74. In one example, the lookup command includes address information that the lookup engine uses to read the first block of first information from the memory unit.

The lookup engine then uses the first information to configure (step 7003) the lookup engine in the first configuration. The lookup engine so configured is used to perform a first lookup operation (step 7004) on a part of the input value. The part of the input value may be determined by a starting point value (SP) of the first information. A barrel shifter within the lookup engine may receive the starting point value so that the barrel shifter outputs the part of the input value that is used as an input value for the lookup operation. As a result of the first lookup operation, the lookup engine obtains a first result value (step 7005). Based on the first result value, the lookup engine determines (step 7006) to do one of the following: 1) perform a second lookup operation, 2) output the first result value from the transactional memory as the final result of the lookup command.

In one example, the first result value has a Final Result Bit (FRB). The value of the FRB indicates whether the first result value is a final result value. If the first result value is a final result value, then the first result value is output from the transactional memory as the final result of the lookup command. If, on the other hand, the FRB indicates that the first result value is not a final result value, then address information in the first result value is used by the lookup engine to read a second block of information from the memory unit.

In one specific example, the FRB of the first result value indicates that the first result value is not a final result value and that another lookup operation is to be performed. The lookup engine uses the second information to configure (step 7008) the lookup engine in the second configuration. The lookup engine so configured is used to perform a second lookup operation (step 7009) on another part of the input value. As a result of the second lookup operation, the lookup engine obtains a second result value (step 7010) and based on the second result value, the lookup engine determines (step 7011) to do one of the following: 1) perform a third lookup operation, 2) output the second result value from the transactional memory as a result of the lookup command. In this way, the lookup engine performs lookup operation after lookup operation in a recursive fashion until a final result value is obtained. In one example, the type of each successive lookup operation is determined at least in part by a type value that is a part of the block of information read from the memory unit at the beginning of the lookup operation. Address information in the result value of the previous lookup operation is used by the lookup engine to determine where to read the next block of information from the memory unit. The address information also indicates how much information to read.

In one exemplary application, a first lookup operation is a direct lookup type of lookup operation. If the first lookup operation does not result in obtaining a final result value, then the result value of the first lookup operation is used to select either a direct lookup as the second lookup operation or an algorithmic lookup as the second lookup operation. If the address space being considered in the second lookup operation is densely packed with result values then the second lookup operation is a direct lookup, whereas if the address space being considered in the second lookup operation is sparsely populated with result values then the second lookup operation is an algorithmic lookup. Each successive lookup operation looks at a different part of the input value and may be a different type of lookup. The part of the input value being considered in a lookup operation is determined by a barrel shifter control value stored in the block of information for the lookup operation. The type of the next lookup operation is determined by the result value of the prior lookup and/or by type information of the block of information read at the beginning of the next lookup operation. If the address of the block in memory is dependent upon the key then the type of lookup is encoded in the lookup command or lookup initiating result value, whereas if the address of the block in memory is not dependent upon the key then the type of lookup is set forth by the type field in the block itself. The transactional memory that carries out the lookup command includes no processor that fetches instructions, decodes the instructions, and executes the instructions. Method 7000 of FIG. 45 is not limited to the particulars of the transactional memory 42, 52 of the specific example of IB-NFP 1, but rather is of general applicability and extends to other transactional memory and lookup engine architectures.

FIG. 33 shows the various hardware lookup blocks within lookup engine 74. Only one output of the various hardware lookup blocks is utilized during a specific clock cycle. The contents stored in register R1 5051 varies depending on which hardware lookup block is being utilized in the given clock cycle. Register R1 5051 is coupled to each hardware lookup block. In one example, to reduce power consumption OP CODE is also supplied to each hardware lookup block and causes only one of the hardware lookup blocks to be turned on during a given clock cycle. In another example, OP CODE is only supplied to multiplexer 5062 and causes a single hardware lookup block output to be coupled the results stage. In one example, multiplexer circuit 5062 may be implemented utilizing a plurality of multiplexers. Three of the hardware lookup blocks (5055-50557) shown in FIG. 33 are direct lookup blocks. One of the three hardware lookup blocks (5055-5057) shown in FIG. 33 is a direct 24-bit lookup hardware lookup block 5056.

Figure 46:
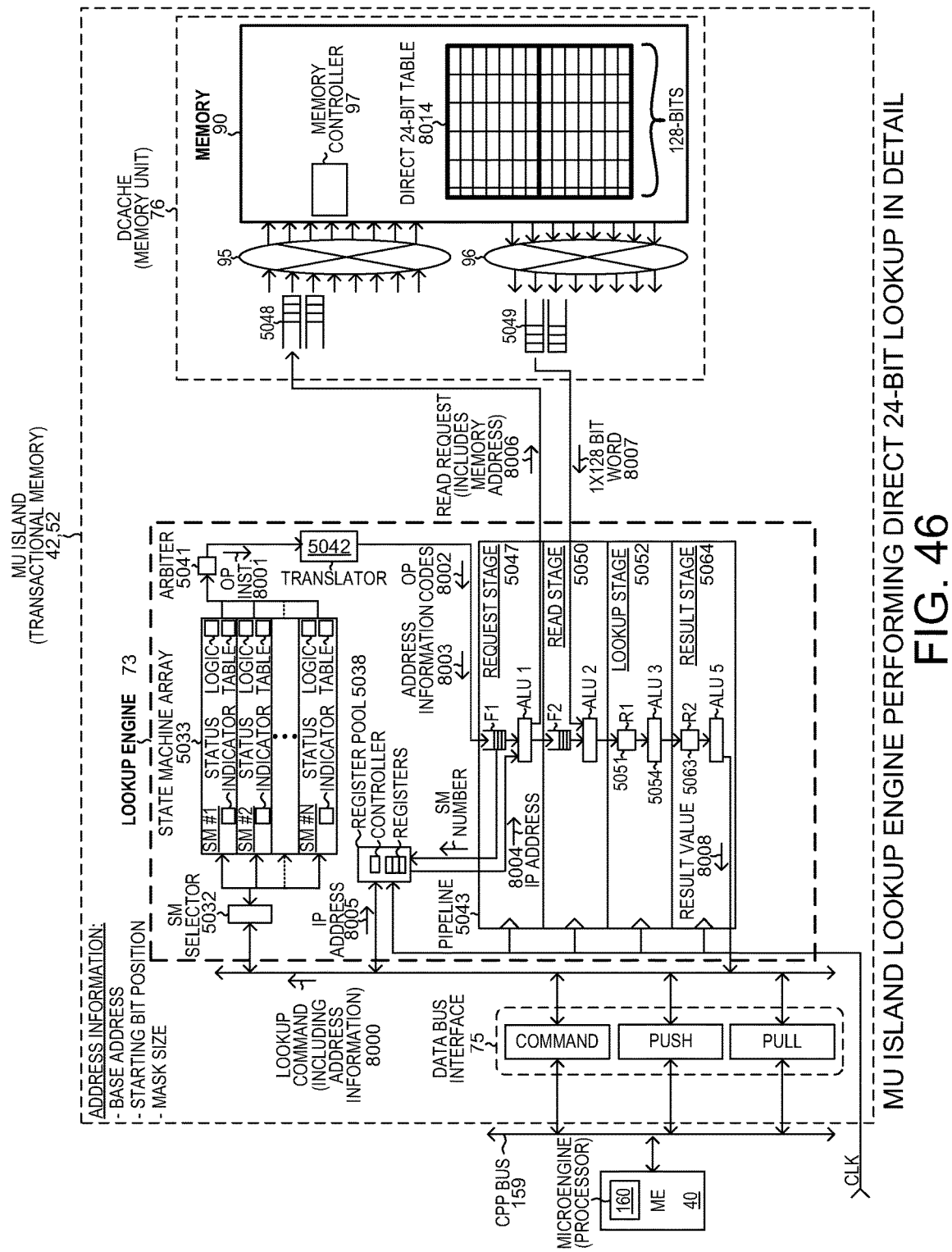
FIG. 46 is a detailed diagram of the lookup engine within an MU island performing a direct 24-bit lookup operation.

FIG. 46 illustrates the values communicated in the lookup engine 74 during a direct 24-bit lookup. In one example, upon receiving an ethernet packet microengine 160 sends a lookup command 8000 to transactional memory 42, 52 via a CPP bus 159. In this example, the purpose of the lookup command 8000 is to determine what physical port and virtual port the ethernet packet is to be routed to. The lookup command 8000 includes a base address value, a starting bit position value, and a mask size value. The combination of the base address value, starting bit position value, and mask size value is referred to as address information 8003. In another example, the mask size value is predetermined and not included in the address information 8003. The lookup command 8000 is communicated through the data bus interface 75 to state machine selector 5032. State machine selector 5032 monitors the status indicator in each state machine within state machine array 5033 and routes lookup command 8000 to idle state machine SM#1. In response to receiving lookup command 8000, the selected state machine SM#1 issues a pull-id command to the initiating microengine 160.

FIG. 32 is a state machine state diagram. The state machine transitions from the idle state 5035 to the pull state 5036 when a lookup command 8000 sent by microengine 160 is received by the state machine. The state machine causes a pull-id bus transaction to be sent back to the microengine 160 via data bus interface 75 and CPP bus 159. The format of the pull-id bus transaction is shown in FIG. 5. The DATA_REF field contains the pull-id identifier that the microengine 160 provided in the original lookup command 8000. The TARGET_REF field contains an identifier supplied by the state machine target. This target_ref is usable by the target to identify later received data payloads with the pull-id. The starting address value and number of addresses to follow value are also included in the pull-id bus transaction. The pull-id bus transaction is received by microengine 160 across the pull-id mesh. From the DATA_REF field of the pull-id bus transaction, the microengine 160 determines that the pull-id is associated with the original lookup command 8000 and that the microengine 160 should return to the target an input value 8005. In one example, the input value 8005 is a destination Internet Protocol (IP) address. The IP address 8005 is used by the lookup engine 74 to determine the destination (physical port and virtual port) to which the ethernet packet should be sent. Microengine 160 therefore responds by sending one or more data bus transactions across the data0 or data1 mesh to register pool 5038. Register pool 5038 includes a controller and a plurality of registers. In one example, each register of the register pool 5038 is associated with an individual state machine of the state machine array 5033. The format of the data bus transactions is set forth in FIG. 6. The microengine 160 includes the TARGET_REF identifier from the pull-id so that the receiving state machine can associate the incoming data bus transactions with the pull-id. There may be one or more such data bus transactions. The LAST bit of a data bus transaction indicates whether there are more data bus transactions to follow, or whether the data bus transaction is the last data bus transaction for the pull-id. The DATA fields of these data bus transactions include the addresses where the count values are stored.

Figure 47:
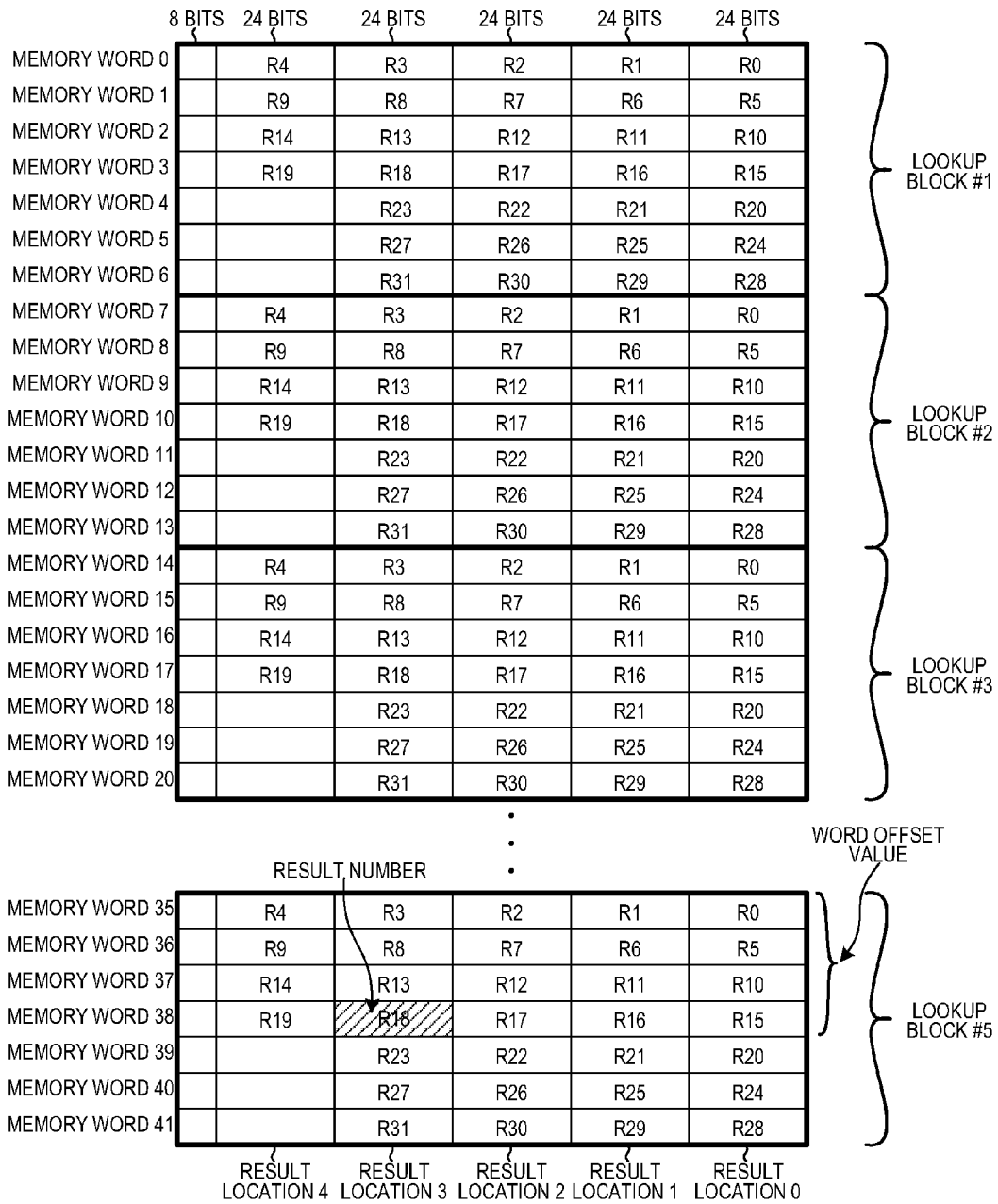
FIG. 47 is a diagram of the direct 24-bit lookup memory packing scheme.

FIG. 47 illustrates how the direct 24-bit result values are packed in memory 90. In one example, the direct 24-bit table 8014 only includes final result values. If all result values are final values each result value may only require 24-bits of information compared to the 32-bit result values of the direct 32-bit result values. This reduction in result value size allows storage of thirty-two 24-bit result values within seven 128-bit memory words (instead of the eight 128-bit memory words required to store thirty-two 32-bit result values). The reduction in result value size results in a 12.5% improvement in memory density over direct 32-bit memory packing. FIG. 47 illustrates four lookup blocks. Each lookup block includes seven 128-bit memory words. Each 128-bit memory word includes one 8-bit field and five 24-bit fields. Five different result values are stored in the five 24-bit fields. In one example, the 8-bit field is not used to store any information. In another example, five bits are used to select one of the 24-bit result values in a lookup block thus limiting the addressable content of each lookup block to thirty-two result values. In this example, the five select bits of addressing within a lookup block results in only storing result values in thirty-two of the thirty-five available 24-bit fields within a lookup block. The locations of the three empty 24-bit fields are the same for every lookup block in a given embodiment. However, the locations of the three empty 24-bit fields may vary in different embodiments. The above example is only one exemplary embodiment of the present invention. In other embodiments the direct 24-bit table may also include non-final result values and the direct 24-bit table may store result values of various bit widths.

Once all the pull data has been received and is stored in the appropriate register in register pool 5038, then the state machine operation transitions from PULL state 5036 to OUTPUT state 5039. The state machine outputs an operation instruction 8001 to arbiter 5041. Once the output operation is complete, state machine operation transitions from OUTPUT state 5039 to WAIT FOR RESULT state 5046. During the WAIT FOR RESULT state 5046, the pipeline requests and reads a 128-bit word 8007 from memory 90, selects one of five 24-bit result values included in the received 128-bit word 8007, and returns the selected result value 8008 to the state machine (SM#1). FIG. 43 illustrates an example of the different fields included in result value 8008. The result value 8008 does not include a final result field. In the present embodiment, all result values stored within the 24-bit result table in memory 90 are final result values, therefore each 24-bit lookup command results in a single memory read from memory. The result value is then communicated to the initiating state machine. The state machine operation transitions from WAIT FOR RESULT state 5046 to IDLE state 5035 and the result value 6008 is sent the ME. In one example, the result value 6008 is a next hop output port identifier. In another embodiment, the result values stored within the 24-bit result table are both non-final result values and final result values. If the final result field is not set, the final result value has not been found and the state machine operation transitions from WAIT FOR RESULT state 5046 to OUTPUT state 5039 and a subsequent lookup operation is performed based upon the contents of the selected result value. The arbiter 5041 arbitrates information flow to translator 5042. Translator 5042 receives the operation instruction and from the operation instruction outputs new OP CODES and new address information. Address information includes a base address, starting bit position, and mask size that are used in the pipeline to retrieve another result value.

Figure 48:
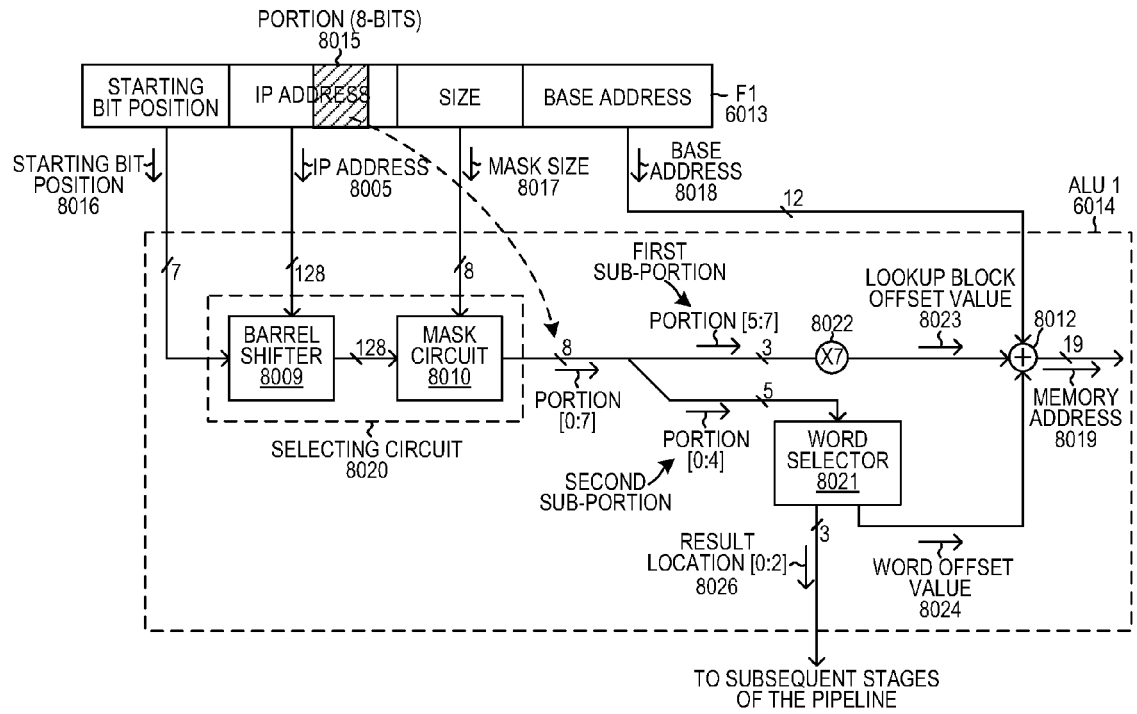
FIG. 48 is a circuit diagram of the request stage of the pipeline within the lookup engine of FIG. 46.

As shown in FIG. 46, pipeline 5043 includes request stage 5047. Request stage 5047 of the pipeline 5043 is shown in greater detail in FIG. 48. Request stage 5047 includes FIFO F1 6013 and ALU 1 6014. ALU 1 6014 includes selecting circuit 8020, word selector circuit 8021, adding circuit 8012, and multiplying circuit 8022. Selecting circuit 8020 includes barrel shifter 8009 and mask circuit 8010. The request stage of the pipeline supplies the state machine number to the register pool 5038. The register pool 5038 uses the state machine number to return to the pipeline the input value (IP address) 8005 stored in the register pool 5038 for that state machine number. The request stage uses the starting bit position and mask size to select a PORTION 8015 of the input value (IP address) 8005. In one example, the PORTION 8015 is an eight bit portion of the input value (IP address) 8005. The PORTION 8015 is selected by performing a barrel shift operation followed by a masking operation. The barrel shift operation is performed by barrel shifter 8009. Barrel shifter 8009 receives the input value (IP address) 8005 and starting bit position 8016 and generates a shifted version of input value (IP address) 8005. A detailed circuit diagram of the barrel shifter 8009 is provided in FIG. 35. Description of the barrel shifter operation is provided in the description of FIG. 35 above. Mask circuit 8010 receives the shifted version of the input value (IP address) 8005 from barrel shifter 8009 and the mask size 8017 and performs a masking operation whereby all bits received from the barrel shifter are masked out with exception to the desired PORTION bits 8015. Mask size 8017 represents how many bits are to be masked out from the 128-bit string received from barrel shifter 8009. In one example, the mask size is seven bits wide and represents 120-bits to be masked out of the 128-bit string received from barrel shifter 8009. The result of the masking operation is 8-bit PORTION [0:7]. In another example, masking circuit 8010 is an array of AND gates where mask size 8017 determines which bits received from barrel shifter 8009 are anded with "0" and which bits received from barrel shifter 8009 are anded with "1". The PORTION bits 8015 are then separated into two different bit groupings. In one example, the PORTION 8015 is an eight bit value that is separated into a first two bit group POR-TION [0:4] and a second six bit group PORTION [5:7]. In other examples, the hardware engine can select and utilize portions with more than eight bits. Multiplying circuit 8022 receives PORTION [5:7]. The output of multiplying circuit 8022 is the lookup block offset value. The lookup block offset value indicates the offset between the base address value and the first word of a specific lookup block. The output of multiplying circuit 8022 is coupled to an input of adding circuit 8012. PORTION [0:4] is received by word selector circuit 8021. Word selector circuit 8021 receives PORTION [0:4] and outputs a word offset value 8024 and result location value 8026. Word offset value 8024 indicates an offset between the first word within a lookup block and a specified word within a lookup block. In one example, the word offset value may be a value between zero and six when each lookup block contains seven memory words. The word offset value 8024 output from word selector circuit 8021 is coupled to another input of adding circuit 8012. The result location value 8026 output from word selector circuit 8021 is coupled to FIFO F2 the next stage (read stage 5050) of the pipeline 5043. A third input of adding circuit 8012 receives base address value 8018. The output of adding circuit 8012 is a memory address of the desired 128-bit word in memory 90. Memory address 8019 is included in read request 8006 (shown in FIG. 46). RESULT LOCATION [0:2] is communicated to the following stages of the pipeline and is utilized within the lookup stage 5052. Request stage 5047 then issues a read request 8006 to memory controller 97 via FIFO 5048 and crossbar switch 95. The memory controller 97 handles reading a single 128-bit word 8007 from the memory location indicated by the read request 8006.

In one example, PORTION [0:7] output by masking circuit 2010 is a binary value of 01010010. As show in FIG. 48, the five least significant bits PORTION [0:4] (10010) are coupled to word selector circuit 8021. The three most significant bits PORTION [5:7] (101) are coupled to multiplying circuit 8022. In one example, multiplying circuit 8022 multiplies all inputs by a factor of seven and outputs the resulting value. The multiplier applied in multiplying circuit 8022 is the number of words contained within a lookup block. Multiplying circuit 8022 multiplies 101 (5 in decimal) and generates an output value 100011 (35 in decimal). The output of multiplying circuit 8022 represents an address offset of the first memory word of the lookup block containing the desired result field. Simultaneously, word selector circuit 8021 determines that the binary value 10010 (18 in decimal) represents 24-bit result number R18 and that result number R18 is located in the third memory word position ("memory word 38") within the lookup block (shown in FIG. 48). Word selector circuit 8021 then outputs a 3-bit word offset value 8024 representing the third memory word position. In one example, the 3-bit word offset value 8024 representing the third memory word position is 011 (3 in decimal). Word selector circuit 8021 also outputs a 3-bit result location value 8026 indicating the result location (column shown in FIG. 47) in which the result number (R18) resides. It is noted that in other examples additional result location values may be utilized to store more result values in a single word, and that additional result locations may require more than 3-bits to address the additional result locations. Word selector circuit 8021 may be implemented in various ways. In one example, word selector circuit 8021 may implemented using a lookup table to generate a word offset value 8024 and a result location value 8026. In another example, word selector circuit 8021 may be implemented using arithmetic logic that calculates the word offset value 8024 and the result location value 8026. The word offset value 8024 output from word selector circuit 8021 represents an address offset from the address of the first memory word in the lookup block containing the desired result field. Adding circuit 8012 sums the lookup block offset value 8024 output from multiplying circuit 8022, the word offset value 8024 output from word selector circuit 8021, and the base address 8018. Base address 8018 represents the memory address of the first word within the 24-bit lookup table. In one example, the base address 8018 is zero. The output of adding circuit 8012 is the sum of 0, 011 and 100011 which is 100110 (0+3+35=38 in decimal). Adding circuit 8012 outputs the memory address 8019 of the word ("memory word 38") in memory containing the desired result field (R18 of lookup block #5 as highlighted in FIG. 47).

As shown in FIG. 46, read stage 5050 of pipeline 5043 includes FIFO F2 and ALU 2. In response to the read request 8006 send by request stage 5047, read stage 5050 of the pipeline 5043 receives 128-bit word 8007 from memory 90 via crossbar switch 96 and FIFO 5049. In one example, the 128-bit word 8007 includes five 24-bit result values ("memory word #38" as shown in FIG. 47). Read stage 5050 also receives RESULT VALUE [0:2] 8026 from the request stage 5047. Read stage 5050 then writes both the 128-bit word 8007 and RESULT LOCATION [0:2] to register R1 5051 within lookup stage 5052.

Figure 49:
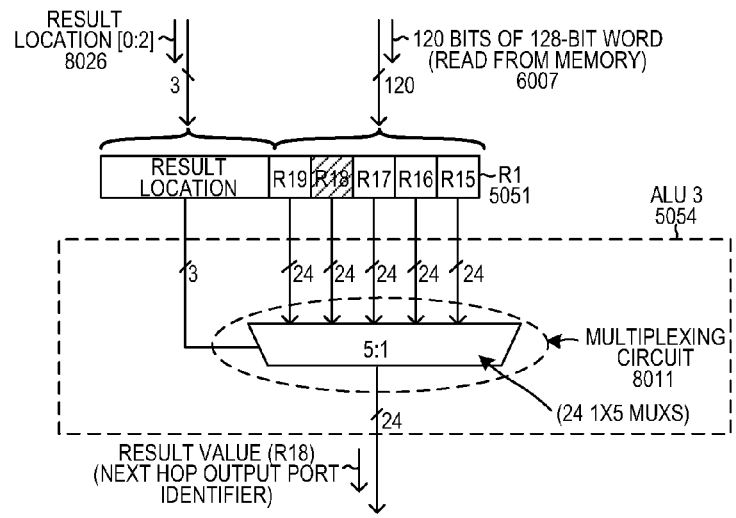
FIG. 49 is a circuit diagram of the lookup stage of the pipeline within the lookup engine of FIG. 46.

As shown in FIG. 46, pipeline 5043 includes register lookup stage 5052. Lookup stage 5052 of the pipeline is shown in greater detail in FIG. 49. Lookup stage 5052 includes register R1 5051 and ALU 3 5054. ALU 3 5054 includes a multiplexing circuit 8011. In one example, multiplexing circuit 8011 includes twenty-four one by five multiplexers. Multiplexing circuit 8011 receives RESULT LOCATION [0:2] 8026 and the five 24-bit result values from the 128-bit word 8007 received in read stage 5050. The multiplexing circuit 8011 selects one of the five 24-bit result values based upon the value of RESULT LOCATION [0:2] 8026. The selected 24-bit result value is then written to register R2 5063 of result stage 5064. In one example, result value R18 from lookup block #5 (as shown in FIG. 47) is selected by multiplexing circuit 8011 and output to result stage 5064. Result stage 5064 causes the selected result value (R18) to be communicated to the initiating state machine.

Figure 50:
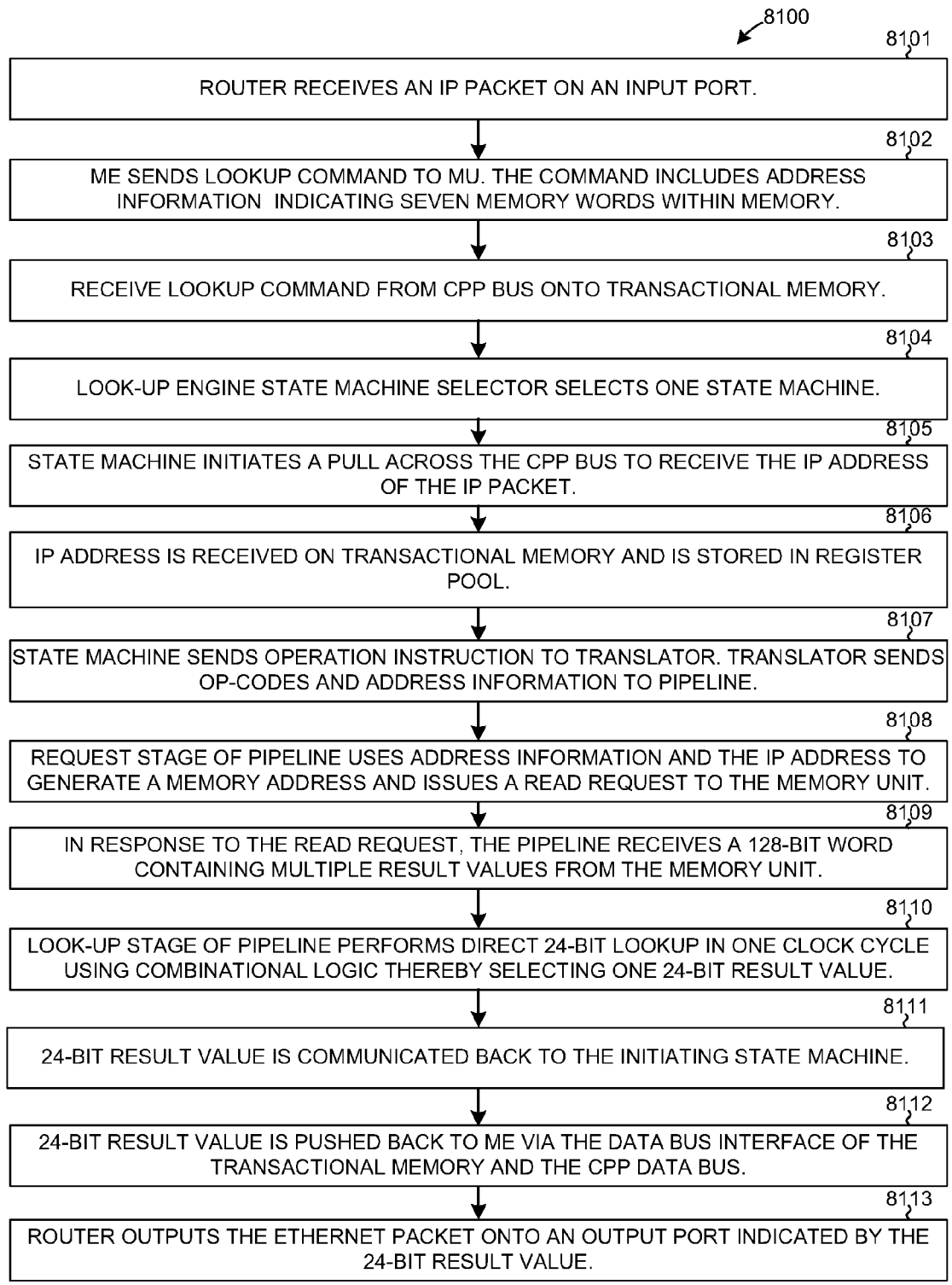
FIG. 50 is a flowchart of a method involving a novel hardware direct 24-bit lookup operation.

FIG. 50 is a flowchart 8100 illustrating the direct 24-bit lookup operation of lookup engine 74. Router receives an ethernet packet on an input port (Step 8101). The ethernet packet includes a destination IP address. The ethernet packet is communicated to a microengine within the router. The microengine sends a lookup command to the transactional memory (Step 8102). The lookup command includes a base address value, a starting bit position value, and a mask size value. The base address value, starting bit position value, and mask size value are referred to as address information. The lookup command is received onto the transactional memory via the CPP bus (Step 8103). In response to receiving the lookup command, an idle state machine is selected to receive the command by a state machine selector (Step 8104). In response to receiving the lookup command, the selected state machine initiates a pull across the CPP bus to read the input value (destination IP address) of the ethernet packet from the microengine (Step 8105). The input value (destination IP address) is then received onto the transactional memory and stored in a register pool (Step 8106). The state machine then sends an operation instruction to a translator that causes the translator to send OP-CODES and address information to the pipeline (Step 8107). The request stage uses the input value (destination IP address) and the address information to determine a memory address. The request stage of the pipeline then issues a read request (including the memory address) to the memory unit to read a single 128-bit word (Step 8108). The pipeline then receives the 128-bit word from the memory unit (Step 8109). The lookup stage of the pipeline then selects one of five 24-bit result values from 128-bit word in one clock cycle using combinational logic (Step 8110). The result of the direct 24-bit lookup is a single 24-bit result value. The 24-bit result value is communicated back to the initiating state machine (Step 8111). The 24-bit result value is pushed back from the state machine to the microengine via the data bus interface of the transactional memory and the CPP data bus (Step 8112). The router then outputs the ethernet packet onto an output port indicated by the 24-bit result value (Step 8113).

Op codes 6002 is supplied to each ALU in each state of the pipeline. Op codes 6002 includes one operation code (op code) for each stage of the pipeline. Each operation code includes a plurality of bits. The particular combination of these bits indicates one of several different operation commands. The operation performed in each stage of the pipeline can be varied by changing the op code assigned to a given pipeline stage. For example, the operation of the lookup stage of the pipeline 5043 can be changed from performing a direct 24-bit lookup to a direct 32-bit lookup. This allows flexible programming of each stage of the lookup engine 74 so that various lookup operations can be performed by the single lookup engine.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A circuit comprising:
   a storage device that stores a plurality of multi-bit node control values (NCVs) and a plurality of multi-bit result values (RVs); and
   a means for receiving a multi-bit input value (IV) and outputting one of the plurality of RVs, wherein the means is a hardware trie structure comprising:
      a plurality of internal node circuits, wherein each of the internal node circuits receives a corresponding respective one of the plurality of NCVs, wherein each of the internal node circuits further receives at least some of the bits of the IV.

2. The circuit of claim 1, wherein the trie structure includes no sequential logic element.

3. The circuit of claim 2, wherein the means can alternatively be a processor.

4. The circuit of claim 1, wherein the hardware trie structure comprises:
   a set of input leads, wherein the hardware trie structure receives the IV in parallel via the set of input leads;
   a plurality of leaf node circuits, wherein each of the leaf node circuits receives a corresponding respective one of the RVs; and
   a set of output leads, wherein the hardware trie structure outputs said one of the plurality of RVs in parallel onto the set of output leads.

5. The circuit of claim 1, wherein the storage device is taken from the group consisting of: a memory, a plurality of memories, a register, a plurality of registers.

6. The circuit of claim 1, wherein each of the internal node circuits receives its corresponding respective one of the plurality of NCVs onto a plurality of select input leads of a multiplexing circuit of said each internal node circuit.

7. The circuit of claim 1, wherein none of the plurality of internal node circuits and none of the plurality of leaf node circuits includes any sequential logic element.

8. The circuit of claim 7, wherein the plurality of leaf node circuits comprises:
   a first leaf node circuit coupled to receive a first signal output by the third child internal node circuit;
   a second leaf node circuit coupled to receive a second signal output by the third child internal node circuit;
   a third leaf node circuit coupled to receive a first signal output by the fourth child internal node circuit;
   a fourth leaf node circuit coupled to receive a second signal output by the fourth child internal node circuit;
   a fifth leaf node circuit coupled to receive a first signal output by the fifth child internal node circuit;
   a sixth leaf node circuit coupled to receive a second signal output by the fifth child internal node circuit;
   a seventh leaf node circuit coupled to receive a first signal output by the sixth child internal node circuit;
   an eighth leaf node circuit coupled to receive a second signal output by the sixth child internal node circuit.

9. The circuit of claim 8, the circuit further comprising:
   a bus interface circuit that receives a lookup command onto the transactional memory from a bus, wherein the lookup command includes address information, and wherein the lookup engine uses the address information to read the NCVs and RVs from the memory.

10. The circuit of claim 9, wherein the lookup command is received onto the transactional memory in a first bus transaction, and wherein the bus interface receives the IV from the bus in a second bus transaction.

11. The circuit of claim 9, wherein the lookup engine reads the NCVs and RVs from the memory and supplies the NCVs and RVs to the hardware trie structure.

12. The circuit of claim 8, wherein the storage device also stores a lookup type value, the circuit further comprising:
   a bus interface circuit that receives a lookup command onto the transactional memory from a bus, wherein the lookup command includes address information, and wherein the lookup engine uses the address information to read the NCVs, the RVs and the lookup type value from the memory, wherein the lookup type value determines a type of lookup performed by the hardware trie structure.

13. The circuit of claim 8, wherein the memory stores two consecutive words, wherein multiple ones of the NCVs are parts of a first of the two consecutive words, and wherein multiple ones of the RVs are parts of a second of the two consecutive words.

14. The circuit of claim 8, wherein the IV is a part of an IP (Internet Protocol) address, wherein the RVs are output port identifier values.

15. The circuit of claim 8, wherein the IV is a part of an IP (Internet Protocol) address, wherein some of the RVs are output port identifier values, and wherein at least one other of the RVs is another value that does not identify an output port.

16. The circuit of claim 8, wherein each of the RVs includes a final result bit (FRB), wherein the lookup engine uses the FRB of said one of the plurality of RVs that is output to determine whether the lookup engine will initiate another lookup operation using the hardware trie structure.

17. The circuit of claim 1, wherein the plurality of internal node circuits comprises:
a root internal node circuit;
a first child internal node circuit coupled to receive a signal output by the root internal node circuit;
a second child internal node circuit coupled to receive the signal output by the root internal node circuit;
a third child internal node circuit coupled to receive a signal output by the second internal node circuit;
a fourth child internal node circuit coupled to receive the signal output by the second internal node circuit;
a fifth child internal node circuit coupled to receive a signal output by the third internal node circuit;
a sixth child internal node circuit coupled to receive the signal output by the third internal node circuit.

18. The circuit of claim 1, wherein the circuit is a transactional memory, wherein the transactional memory comprises a lookup engine, and wherein the hardware trie structure is a part of the lookup engine.

19. The circuit of claim 1, wherein each of the RVs includes a final result bit (FRB), wherein the FRB indicates whether the RV is a final result value or is another type of value.

20. A circuit comprising:
a memory that stores a plurality of multi-bit node control values (NCVs) and a plurality of multi-bit result values (RVs); and
a means for receiving a multi-bit input value (IV) and outputting one of the plurality of RVs, wherein the means is a hardware trie structure comprising:
a plurality of internal node circuits, wherein each of the internal node circuits receives from the memory a corresponding respective one of the plurality of NCVs, wherein each of the internal node circuits also receives at least some of the bits of the IV.

21. The memory of claim 20, wherein the circuit is a transactional memory
a set of input leads, wherein the hardware trie structure receives the IV in parallel on the set of input leads;
a plurality of internal node circuits, wherein each of the internal node circuits receives from the storage device a corresponding respective one of the plurality of NCVs, wherein each of the internal node circuits also receives at least some of the bits of the IV;
a plurality of leaf node circuits, wherein each of the leaf node circuits receives from the storage device a corresponding respective one of the RVs; and
a set of output leads, wherein the hardware trie structure outputs said one of the plurality of RVs in parallel onto the set of output leads.

* * * * *